United States Patent
Lockard et al.

(10) Patent No.: US 11,828,775 B1
(45) Date of Patent: Nov. 28, 2023

(54) VERTICAL PROBE ARRAYS AND IMPROVED METHODS FOR MAKING USING TEMPORARY OR PERMANENT ALIGNMENT STRUCTURES FOR SETTING OR MAINTAINING PROBE-TO-PROBE RELATIONSHIPS

(71) Applicant: Microfabrica Inc., Van Nuys, CA (US)

(72) Inventors: Michael S. Lockard, Lake Elizabeth, CA (US); Uri Frodis, Los Angeles, CA (US); Dennis R. Smalley, Newhall, CA (US)

(73) Assignee: MICROFABRICA INC., Van Nuys, CA (US)

( * ) Notice: Subject to any disclaimer, the term of this patent is extended or adjusted under 35 U.S.C. 154(b) by 0 days.

(21) Appl. No.: 17/320,173

(22) Filed: May 13, 2021

Related U.S. Application Data

(60) Provisional application No. 63/024,456, filed on May 13, 2020.

(51) Int. Cl.
   *G01R 1/073* (2006.01)
   *G01R 1/067* (2006.01)
   *G01R 3/00* (2006.01)

(52) U.S. Cl.
   CPC ..... *G01R 1/07378* (2013.01); *G01R 1/06761* (2013.01); *G01R 3/00* (2013.01)

(58) Field of Classification Search
   CPC .................. G01R 1/07378; G01R 1/06761
   See application file for complete search history.

(56) References Cited

U.S. PATENT DOCUMENTS

| | | |
|---|---|---|
| 5,225,777 A | 7/1993 | Bross et al. |
| 5,989,994 A | 11/1999 | Khoury et al. |
| 6,046,597 A | 4/2000 | Barabi |
| 6,255,727 B1 | 7/2001 | Khoury |
| 6,297,164 B1 | 10/2001 | Khoury et al. |
| 6,344,752 B1 | 2/2002 | Hagihara et al. |
| 6,354,859 B1 | 3/2002 | Barabi et al. |

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.

(Continued)

*Primary Examiner* — Paresh Patel
(74) *Attorney, Agent, or Firm* — Perkins Coie LLP

(57) ABSTRACT

Probe arrays include spacers attached to the probes that were formed along with the probes. Methods of making probe arrays by (1) forming probes on their sides and possibly as linear arrays or combination subarrays (e.g. as a number of side-to-side joined linear arrays) having probes fixed in array positions by a sacrificial material that is temporarily retained after formation of the probes; (2) assembling the probe units into full array configurations using the spacers attached to the probes or using alternative alignment structures to set the spacing and/or alignment of the probe(s) of one unit with another unit; and (3) fixing the probes in their configurations (e.g. bonding to a substrate and/or engaging the probes with one or more guide plates) wherein the spacers are retained or are removed, in whole or in part, prior to putting the array to use.

14 Claims, 38 Drawing Sheets

(56) References Cited

U.S. PATENT DOCUMENTS

| | | | |
|---|---|---|---|
| 6,420,884 B1 | 7/2002 | Khoury et al. | |
| 6,436,802 B1 | 8/2002 | Khoury | |
| 6,466,043 B2 | 10/2002 | Khoury et al. | |
| 6,471,538 B2 | 10/2002 | Zhou et al. | |
| 6,472,890 B2 | 10/2002 | Khoury et al. | |
| 6,504,223 B1 | 1/2003 | Zhou et al. | |
| 6,535,003 B2 | 3/2003 | Aldaz et al. | |
| 6,540,524 B1 | 4/2003 | Khoury et al. | |
| 6,579,804 B1 | 6/2003 | Zhou et al. | |
| 6,586,955 B2 | 7/2003 | Fjelstad et al. | |
| 6,608,385 B2 | 8/2003 | Zhou et al. | |
| 6,641,430 B2 | 11/2003 | Zhou et al. | |
| 6,667,628 B2 | 12/2003 | Ahrikencheikh et al. | |
| 6,676,438 B2 | 1/2004 | Zhou et al. | |
| 6,722,032 B2 | 4/2004 | Beaman et al. | |
| 6,729,019 B2 | 5/2004 | Grube et al. | |
| 6,838,894 B2 | 1/2005 | MacIntyre | |
| 6,856,156 B2 | 2/2005 | Liang et al. | |
| 6,859,054 B1 | 2/2005 | Zhou et al. | |
| 6,864,105 B2 | 3/2005 | Grube et al. | |
| 6,911,835 B2 | 6/2005 | Chraft et al. | |
| 6,920,689 B2 | 7/2005 | Khandros et al. | |
| 6,965,244 B2 | 11/2005 | Miller | |
| 6,965,245 B2 | 11/2005 | Kister et al. | |
| 6,967,493 B2 | 11/2005 | Mori et al. | |
| 7,024,763 B2 | 4/2006 | Mathieu et al. | |
| 7,106,080 B2 | 9/2006 | Mori et al. | |
| 7,122,760 B2 | 10/2006 | Mathieu et al. | |
| 7,378,734 B2 | 5/2008 | Yabuki et al. | |
| 7,425,839 B2 | 9/2008 | Stutzman et al. | |
| 7,637,006 B2 | 12/2009 | Tunaboylu et al. | |
| 7,640,651 B2 | 1/2010 | Cohen et al. | |
| 7,786,740 B2 | 8/2010 | Kister | |
| 7,825,675 B2 | 11/2010 | Breinlinger | |
| 8,202,684 B2 | 6/2012 | Hamada et al. | |
| 8,907,689 B2 | 12/2014 | Kister et al. | |
| 10,119,994 B2 | 11/2018 | Choi et al. | |
| 2002/0048973 A1 | 4/2002 | Zhou et al. | |
| 2003/0176066 A1 | 9/2003 | Zhou et al. | |
| 2005/0108875 A1 | 5/2005 | Mathieu et al. | |
| 2005/0142739 A1 | 6/2005 | Kumar et al. | |
| 2006/0108678 A1 | 5/2006 | Kumar et al. | |
| 2007/0057685 A1 | 3/2007 | Garabedian et al. | |
| 2007/0075717 A1 | 4/2007 | Kinghorn et al. | |
| 2007/0152685 A1 | 7/2007 | Eldridge et al. | |
| 2008/0105355 A1 | 5/2008 | Kumar et al. | |
| 2010/0176834 A1* | 7/2010 | Chen | C25D 5/02 324/755.07 |
| 2011/0221465 A1 | 9/2011 | Lee | |
| 2019/0072586 A1* | 3/2019 | Su | G01R 1/07342 |
| 2020/0300893 A1* | 9/2020 | Lee | G01R 1/07342 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Hill, Dr. Steve, "An E-FAB Way for Making the Micro World", Materials World is the journal of The Institute of Materials, Sep. 1999, vol. 7, No. 9, pp. 538-539.

Madden, John D. et al., "Three-Dimensional Microfabrication by Localized, Electrochemical Deposition", J. of Micro. Sys., Mar. 1996, 5(1):24-32.

Madou, Mark J., "Fundamentals of Microfabrication—The Science of Miniaturization", 2nd ed., 2001, pp. 402-412.

Marques, et al., "Fabrication of High-Aspect-Ratio Microstructures on Planar and Nonplanar Surfaces Using a Modified LIGA Process", Dec. 1997, 6(4):329-336.

Weeden, Otto, Keithley Instruments, Inc. "Probe Card Tutorial", pp. 1-40.

* cited by examiner

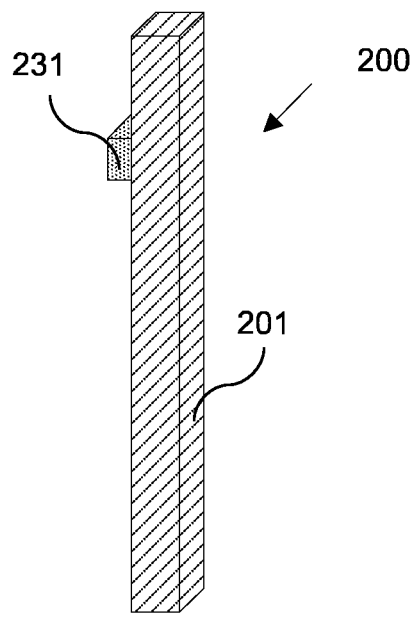
FIG. 2A
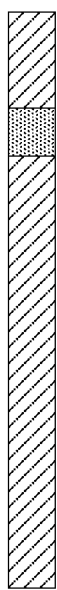   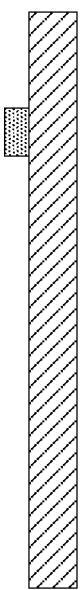 
FIG. 2B     FIG. 2C     FIG. 2D     FIG. 2E     FIG. 2F

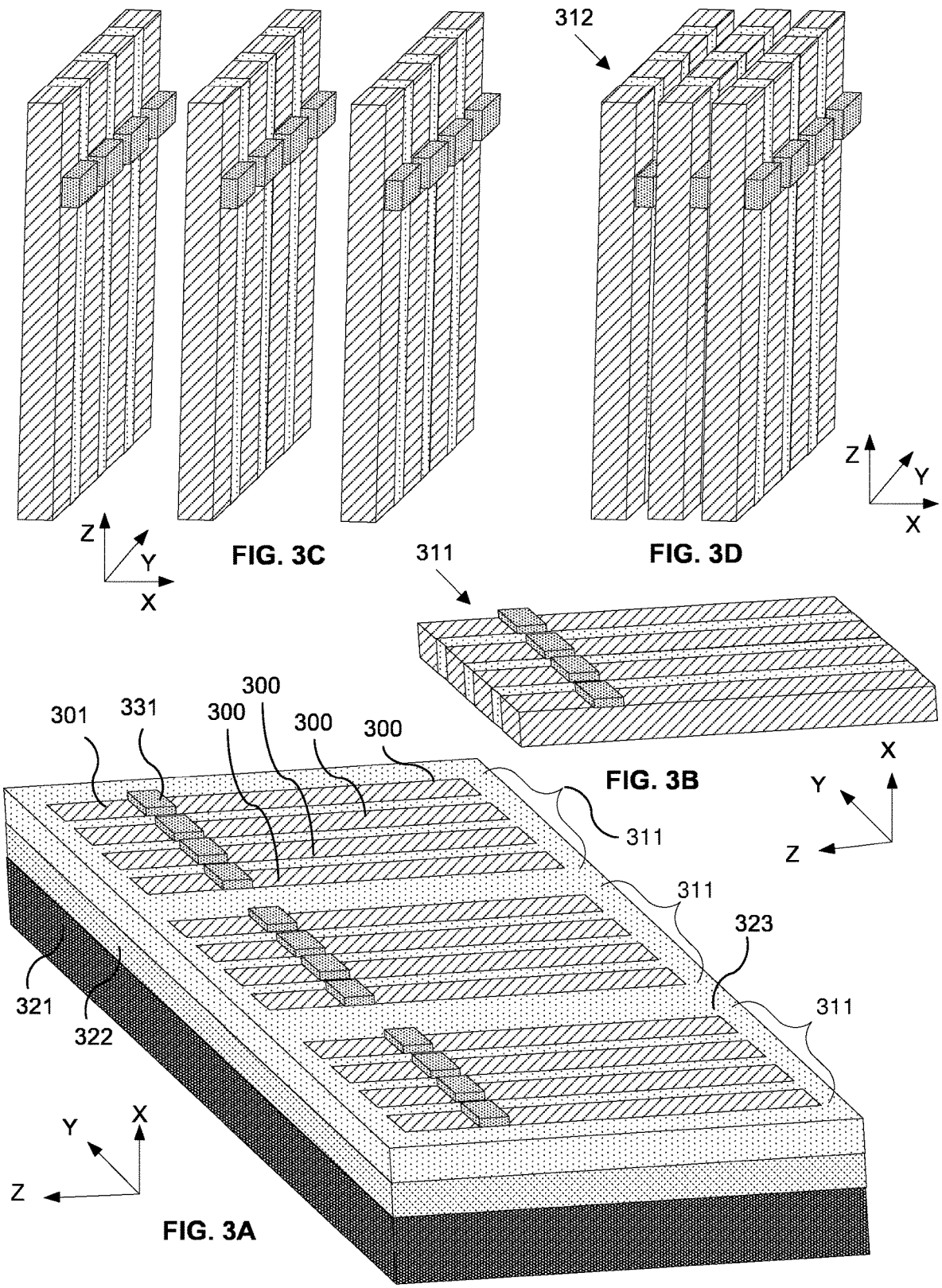

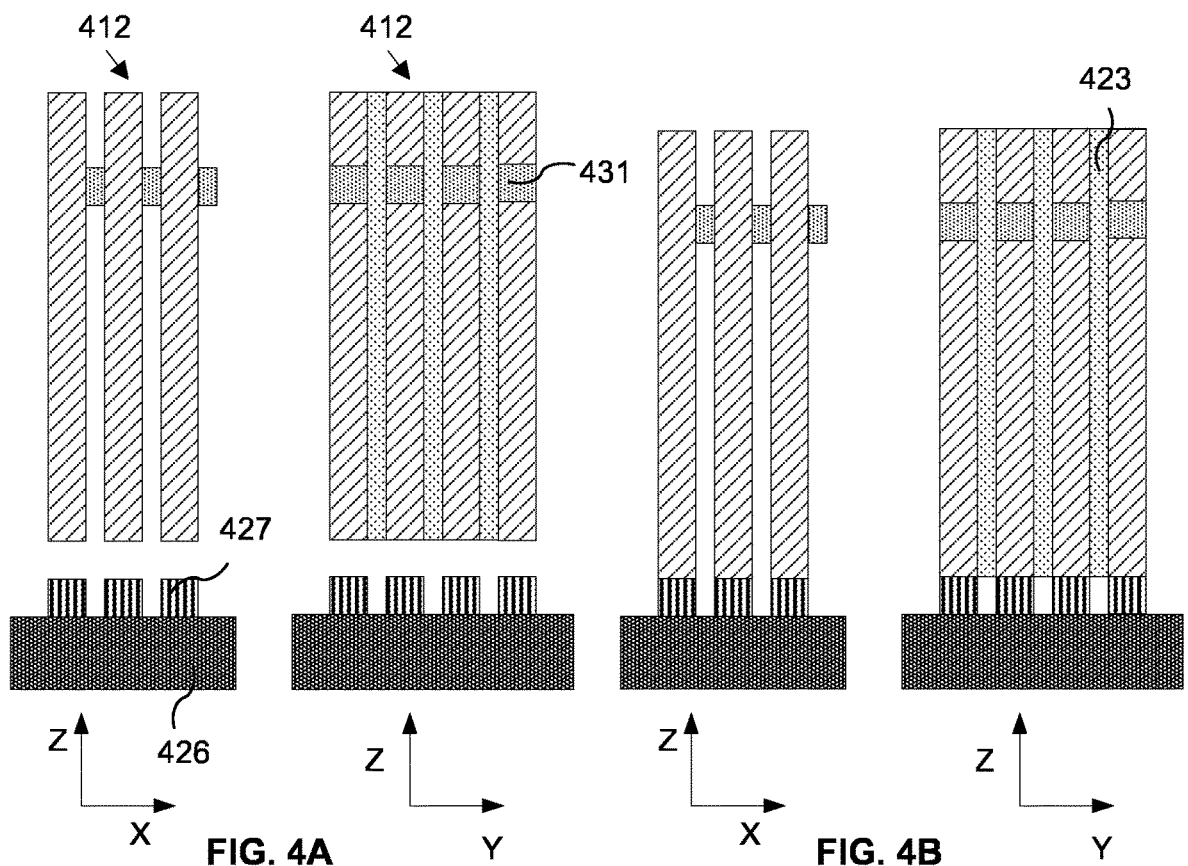
FIG. 4A  FIG. 4B
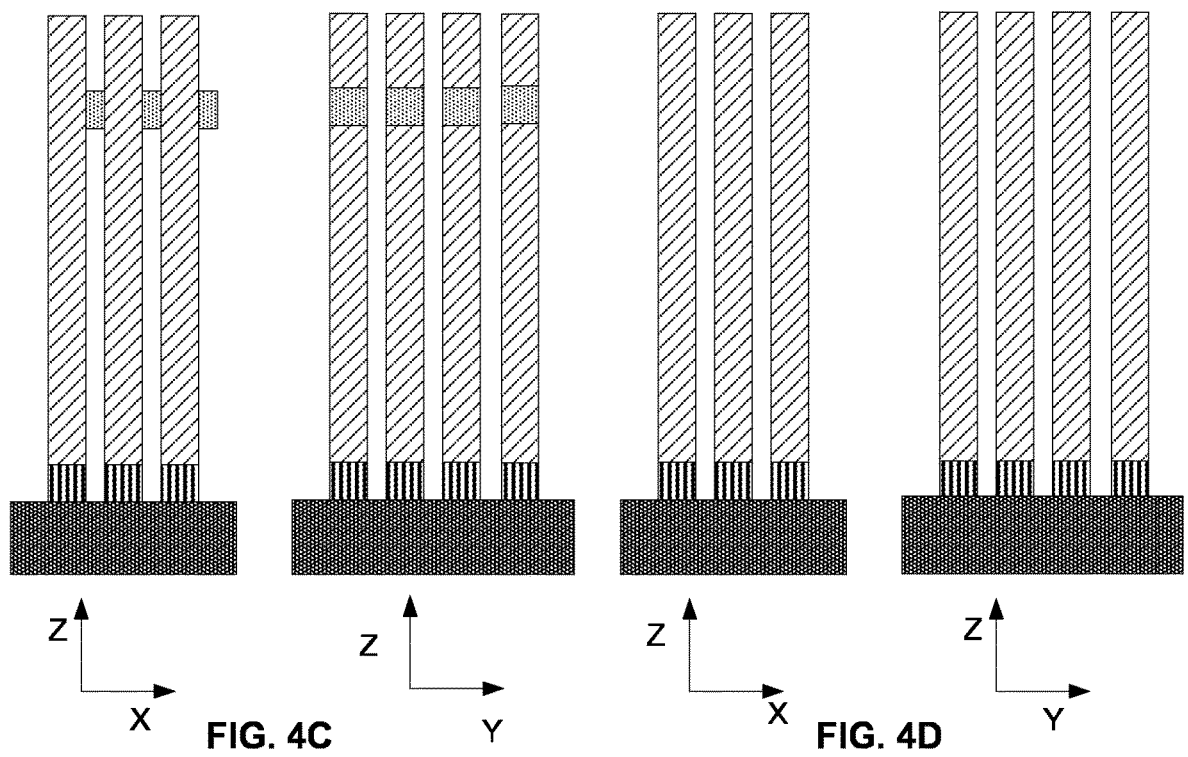
FIG. 4C  FIG. 4D

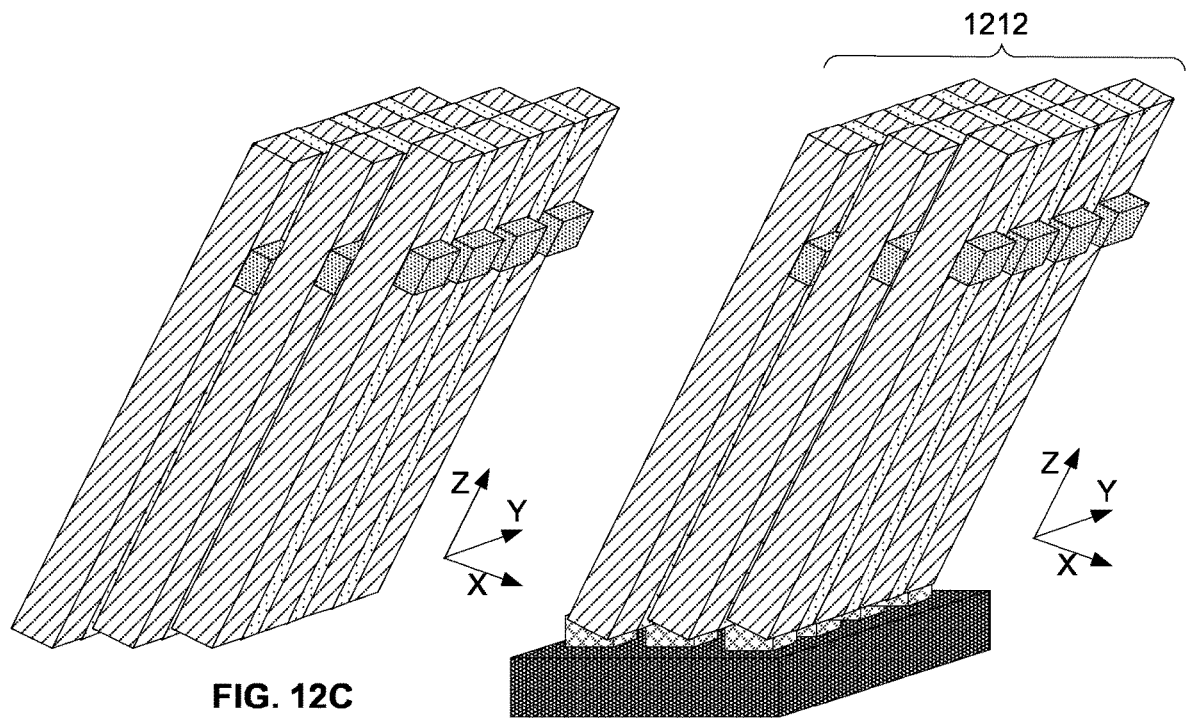
FIG. 12C
FIG. 12D
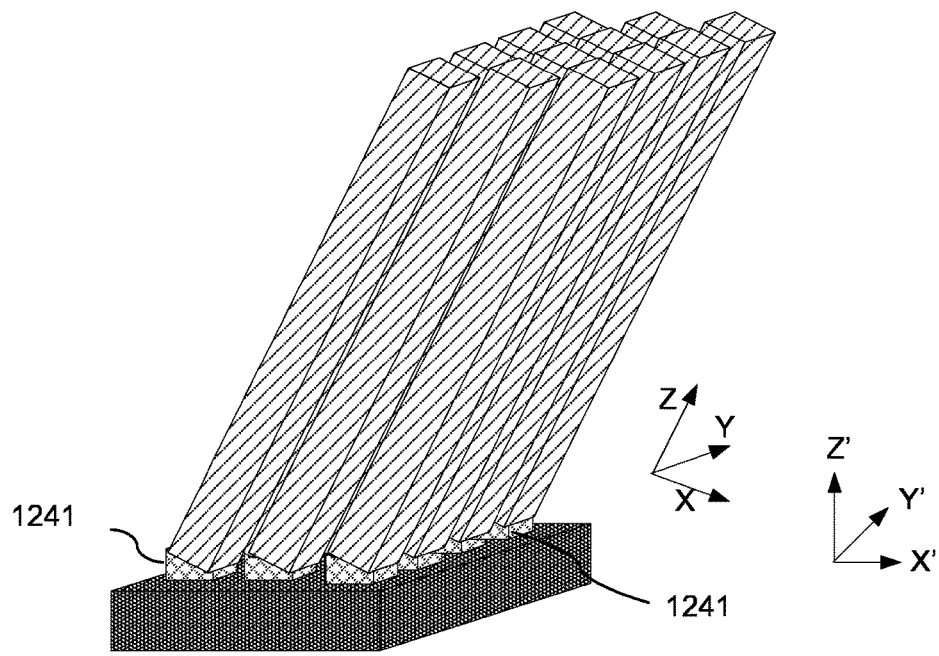
FIG. 12E

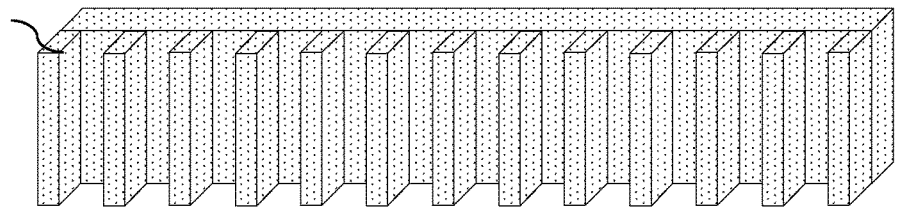
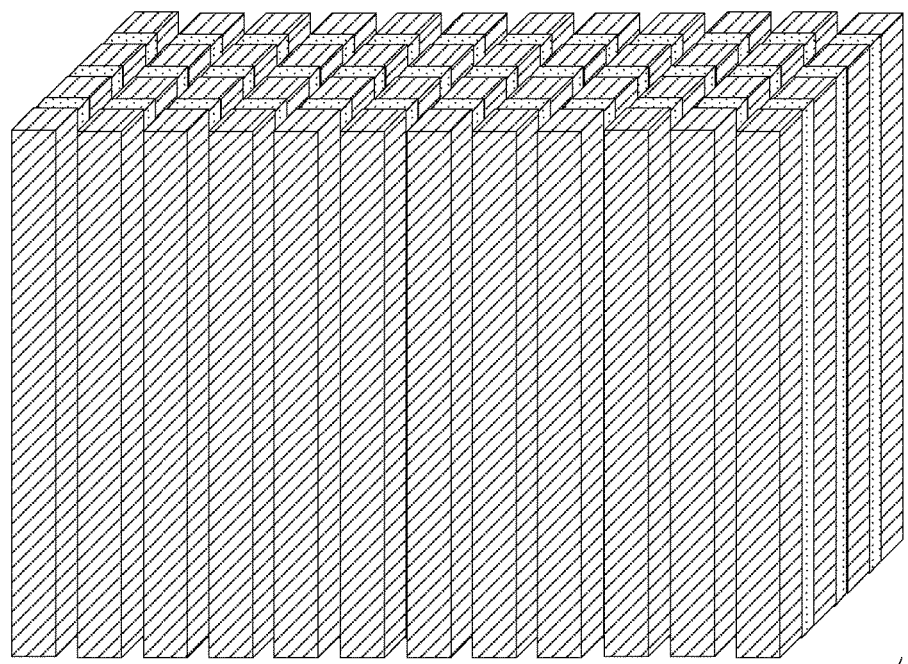
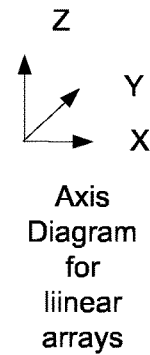
Axis Diagram for liinear arrays
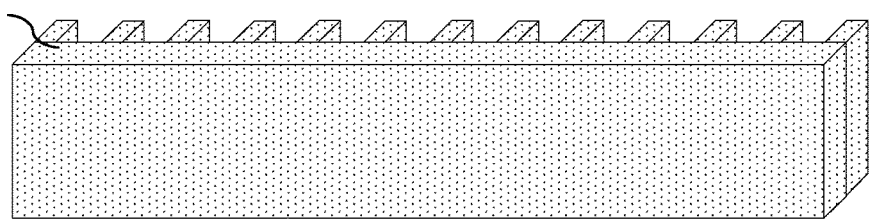
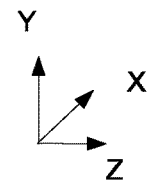
Axis diagram for the alternative alignment structures
FIG. 13A

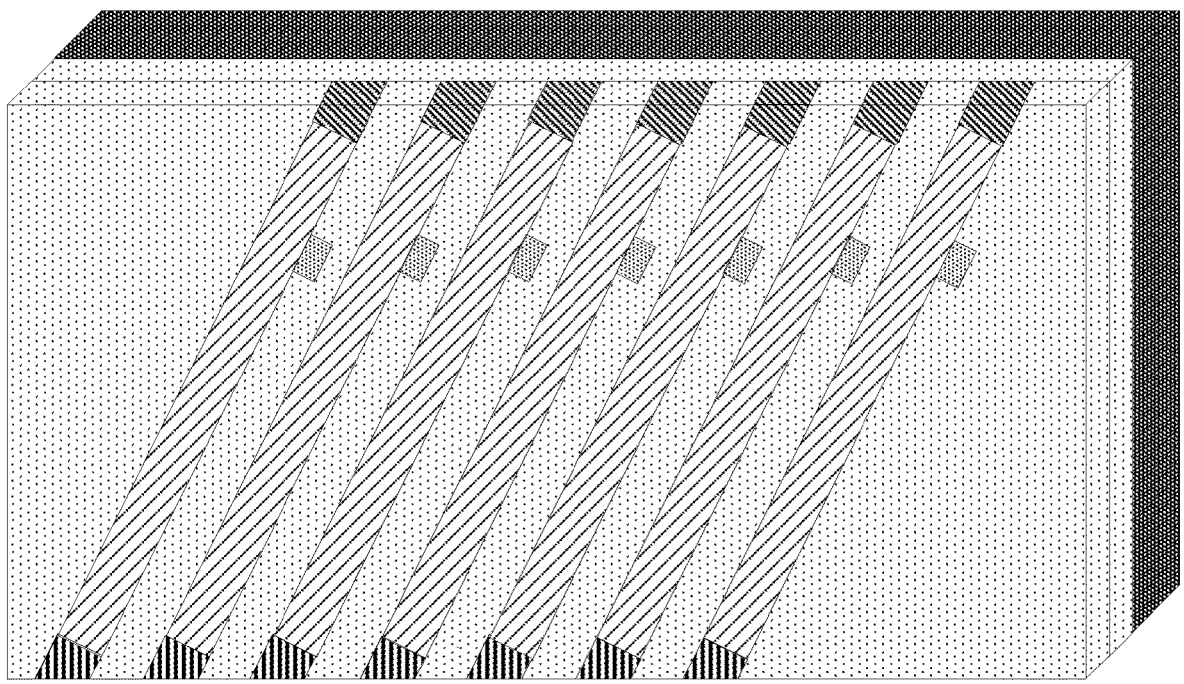
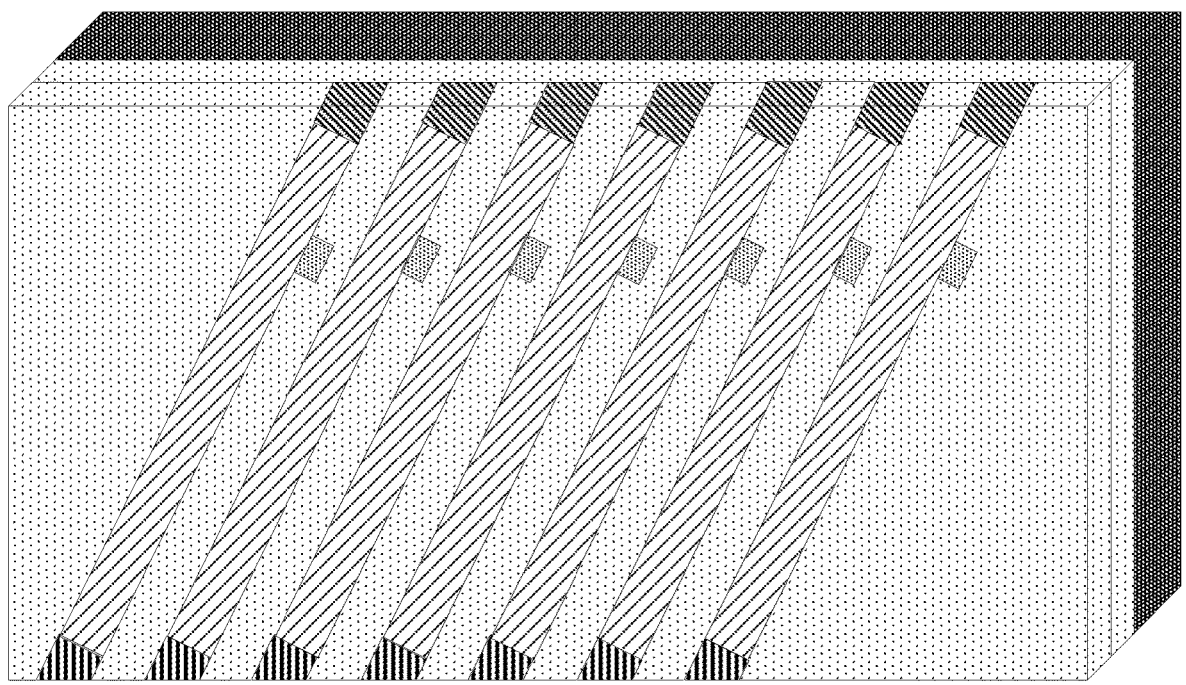
FIG. 16B

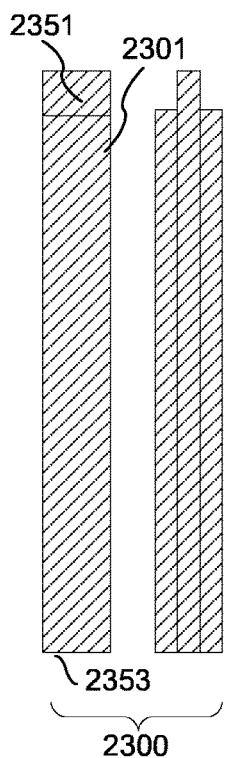
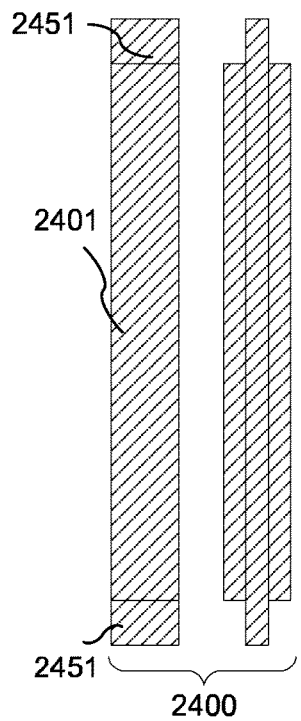
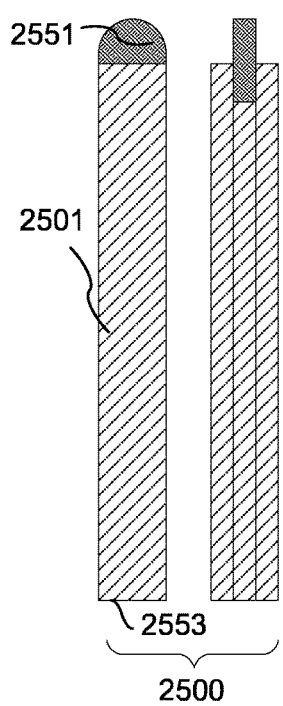
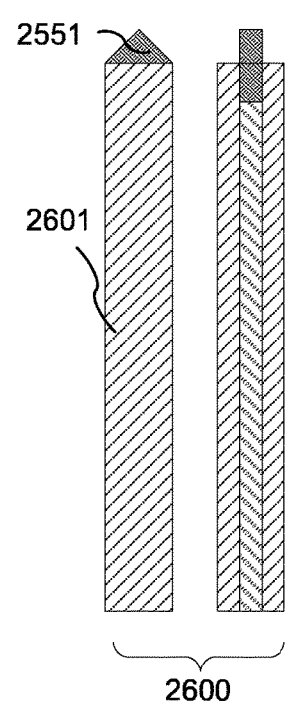
FIG. 23    FIG. 24    FIG. 25    FIG. 26
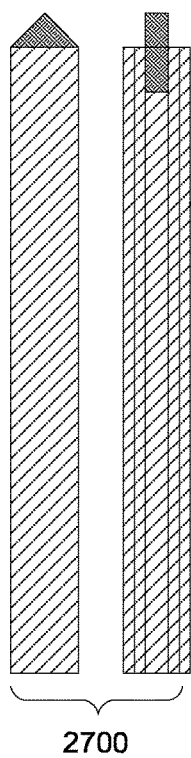
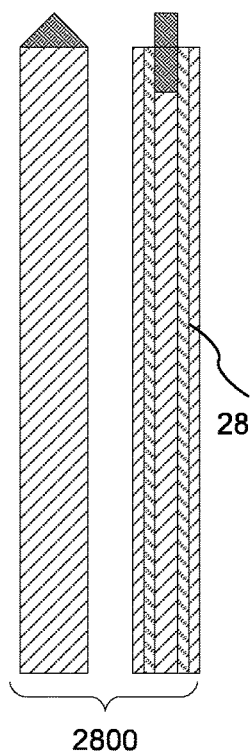
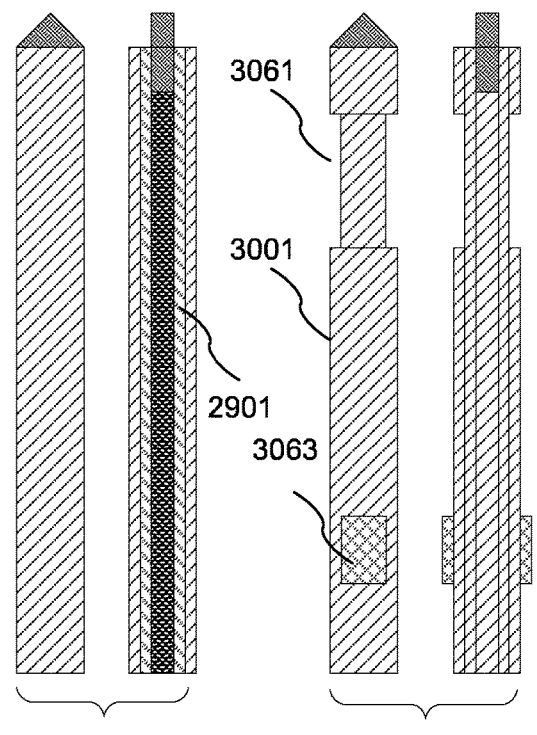
FIG. 27    FIG. 28    FIG. 29    FIG. 30

3400-A

3400-B

3400-C

3400-D

VERTICAL PROBE ARRAYS AND IMPROVED METHODS FOR MAKING USING TEMPORARY OR PERMANENT ALIGNMENT STRUCTURES FOR SETTING OR MAINTAINING PROBE-TO-PROBE RELATIONSHIPS

RELATED APPLICATIONS

This application claims the benefit of U.S. Provisional Patent Application No. 63/024,456 filed on May 13, 2020. This referenced application is incorporated herein by reference as if set forth in full herein.

FIELD OF THE INVENTION

The present disclosure relates generally to the field of probes for testing (e.g. wafer level testing or socket level testing) electronic devices (e.g. semiconductor devices) and more particularly to arrays of such probes, wherein the probes may be formed in batch along with permanent or temporary spacers joined to individual probes, alignment structures that are formed with but separated from probes, or separately formed probes and alignment structures, wherein spacer material is different from one or more sacrificial materials that provide joining of at least some probes to one another during batch formation, and wherein for at least some probes, probe-to-probe positioning during formation is different from probe-to-probe positioning within a final array, and wherein one or both of the following conditions are met: (1) final probe-to-probe positioning in an array is set, at least in part, by spacing provided by the spacers or alignment structures, and possibly by probe-to-probe positioning during probe formation, and/or (2) at least some spacers provide for guided movement or at least limited relative movement (e.g. deflection) of probes during usage of the array. In some embodiments, probes are formed from one or more multi-material layers, possibly in combination with non-multi-material layers, with their longitudinal axes laying within the plane of a layer, or planes of multiple layers, wherein the probes are stacked side-by-side, after formation, to form two-dimensional arrays with the tips on one end of the probes located in substantially a common plane and with probes held in array configuration by bonding to a substrate and/or by use of guide plates with through holes that are engaged with the probes.

BACKGROUND OF THE INVENTION

Probes:

Probes of various types have been fabricated and used, or have been proposed for use, in semiconductor testing. As the semiconductor industry continues to drive integrated circuit complexity up and size down (more transistors per unit area), a need exists for new and improved probe arrays, methods of making such probe arrays, probe designs for use in such arrays, and/or methods of making such probes where the arrays and probes are used either for testing purposes and associated temporary contact and/or for making permanent contact with such devices. This need drives probes to smaller sizes (e.g. smaller X and Y cross-sectional or lateral dimensions and sometimes to shorter lengths, or longitudinal dimensions, in Z), lower contact force, less scrubbing or more controlled scrubbing, while still maintaining high current carrying capacity so that shorts in failed semiconductor devices do not damage the probes. This need further drives arrays of such probes to finer pitches (i.e. smaller nominal spacing between adjacent probes and probe tips). A need exists for improved probes, probe arrays, and methods of making such probes and arrays to meet the new challenges that that the semiconductor industry is driving.

Numerous electrical contact probe and pin configurations as well as array formation methods have been commercially used or proposed, some of which may be prior art while others are not. Examples of such pins, probes, arrays, and methods of making are set forth in the following patent applications, publications of applications, and patents. Each of these applications, publications, and patents is incorporated herein by reference as if set forth in full herein.

| U.S. Pat App No., Filing Date<br>U.S. App Pub No., Pub Date<br>U.S. Pat. No., Pub Date | First Named Inventor, "Title" |
| --- | --- |
| 10/772,943 - Feb. 4, 2004<br>2005-0104609 - May 19, 2005 | Arat, et al., "Electrochemically Fabricated Microprobes" |
| 10/949,738 - Sep. 24, 2004<br>2006-0006888 - Jan. 12, 2006 | Kruglick, et al., "Electrochemically Fabricated Microprobes" |
| 11/028,945 - Jan. 3, 2005<br>2005-0223543 - Oct. 13, 2005<br>7,640,651 - Jan. 5, 2010 | Cohen, et al., "A Fabrication Process for Co-Fabricating a Multilayer Probe Array and a Space Transformer" |
| 11/028,960 - Jan 3, 2005<br>2005-0179458 - Aug. 18, 2005<br>U.S. Pat. No. 7,265,565 - Sep. 4, 2007 | Chen, et al. "Cantilever Microprobes for Contacting Electronic Components and Methods for Making Such Probes |
| 11/029,180 - Jan. 3, 2005<br>2005-0184748 - Aug. 25, 2005 | Chen, et al. "Pin-Type Probes for Contacting Electronic Circuits and Methods for Making Such Probes" |
| 11/029,217 - Jan. 3, 2005<br>2005-0221644 - Oct. 6, 2005<br>7,412,767 - Aug. 19, 2008 | Kim, et al., "Microprobe Tips and Methods for Making" |
| 11/173,241 - Jun. 30, 2005<br>2006-0108678 - May 25, 2006 | Kumar, et al., Probe Arrays and Method for Making |
| 11/178,145 - Jul. 7, 2005<br>2006-0112550 - Jun. 1, 2006<br>7,273,812 - Sep. 25, 2007 | Kim, et al., "Microprobe Tips and Methods for Making" |
| 11/325,404 - Jan. 3, 2006<br>2006-0238209 - Oct. 26, 2006 | Chen, et al., "Electrochemically Fabricated Microprobes" |

-continued

| U.S. Pat App No., Filing Date U.S. App Pub No., Pub Date U.S. Pat. No., Pub Date | First Named Inventor, "Title" |
|---|---|
| 14/986,500 - Dec. 31, 2015 2016-0231356 - Aug. 11, 2016 — | Wu, et al. "Multi-Layer, Multi-Material Micro-Scale and Millimeter-Scale Devices with Enhanced Electrical and/or Mechanical Properties" |
| 16/172,354 - Oct. 18, 2018 2019-0204354 - Jul. 4, 2019 — | Chen, et al. "Pin-Type Probes for Contacting Electronic Circuits and Methods for Making Such Probes" |
| 16/584,818 - Sep. 26, 2019 — — | Smalley, "Probes Having Improved Mechanical and/or Electrical Properties for Making Contact between Electronic Circuit Elements and Methods for Making" |
| 16/584,863 - Sep. 26, 2019 — — | Frodis, "Probes Having Improved Mechanical and/or Electrical Properties for Making Contact between Electronic Circuit Elements and Methods for Making" |
| 17/139,933 - Dec. 31, 2020 — — | Wu, "Compliant Pin Probes with Multiple Spring Segments and Compression Spring Deflection Stabilization Structures, Methods for Making, and Methods for Using" |
| 17/139,936 - Jan. 15, 2020 — | Wu, "Probes with Multiple Springs, Methods for Making, and Methods for Using" |
| 17/139,940 - Dec. 31, 2020 — | Wu, "Compliant Pin Probes with Flat Extension Springs, Methods for Making, and Methods for Using" |
| 16/791,288 - Feb. 14, 2020 — — — | Frodis, "Multi-Beam Vertical Probes with Independent Arms Formed of a High Conductivity Metal for Enhancing Current Carrying Capacity and Methods for Making Such Probes" |
| 17/139,925 - Dec. 31, 2020 — — | Veeramani, "Probes with Planar Unbiased Spring Elements for Electronic Component Contact and Methods for Making Such Probes" |

Electrochemical Fabrication:

Electrochemical fabrication techniques for forming three-dimensional structures from a plurality of adhered layers have been, and are being, commercially pursued by Microfabrica® Inc. (formerly MEMGen Corporation) of Van Nuys, California under the process names EFAB and MICA FREEFORM®.

Various electrochemical fabrication techniques were described in U.S. Pat. No. 6,027,630, issued on Feb. 22, 2000 to Adam Cohen.

A related method for forming microstructures using electrochemical fabrication techniques is taught in U.S. Pat. No. 5,190,637 to Henry Guckel, entitled "Formation of Microstructures by Multiple Level Deep X-ray Lithography with Sacrificial Metal Layers".

FIGS. 1A-1I illustrate side views of various states in an example multi-layer, multi-material electrochemical fabrication process. FIGS. 1A-1G illustrate various stages in the formation of a single layer of a multi-layer fabrication process where a second metal is deposited on a first metal as well as in openings in the first metal so that the first and second metals form part of the layer. In FIG. 1A, a side view of a substrate 182 having a surface 188 is shown, onto which patternable photoresist 184 is deposited, spread, or cast as shown in FIG. 1B. In FIG. 1C, a pattern of resist is shown that results from the curing, exposing, and developing of the resist. The patterning of the photoresist 184 results in openings or apertures 192(a)-192(c) extending from a surface 186 of the photoresist through the thickness of the photoresist to surface 188 of the substrate 182. In FIG. 1D, a metal 194 (e.g., nickel) is shown as having been electroplated into the openings 192(a)-192(c). In FIG. 1E, the photoresist has been removed (i.e., chemically stripped) from the substrate to expose regions of the substrate 182 which are not covered with the first metal 194. In FIG. 1F, a second metal 196 (e.g., silver) is shown as having been blanket electroplated over the entire exposed portions of the substrate 182 (which is conductive) and over the first metal 194 (which is also conductive). FIG. 1G depicts the completed first layer of the structure which has resulted from the planarization of the first and second metals down to a height that exposes the first metal and sets a thickness for the first layer. In FIG. 1H, the result of repeating the process steps shown in FIGS. 1B-1G several times to form a multi-layer structure is shown where each layer consists of two materials. For most applications, one of these materials is removed as shown in FIG. 1I to yield a desired 3-D structure 198 (e.g., component or device).

Electrochemical fabrication provides the ability to form prototypes and commercial quantities of miniature objects, parts, structures, devices, and the like, at reasonable costs and in reasonable times. In fact, electrochemical fabrication is an enabler for the formation of many structures that were hitherto impossible to produce. Electrochemical fabrication opens the spectrum for new designs and products in many industrial fields. Even though electrochemical fabrication offers this new capability, and it is understood that electrochemical fabrication techniques can be combined with designs and structures known within various fields to produce new structures, certain uses for electrochemical fabrication provide designs, structures, capabilities and/or features not known or obvious in view of the state of the art.

A need exists in various fields for miniature devices having improved characteristics, improved operational capabilities, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide improved probe arrays. Some such embodiments provide probe arrays that have at least some probes that include permanently adhered spacers or spacer portions that provide for one or more of (1) movement of one probe relative to another that is bounded at least in part by the presence of the spacer, (2) positioning of one probe relative to another where spacing or alignment is provided by (a) a spacer attached to one probe interacting with a different probe, (b) a spacer attached to one probe interacting with a spacer attached to another probe, or (c) a spacer attached to one probe interacting with an alignment structure that is not attached to a probe but positioned relative to a plurality of probes, and/or (3) providing a continuous, or condition based electrical relationship, between two or more probes, such as (a) continuous electrical contact, (b) intermittent electrical contact, or (c) electrical separation.

It is an object of some embodiments of the invention to provide improved methods for making probe arrays. Some such methods provide batch formation of probes followed by assembly of probes or groups of probes into array configurations and then retaining the probes in such array configurations by bonding, lateral engagement and/or longitudinal engagement with substrates, additional alignment structures, and/or guide plates wherein at least some probes are formed with spacers that have dimensions and/or locations that provide for contact spacing or contact alignment between adjacent probes, between spacers on adjacent probes, between adjacent groups of probes, and/or between spacers on adjacent groups of probes, between probes and retention structures. Some such methods may provide release of probes individually or in groups (e.g., by selective retention of a removable sacrificial material, such as one or more conductive sacrificial materials, one or more masking materials that may be differentially removable and that can be used in the capacity of a sacrificial material as well as in a capacity as a patterning material). Groups of probes may have one or more array spacings or alignments set by a removable material with the spacers providing spacing or alignment between individual groups. In some such methods, probes may be formed with or without spacers, probes may be released in groups for assembly, independent spacers may be formed using separate processes relative to the probes or along with, but separate from the groups of probes, or groups of probes may be aligned by contact spacing or contact alignment with the independent spacers. In some such embodiments, the spacers used in array assembly may be retained in whole, retained in part, or completely removed prior to putting an array to use. It is an object of some embodiments of the invention to form some layers as multi-material layers, with each including at least one structural material and at least one sacrificial material while other layers may be formed with a single material. Some layers formed with a single material may use a sacrificial material that spaces stacked linear probe arrays from one another so that they may be separated from one another upon initial release or such that that may be temporarily held together after an initial release as parts of combination subarrays.

It is an object of some embodiments of the invention to provide improved methods of using probe arrays.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not necessarily intended that multiple objects of the invention be addressed by any single aspect of the invention even though that may be the case with regard to some aspects.

In a first aspect of the invention, a method of forming a two-dimensional probe array, includes: (a) forming a plurality of linear probe arrays with each probe array including a plurality of probes formed on their sides, with at least some of the plurality of probes having a spacer adhered to a body of the probe, and wherein the plurality of probes of a respective linear array are connected temporarily to one another by a first sacrificial material, including: (i) forming one or more multi-material layers, with any successively formed multi-material layers adhered to a previously formed multi-material layer or a non-multi-material layer that in turn was adhered directly or indirect to a previously formed multi-material layer, and with each multi-material layer including at least two materials, at least one of which is at least one structural material and at least one other of which is at least one sacrificial material, wherein each multi-material layer defines a successive cross-section of the plurality of linear probe arrays, wherein the forming of each multi-material layer includes: a) depositing at least a first of the at least two materials; b) depositing at least a second of the at least two materials; c) planarizing at least two of the at least two deposited materials, including planarizing at least one structural material and at least one sacrificial material; and (ii) after the forming the one or more multi-material layers which are required to build up each linear probe array, removing at least one second sacrificial material from regions that connect the plurality of linear probe arrays to each other while leaving at least a portion of the first sacrificial material in place that connects the probes within each linear array to one another to reveal the individual linear arrays; (b) stacking multiple linear probe arrays side-to-side using the spacers, to at least partially set spacing of the probes, or alignment of the probes, of different linear arrays with respect to one another to achieve a two-dimensional array configuration; (c) providing at least one array retention structure and engaging the stacked multiple linear probe arrays with the at least one retention structure to engage the probes of the two-dimensional array, and thereafter, removing the first sacrificial material from the engaged probes to release the probes from their respective linear arrays.

Numerous variations of the first aspect of the invention are possible and include, for example: (A) the at least one retention structure including at least two retention structures; (B) the at least one retention structure including a structure selected from the group consisting of (1) at least one substrate to which the one end of the probes of the two-dimensional probe configuration are bonded; (2) at least one guide plate with which at least one end of the probes of the two-dimensional probe array engage; (3) at least two guide plates with which the probes to the two-dimensional probe array engage; and (4) at least three guide plates with which the probes of the two-dimensional probe array engage; (C) the first and second sacrificial materials being different from one another; (D) variation (C) wherein the second sacrificial material as compared to the first sacrificial material has a physical or chemical property that allows the second sacrificial material to be separated from the first sacrificial material without causing excessive damage to the first sacrificial material (i.e. damage to such an extent that probes being held to one another by the first sacrificial material would be released from one another); (E) the first and second sacrificial materials being the same material; (F) variation (E) wherein separation of the second sacrificial material from the first sacrificial material is performed by providing differential access of a removal agent to the second sacrificial material in preference to the first material; (G) variation (F) wherein the differential access includes a masking material that provides at least some protection of the first sacrificial material and wherein the removal agent is a chemical etchant; (H) the at least one multi-material layer includes a number and configurations of layers selected from the group consisting of: (1) a single multi-material layer including both probes and attached spacers; (2) at least two multi-material layers with at least one multi-material layer including cross-sections of probes and at least one different multi-material layer including attached spacers; (3) at least two multi-material layers with at least one multi-material layer including cross-sections of attached spacers and at least one different multi-material layer including cross-sections of probes; (4) at least two multi-material layers with at least one multi-material layer including cross-sections of attached spacers and at least two multi-material layers including cross-sections of probes; (5) at least three-multi-material layers with at least two including cross-sections of probes and at least one different layer including attached spacers; (6) at least three multi-material layers with at least one including cross-sections of probes and at least two different layers including cross-sections of attached spacers; (7) at least three multi-material layers with at least three layers including cross-sections of probes and at least three layers including cross-sections of attached spacers; (8) a plurality of successively formed and adhered layers with at least one probe layer including cross-sections of probes and at least one spacer layer including cross-sections of spacers wherein the at least one probe layer and the at least one spacer layer include at least one common layer; (9) a plurality of successively formed and adhered layers with at least one probe layer including cross-sections of probes and at least one spacer layer including cross-sections of spacers wherein the at least one probe layer and the at least one spacer layer are different layers; and (10) a plurality of layers with at least a portion being multi-material layers and a portion being non-multi-material layers; (I) at least a portion of some spacers and at least a portion of their respective probes being formed on the same layer; (J) at least a portion of some spacers being formed on layers that do not include any portion of their respective probes; (K) at least some spacers mating with neighboring probes, or spacers attached to those neighboring probes in a line connecting the probes so as to set a distance between the respective probes during array assembly; (L) at least some spacers mating with neighboring probes, or spacers attached to the neighboring probes along a line substantially perpendicular to a line joining the probes so as to provide an alignment of the respective probes selected from the group consisting of (1) a lateral alignment and (2) a longitudinal alignment; (M) at least some spacers being joined to a side of a probe including at least one edge of a layer wherein at least one of the following conditions is met: (1) the spacers meet edges of adjacent linear arrays with widths that are one layer thickness in width; (2) the spacers are proud of the neighboring portions of the temporarily joined linear array to which they are held; (3) the spacers contact edges of adjacent linear arrays along widths associated with single layers; (4) the spacers contact edges of adjacent second linear arrays via second spacers that are held to their temporarily joined second linear array where the second spacers are proud of other portions of the second linear arrays and wherein a contact portion of the second spacers are no more than one layer wide; (N) at least some spacers are adhered to a layer face of their respective probes; (O) at least some spacers are located on at least one layer face of their respective probes and along at least one layer edge of their respective probes; (P) at least some spacers are located on two different portions of a face of their respective probes; (Q) at least some spacers are located on two different portions of a single layer of their respective probes; (R) at least some spacers are located on both front and back faces of the layer or layers of their respective probes; (S) at least some of the spacers become permanent parts of the array as the array will be put to use; (T) at least some of spacers are temporary and are removed prior to putting the array to use; (U) at least some of the spacers are in part permanent and in part temporary wherein the permanent parts form part of the probe array when the probe array is put to use and the temporary parts are removed prior to putting the probe array to use; (V) at least a portion of at least some spacers are not formed on multi-material layers but instead are formed as part of one or more layers that do not include a sacrificial material; and (W) at least some spacers are used in positioning one or more retention structures.

In a second aspect of the invention a method of forming a two-dimensional probe array, includes: (a) forming a plurality of linear probe arrays with each probe array including a plurality of probes formed on their sides, wherein the plurality of probes of a respective linear array are connected temporarily to one another by a first sacrificial material, and wherein alignment structures exist in combination with the probes and sacrificial material, including: (i) forming one or more multi-material layers, with any successively formed multi-material layers adhered to a previously formed multi-material layer or a non-multi-material layer that in turn was adhered directly or indirect to a previously formed multi-material layer, and with each multi-material layer including at least two materials, at least one of which is at least one structural material and at least one other of which is at least one sacrificial material, wherein each multi-material layer defines a successive cross-section of the plurality of linear probe arrays, wherein the forming of each multi-material layer includes: a) depositing at least a first of the at least two materials; b) depositing at least a second of the at least two materials; c) planarizing at least two of the at least two deposited materials, including planarizing at least one structural material and at least one sacrificial material; and (ii) after forming the one or more multi-material layers which are required to build up each linear probe array, removing at least one second sacrificial material from regions that connect the plurality of linear probe arrays to each other while leaving at least a portion of the first sacrificial material in place that connects the probes within each linear array to one another to reveal the individual linear arrays; (b) stacking multiple linear probe arrays side-to-side using the alignment structures, to at least partially set a positioning of the linear arrays with respect to one another to achieve a two-dimensional array configuration; (c) providing at least one array retention structure and engaging the stacked multiple linear probe arrays with the at least one retention structure to engage the probes of the two-dimensional array, and thereafter, removing the first sacrificial material from the engaged probes to release the probes from their respective linear arrays.

Numerous alternatives to the second embodiment exist and include for example variations similar to those noted for the first aspect, mutatis mutandis. For example, in variations (H)-(W) of the first aspect spacers may be replaced with alignment structures. In other variations, some alignment structures may be alternative structures that are not affixed to any probes but are held in alignment with the probes of their respective linear arrays by the temporary existence of the first sacrificial material or wherein at least some of the alignment structures are affixed to specific probes of their respective linear arrays by the temporary existence of the first sacrificial material.

In a third aspect of the invention a method of forming a two-dimensional probe array, includes: (a) forming a plurality of linear probe arrays with each probe array including a plurality of probes formed on their sides, wherein the plurality of probes of a respective linear array are connected temporarily to one another by a first sacrificial material, including: (i) forming one or more multi-material layers, with any successively formed multi-material layers adhered to a previously formed multi-material layer or a non-multi-material layer that in turn was adhered directly or indirect to a previously formed multi-material layer, and with each multi-material layer including at least two materials, at least one of which is at least one structural material and at least one other of which is at least one sacrificial material, wherein each multi-material layer defines a successive cross-section of the plurality of linear probe arrays, wherein the forming of each multi-material layer includes: a) depositing at least a first of the at least two materials; b) depositing at least a second of the at least two materials; c) planarizing at least two of the at least two deposited materials, including planarizing at least one structural material and at least one sacrificial material; and (ii) after the forming the one or more multi-material layers which are required to build up each linear probe array, removing at least one second sacrificial material from regions that connect the plurality of linear probe arrays to each other while leaving at least a portion of the first sacrificial material in place that connects the probes within each linear array to one another to reveal the individual linear arrays; (b) forming a plurality of probe array primary alignment structures; (c) stacking multiple linear probe arrays side-to-side using the primary alignment structures, to at least partially set a positioning of the linear arrays with respect to one another to achieve a two-dimensional array configuration; (d) providing at least one array retention structure and engaging the stacked multiple linear probe arrays with the at least one retention structure to engage the probes of the two-dimensional array, and thereafter, removing the first sacrificial material from the engaged probes to release the probes from their respective linear arrays.

Numerous alternatives to the third embodiment exist and include for example: (A) the at least one retention structure includes at least two retention structures; (B) the at least one retention structure includes a structure selected from the group consisting of (1) at least one substrate to which the one end of the probes of the two-dimensional probe configuration are bonded; (2) at least one guide plate with which at least one end of the probes of the two-dimensional probe array engage; (3) at least two guide plates with which the probes of the two-dimensional probe array engage; and (4) at least three guide plates with which the probes of the two-dimensional probe array engage; (C) the first and second sacrificial materials are different from one another; (D) the second sacrificial material, as compared to the first sacrificial material, has a physical or chemical property that allows the second sacrificial material to be separated from the first sacrificial material without causing excessive damage to the first sacrificial material (i.e. damage to such an extent that probes being held to one another by the first sacrificial material would be released from one another); (E) the first and second sacrificial materials are the same material; (F) separation of the second sacrificial material from the first sacrificial material is performed by providing differential access of a removal agent to the second sacrificial material in favor of the first material; (G) variation (F) wherein the differential access includes a masking material that provides at least some protection of the first sacrificial material and wherein the removal agent is a chemical etchant; (H) wherein the at least one multi-material layer includes a number layers selected from the group consisting of: (1) a single multi-material layer, and (2) at least two multi-material layers; (3) at least three multi-materials layers; and (4) a plurality of layers with at least a portion being multi-material layers and a portion being non-multi-material layers; (I) at least a portion of some primary alignment structures and at least a portion of the probes are formed on the same layer but with the primary alignment structures and the linear arrays separated from one another; (J) at least a portion of some primary alignment structures and the linear arrays are formed in the same build process but at least in part on different layers; (K) at least some primary alignment structures mate with probes or secondary alignment structures that are formed with the linear arrays in a line connecting arrays so as to set a distance between the respective linear arrays during assembly of the two-dimensional array; (L) at least some of the primary alignment structures mate with probes or secondary alignment structures that are formed with the linear arrays along a line substantially perpendicular to a line joining the linear arrays so as to provide an alignment of the respective probes selected from the group consisting of (1) a lateral alignment and (2) a longitudinal alignment; (M) at least some primary alignment structures are joined to a side of a probe including at least one edge of a layer wherein at least one of the following conditions is met: (1) the primary alignment structures meet edges of linear arrays with widths that are one layer thickness in width; (2) the primary alignment structures contact edges of linear arrays along widths associated with single layers; (3) primary alignment structures and linear arrays are formed from layers stacked along a primary alignment structure build axis and a linear array structure build axis, respectively, and when engaged with one another the build axes are not oriented parallel to one another; (4) primary alignment structures and the linear arrays are formed from layers stacked along a primary alignment structure build axis and a linear array structure build axis, respectively, and when engaged with one another the build axes are oriented substantially perpendicular to one another; (N) wherein at least some secondary alignment structures are formed along with the linear arrays and are engaged with primary alignment structures to set a spacing between probes in adjacent linear arrays; (O) wherein at least some secondary alignment structures are located on layer edges and layer faces of at least some probes; (P) at least some secondary alignment structures are located on two different portions of a face of a probe to which they adhere; (Q) at least some secondary alignment structures are located on two different portions of a single layer of a probe to which they adhere; (R) at least some secondary alignment structures are located on both front and back faces of the layer or layers of a probe to which they adhere; (S) at least some of the primary alignment structures, at least some of the secondary alignment structures, or at least some of both the primary and secondary alignment structures become permanent parts of the array as the array will be put to use; (T) at least some of the primary alignment structures, at least some of the secondary alignment structures, or some of both the primary and secondary alignment structures are temporary and are removed prior to putting the array to use; (U) wherein at least some of the primary alignment structures, at least some of the secondary alignment structures, or some of both the primary and secondary alignment structures are in part permanent and in part temporary wherein the permanent parts form part of the probe array when the probe array is put to use and the temporary parts are removed prior to putting the probe array to use; (V) at least a portion of at least some of the primary alignment structures, at least a portion of some of the secondary alignment structures, or at least a portion of both the primary and secondary alignment structures are not formed on multi-material layers but instead are formed as part of one or more layers that do not include a sacrificial material; (W) at least some of the primary alignment structures are used in positioning one or more retention structures; (X) at least some secondary alignment structures are not affixed to any probes but are held in alignment with the probes of their respective linear arrays by the temporary existence of the first sacrificial material; and (Y) at least some secondary alignment structures are affixed to specific probes of their respective linear arrays by the temporary existence of the first sacrificial material.

In a fourth aspect of the invention a method of forming a two-dimensional probe array, includes: (a) forming a plurality of probes, on their sides, with at least some of the plurality of probes, at least temporarily including at least one spacer adhered to a body of a respective probe, including: (i) forming one or more multi-material layers, with any successively formed multi-material layers adhered to a previously formed multi-material layer or a non-multi-material layer that in turn was adhered directly or indirect to a previously formed multi-material layer, and with each multi-material layer including at least two materials, at least one of which is at least one structural material and at least one other of which is at least one sacrificial material, wherein each multi-material layer defines a successive cross-section of the plurality probes, wherein the forming of each multi-material layer includes: a) depositing at least a first of the at least two materials; b) depositing at least a second of the at least two materials; c) planarizing at least two of the at least two deposited materials, including planarizing at least one structural material and at least one sacrificial material; and (ii) after the forming the one or more multi-material layers which are required to build up the plurality of probes, removing at least one sacrificial material; (b) stacking the probes laterally against one another, to at least partially set spacing of the probes, or alignment of the probes with respect to one another to achieve a two-dimensional array configuration; (c) providing at least one array retention structure and engaging the multiple probes with the at least one retention structure to secure the probes of the two-dimensional array.

Numerous alternatives to the fourth embodiment exist and include for example: (A) the at least one retention structure includes at least two retention structures; (B) the at least one retention structure includes a structure selected from the group consisting of (1) at least one substrate to which the one end of the probes of the two-dimensional probe configuration are bonded; (2) at least one guide plate with which at least one end of the probes of the two-dimensional probe array engage; (3) at least two guide plates with which the probes of the two-dimensional probe array engage; and (4) at least three guide plates with which the probes of the two-dimensional probe array engage; (C) the at least one sacrificial material includes at least a first and a second sacrificial material, selected from the group consisting of: (1) two different conductive materials, (2) a conductive material and a dielectric material, (3) two dielectric materials, and (4) copper and a photoresist; (5) two photoresists; (D) the second sacrificial material as compared to the first sacrificial material has a physical or chemical property that allows the second sacrificial material to be separated from the first sacrificial material without causing excessive damage to the first sacrificial material; (E) the at least one multi-material layer includes a number and configurations of layers selected from the group consisting of: (1) a single multi-material layer including both probe bodies and attached spacers; (2) at least two multi-material layers with at least one multi-material layer including cross-sections of probe bodies and at least one different multi-material layer including cross-sections of attached spacers; (3) at least two multi-material layers with at least one multi-material layer including cross-sections of attached spacers and at least one different multi-material layer including cross-sections of probe bodies; (4) at least two multi-material layers with at least one multi-material layer including cross-sections of attached spacers and at least two multi-material layers including cross-sections of probe bodies; (5) at least three-multi-material layers with at least two including cross-sections of probe bodies and at least one different layer including cross-sections of attached spacers; (6) at least three multi-material layers with at least one including cross-sections of probe bodies and at least two different layers including cross-sections of attached spacers; (7) at least three multi-material layers with at least three layers including cross-sections of probe bodies and at least three layers including cross-sections of attached spacers; (8) a plurality of successively formed and adhered layers with at least one probe layer including cross sections of probe bodies and at least one spacer layer including cross-sections of spacers wherein the at least one probe layer and the at least one spacer layer include at least one common layer; (9) a plurality of successively formed and adhered layers with at least one probe layer including cross sections of probe bodies and at least one spacer layer including cross-sections of spacers wherein the at least one probe layer and the at least one spacer layer are different layers; and (10) a plurality of layers with at least a portion being multi-material layers and a portion being non-multi-material layers; (F) at least a portion of some spacers and at least a portion of their respective probe bodies are formed on the same layer; (G) at least a portion of some spacers are formed on layers that do not include any portion of their respective probe bodies; (H) at least some spacers mate with neighboring probe bodies, or spacers attached to those neighboring probe bodies in a line connecting the probe bodies so as to set a distance between the respective probe bodies during array assembly; (I) at least some spacers mate with neighboring probes, or spacers attached to the neighboring probes along a line substantially perpendicular to a line joining the probes so as to provide an alignment of the respective probes selected from the group consisting of (1) a lateral alignment and (2) a longitudinal alignment; (J) at least some spacers are joined to a side of probe bodies including at least one edge of a layer wherein at least one of the following conditions is met: (1) the spacers meet edges of adjacent probe bodies with widths that are one layer thickness in width; (2) the spacers are proud of the neighboring portions of the probe bodies to which they are attached; (3) the spacers contact edges of adjacent probe bodies along widths associated with single layers; (4) the spacers indirectly contact edges of adjacent probe bodies via second spacers that are attached to the adjacent probe bodies where the second spacers are proud of other portions of the probe bodies to which they are attached and wherein a contact portion of the second spacers are no more than one layer wide; (K) at least some spacers are adhered to layer faces of their respective probes; (L) at least some spacers are located on layer faces of their respective probes and along layer edges of their respective probes; (M) at least some spacers are located on at least two different portions of a face of their respective probes; (N) at least some spacers are located on at least two different portions of a single layer of their respective probes; (O) at least some spacers are located on both front and back faces of the layer or layers of their respective probe bodies; (P) at least some of the spacers become permanent parts of the array as the array will be put to use; (Q) at least some of spacers are temporary and are removed prior to putting the array to use; (R) at least some of the spacers are in part permanent and in part temporary wherein the permanent parts form part of the probe array when the probe array is put to use and the temporary parts are removed prior to putting the probe array to use; (S) at least a portion of at least some spacers are not formed on multi-material layers but instead are formed as part of one or more layers that do not include a sacrificial material; and (T) at least some spacers are used in positioning one or more retention structures.

In a fifth aspect of the invention a method of forming a two-dimensional probe array, includes: (a) forming a plurality of combination subarrays, with each combination subarray including a plurality of linear probe arrays positioned face-to-face, with each linear probe array including a plurality of probes formed on their sides, wherein the plurality of probes of a respective combination subarray are connected temporarily to one another by a first sacrificial material, and wherein spacers exist in combination with the probes and the first sacrificial material, including: (i) directly or indirectly on at least one build substrate, forming a plurality of multi-material layers, with successively formed multi-material layers adhered to a previously formed multi-material layer or a non-multi-material layer that in turn was adhered directly or indirectly to a previously formed multi-material layer, and with each multi-material layer including at least two materials, at least one of which is at least one structural material and at least one other of which is at least one sacrificial material, wherein each multi-material layer defines a successive cross-section of the plurality of combination subarrays, wherein the forming of each multi-material layer includes: a) depositing at least a first of the at least two materials; b) depositing at least a second of the at least two materials; c) planarizing at least two of the at least two deposited materials, including planarizing at least one structural material and at least one sacrificial material; and (ii) after forming the plurality of multi-material layers which are required to build up each combination subarray, removing at least one second sacrificial material from regions that connect the plurality of combination subarrays to each other while leaving at least a portion of the first sacrificial material in place that connects the probes within each combination subarray to one another to reveal the individual combination subarrays; (b) stacking multiple combination subarrays (e.g. side-to-side and/or end-to-end), using the spacers, to at least partially set spacing of the probes, or alignment of the probes of different combination subarrays with respect to one another to achieve a two dimensional array configuration; (c) providing at least one array retention structure and engaging the stacked multiple combination subarrays with the at least one retention structure to secure the probes of the two-dimensional array; and (d) removing the first sacrificial material from the secured probes to release the probes from their respective combination subarrays.

Numerous alternatives to the fifth embodiment exist and include for example: (A) the at least one retention structure includes at least two retention structures; (B) the at least one retention structure includes a structure selected from the group consisting of (1) at least one mounting substrate to which the one end of the probes of the two-dimensional probe configuration are bonded; (2) at least one guide plate with which at least one end of the probes of the two-dimensional probe array engage; (3) at least two guide plates with which the probes to the two-dimensional probe array engage; and (4) at least three guide plates with which the probes of the two-dimensional probe array engage; (C) the first and second sacrificial materials are different from one another; (D) the second sacrificial material as compared to the first sacrificial material has a physical or chemical property that allows the second sacrificial material to be separated from the first sacrificial material without causing excessive damage to the first sacrificial material (i.e. damage to such an extent that probes being held to one another by the first sacrificial material would be released from one another; (E) the first and second sacrificial materials are the same material; (F) separation of the second sacrificial material from the first sacrificial material is performed by providing differential access of a removal agent to the second sacrificial material in favor of the first material; (G) variation (F) wherein the differential access includes a masking material that provides at least some protection of the first sacrificial material and wherein the removal agent is a chemical etchant; (H) the plurality of multi-material layers include a number and configurations of layers selected from the group consisting of; (1) at least two multi-material layers with each including both probes and attached spacers; (2) at least three multi-material layers with at least two multi-material layers including cross-sections of probes (3) at least three multi-material layers with at least one multi-material layer including cross-sections of attached spacers and at least two different multi-material layers including cross-sections of probes; (4) at least three multi-material layers with at least two multi-material layers including cross-sections of attached spacers and at least two multi-material layers including cross-sections of probes; (5) at least four multi-material layers with at least two including cross-sections of probes and at least two different layers including attached spacers; (6) a plurality of successively formed and adhered layers with at least two probe layers including cross sections of probes and at least two spacer layers including cross-sections of spacers wherein the at least two probe layers and the at least two spacer layers include at least one common layer; (7) a plurality of successively formed and adhered layers with at least two probe layers including cross sections of probes and at least two spacer layers including cross-sections of spacers wherein the at least two probe layers and the at least two spacer layers are different layers; and (8) a plurality of successively formed layers with at least some probe layers alternating with some non-probe layers; and (9) a plurality of successively formed layers with at least some probe layers spaced from other probe layers by at least two non-probe layers wherein at least one of the intermediate non-probe layers includes spacers; and (10) a plurality of layers with at least a portion being multi-material layers and a portion being non-multi-material layers; (I) at least a portion of some spacers and at least a portion of their respective probes are formed on the same layer; (J) at least a portion of some spacers are formed on layers that do not include any portion of their respective probes; (K) at least some spacers mate with neighboring probes, or spacers attached to those neighboring probes in a line connecting the probes so as to set a distance between the respective probes during array assembly; (L) at least some spacers mate with neighboring probes, or spacers attached to the neighboring probes along a line substantially perpendicular to a line joining the probes so as to provide an alignment of the respective probes selected from the group consisting of (1) a lateral alignment and (2) a longitudinal alignment; (M) at least some spacers are joined to a side of a probe including at least one edge of a layer wherein at least one of the following conditions is met: (1) the spacers meet edges of adjacent combination subarrays with widths that are one layer thickness in width; (2) the spacers are proud of the neighboring portions of the temporarily joined combination subarray to which they are held; (3) the spacers contact edges of adjacent combination subarrays along widths associated with single layers; (4) the spacers contact edges of adjacent second combination subarrays via second spacers that are held by their temporarily joined second combination subarrays where the second spacers are proud of other portions of the second combination subarrays and wherein a contact portion of the second spacers are no more than one layer wide; (N) at least some spacers are adhered to a layer faces of their respective probes; (O) at least some spacers are located on layer faces of their respective probes and along at least one layer edge of their respective probes; (P) at least some spacers are located on two different portions of a face of their respective probes; (Q) at least some spacers are located on two different portions of a single layer of their respective probes; (R) at least some spacers are located on both front and back faces of the layer or layers of their respective probe; (S) at least some of the spacers become permanent parts of the array as the array will be put to use; (T) at least some of spacers are temporary and are removed prior to putting the array to use; (U) at least some of the spacers are in part permanent and in part temporary wherein the permanent parts form part of the probe array when the probe array is put to use and the temporary parts are removed prior to putting the probe array to use; (V) at least a portion of at least some spacers are not formed on multi-material layers but instead are formed as part of one or more layers that do not include a sacrificial material; and (W) at least some spacers are used in positioning one or more retention structures.

In a sixth aspect of the invention a method of forming a two-dimensional probe array, includes: (a) forming a plurality of combination subarrays with each combination subarray including a plurality of linear probe arrays positioned face-to-face, with each linear probe array including a plurality of probes formed on their sides, wherein the plurality of probes of a respective combination subarray are connected temporarily to one another by a first sacrificial material, and wherein primary alignment structures exist in combination with the probes and the first sacrificial material, including: (i) directly or indirectly on at least one build substrate, forming a plurality of multi-material layers, with successively formed multi-material layers adhered to a previously formed multi-material layer or a non-multi-material layer that in turn was adhered directly or indirect to a previously formed multi-material layer, and with each multi-material layer including at least two materials, at least one of which is at least one structural material and at least one other of which is at least one sacrificial material, wherein each multi-material layer defines a successive cross-section of the plurality of combination subarrays, wherein the forming of each multi-material layer includes: a) depositing at least a first of the at least two materials; b) depositing at least a second of the at least two materials; c) planarizing at least two of the at least two deposited materials, including planarizing at least one structural material and at least one sacrificial material; and (ii) after the forming the one or more multi-material layers which are required to build up each combination subarray, removing at least one second sacrificial material from regions that connect the plurality of combination subarrays to each other while leaving at least a portion of the first sacrificial material in place that connects the probes within each combination subarray to one another to reveal the individual combination subarrays; (b) stacking multiple combination subarrays (e.g. side-to-side or end-to-end) using the primary alignment structures, to at least partially set a positioning of the combination subarrays with respect to one another to achieve a two dimensional array configuration; (c) providing at least one array retention structure and engaging the stacked multiple combination subarrays with the at least one retention structure to secure the probes of the two-dimensional array; (d) removing the first sacrificial material from the secured probes to release the probes from their respective combination subarrays.

Numerous alternatives to the sixth embodiment exist and include for example: (A) the at least one retention structure includes at least two retention structures; (B) the at least one retention structure includes a structure selected from the group consisting of (1) at least one substrate to which the one end of the probes of the two-dimensional probe configuration are bonded; (2) at least one guide plate with which at least one end of the probes of the two-dimensional probe array engage; (3) at least two guide plates with which the probes to the two-dimensional probe array engage; and (4) at least three guide plates with which the probes of the two-dimensional probe array engage; (C) the first and second sacrificial materials are different from one another; (D) the second sacrificial material as compared to the first sacrificial material has a physical or chemical property that allows the second sacrificial material to be separated from the first sacrificial material without causing excessive damage to the first sacrificial material (i.e. damage to such an extent that probes being held to one another by the first sacrificial material would be released from one another; (E) the first and second sacrificial materials are the same material; (F) separation of the second sacrificial material from the first sacrificial material is performed by providing differential access of a removal agent to the second sacrificial material in favor of the first material; (G) the differential access includes a masking material that provides at least some protection of the first sacrificial material and wherein the removal agent is a chemical claim etchant; (H) the plurality of multi-material layers includes a number and configurations of layers selected from the group consisting of: (1) at least two multi-material layers with each including both probes and alignment structures; (2) at least three multi-material layers with at least one multi-material layer including cross-sections of probes and at least one different multi-material layer including attached alignment structures; (3) at least two multi-material layers with each containing a plurality probe cross-sections separated by at least one multi-material layer containing a plurality of alignment structure cross-sections wherein at least one of the two multi-material layers contains both probe cross-sections and alignment structure cross-sections; (4) a plurality of successively formed and adhered layers with at least one probe layer including cross sections of probes and at least one alignment structure layer including cross-sections of alignment structures wherein the at least one probe layer and the at least one alignment structure layer are part of different layers; and (5) a plurality of layers with at least a portion being multi-material layers and a portion being non-multi-material layers; (I) at least a portion of some alignment structures and at least a portion of the probes are formed on the same layer; (J) at least a portion of some alignment structures are formed on layers that do not include any probe cross-sections; (K) at least some alignment structures mate with probes or alignment structures of adjacent combination subarrays in a line connecting arrays so as to set a distance between the respective combination subarrays during assembly of the two-dimensional array; (L) at least some alignment structures mate with probes or alignment structures of adjacent combination subarrays along a line substantially perpendicular to a line joining the combination subarrays so as to provide an alignment of the respective probes selected from the group consisting of (1) a lateral alignment and (2) a longitudinal alignment; (M) at least some alignment structures are joined to a side of a probe including at least one edge of a layer wherein at least one of the following conditions is met: (1) the alignment structures meet edges of adjacent combination subarrays with widths that are one layer thickness in width; (2) the alignment structures are proud of the neighboring portions of the temporarily joined combination subarray to which they are held; (3) the alignment structures contact edges of adjacent combination subarrays along widths associated with single layers; (4) the alignment structures contact edges of adjacent second combination subarrays via second alignment structures that are held by their temporarily joined second combination subarrays where the second alignment structures are proud of other portions of the second combination subarrays and wherein a contact portion of the second alignment structures are no more than one layer wide; (N) at least some alignment structures are adhered to a layer faces of at least some probes in their respective combination subarrays; (O) at least some alignment structures are located on layer edges and layer faces of at least some probes; (P) at least some alignment structures are located on two different portions of a face of a probe to which they adhere; (Q) at least some alignment structures are located on two different portions of a single layer of a probe to which they adhere; (R) at least some alignment structures are located on both front and back faces of the layer or layers of a probe to which they adhere; (S) at least some of the alignment structures become permanent parts of the array as the array will be put to use; (T) at least some of alignment structures are temporary and are removed prior to putting the array to use; (U) at least some of the alignment structures are in part permanent and in part temporary wherein the permanent parts form part of the probe array when the probe array is put to use and the temporary parts are removed prior to putting the probe array to use; (V) at least a portion of at least some alignment structures are not formed on multi-material layers but instead are formed as part of one or more layers that do not include a sacrificial material; (W) at least some alignment structures are used in positioning one or more retention structures; (X) at least some alignment structures are alternative alignment structures that are not affixed to any probes but are held in alignment with the probes of their respective combination subarrays by the temporary existence of the first sacrificial material; and (Y) at least some of the alignment structures are affixed to specific probes of their respective combination subarrays and by the temporary existence of the first sacrificial material.

In a seventh aspect of the invention a method of forming a two-dimensional probe array, including: (a) forming a plurality of combination subarrays with each combination subarray including a plurality of linear probe arrays positioned face-to-face, with each linear probe array including a plurality of probes formed on their sides, wherein the plurality of probes of a respective combination subarray are connected temporarily to one another by a first sacrificial material, including: (i) directly or indirectly on at least one build substrate forming a plurality of multi-material layers, with any successively formed multi-material layer adhered to a previously formed multi-material layer or a non-multi-material layer that in turn was adhered directly or indirectly to a previously formed multi-material layer, and with each multi-material layer including at least two materials, at least one of which is at least one structural material and at least one other of which is at least one sacrificial material, wherein each multi-material layer defines a successive cross-section of the plurality of combination subarrays, wherein the forming of each multi-material layer includes: a) depositing at least a first of the at least two materials; b) depositing at least a second of the at least two materials; and c) planarizing at least two of the at least two deposited materials, including planarizing at least one structural material and at least one sacrificial material; and (ii) after the forming the one or more multi-material layers which are required to build up each combination subarray, removing at least one second sacrificial material from regions that connect the plurality of combination subarrays to each other while leaving at least a portion of the first sacrificial material in place that connects the probes within each combination subarray to one another to reveal the individual combination subarrays; (b) forming a plurality of combination subarray primary alignment structures; (c) stacking multiple combination subarrays (e.g. side-to-side or end-to-end) using the primary alignment structures, to at least partially set a positioning of the combination subarrays with respect to one another to achieve a two dimensional array configuration; (d) providing at least one array retention structure and engaging the stacked multiple combination subarrays with the at least one retention structure to secure the probes of the two-dimensional array; and (e) removing the first sacrificial material from the secured probes to release the probes from their respective combination subarrays.

Numerous alternatives to the seventh embodiment exist and include for example: (A) the at least one retention structure includes at least two retention structures; (B) the at least one retention structure includes a structure selected from the group consisting of (1) at least one substrate to which the one end of the probes of the two-dimensional probe configuration are bonded; (2) at least one guide plate with which at least one end of the probes of the two-dimensional probe array engage; (3) at least two guide plates with which the probes of the two-dimensional probe array engage; and (4) at least three guide plates with which the probes of the two-dimensional probe array engage; (C) the first and second sacrificial materials are different from one another; (D) variation (C) wherein the second sacrificial material as compared to the first sacrificial material has a physical or chemical property that allows the second sacrificial material to be separated from the first sacrificial material without causing excessive damage to the first sacrificial material (i.e. damage to such an extent that probes being held to one another by the first sacrificial material would be released from one another; (E) the first and second sacrificial materials are the same material; (F) variation (E) wherein separation of the second sacrificial material from the first sacrificial material is performed by providing differential access of a removal agent to the second sacrificial material in favor of the first material; (G) variation (F) wherein the differential access includes a masking material that provides at least some protection of the first sacrificial material and wherein the removal agent is a chemical etchant; (H) the plurality of multi-material layers include a number layers selected from the group consisting of: (1) at least two multi-material layers, (2) at least two multi-material layers separated by at least one non-multi-material layer, (3) at least three multi-material layers preceded, separated, or followed by at least one non-multi-material layer; and (4) at least four multi-material layers; (I) at least a portion of some primary alignment structures and at least a portion of the probes are formed on the same layer but with the primary alignment structures and the combination subarrays separated from one another; (J) at least a portion of some primary alignment structures and the combination subarrays are formed in the same build process but at least in part on different layers; (K) at least some primary alignment structures mate with probes or secondary alignment structures that are formed with the combination subarrays in a line connecting arrays so as to set a distance between the respective combination subarrays during assembly of the two-dimensional array; (L) at least some of the primary alignment structures mate with probes or secondary alignment structures that are formed with the combination subarrays along a line substantially perpendicular to a line joining the combination subarrays so as to provide an alignment of the respective probes selected from the group consisting of (1) a lateral alignment and (2) a longitudinal alignment; (M) at least some primary alignment structures are contacted to a side of a probe including at least one edge of a layer wherein at least one of the following conditions is met: (1) the primary alignment structures meet edges of combination subarrays with widths that are one layer thickness in width; (2) the primary alignment structures contact edges of combination subarrays along widths associated with single layers; (3) primary alignment structures and combination subarrays are formed from layers stacked along a primary alignment structure build axis and a combination subarray structure build axis, respectively, and when engaged with one another the build axes are not oriented parallel to one another; (4) primary alignment structures and the combination subarrays are formed from layers stacked along a primary alignment structure build axis and a combination subarray structure build axis, respectively, and when engaged with one another the build axes are oriented substantially perpendicular to one another; (N) at least some secondary alignment structures are formed along with the combination subarrays and are engaged with primary alignment structures to set a spacing between probes in adjacent combination subarrays; (O) at least some secondary alignment structures are formed along with the combination subarrays and are located on layer edges and layer faces of at least some probes; (P) at least some secondary alignment structures are formed along with the combination subarrays and are located on two different portions of a face of a probe to which they adhere; (Q) at least some secondary alignment structures are formed along with the combination subarrays and are located on two different portions of a single layer of a probe to which they adhere; (R) at least some secondary alignment structures are formed along with the combination subarrays and are located on both front and back faces of the layer or layers of a probe to which they adhere; (S) any of variations (N)-(R), wherein at least some of the primary alignment structures, at least some of the secondary alignment structures, or at least some of both the primary and secondary alignment structures are permanent parts of the array as the array will be put to use; (T) any of variations (N)-(S) wherein at least some of the primary alignment structures, at least some of the secondary alignment structures, or some of both the primary and secondary alignment structures are temporary and are removed prior to putting the array to use; (U) any of variations (N)-(T) wherein at least some of the primary alignment structures, at least some of the secondary alignment structures, or some of both the primary and secondary alignment structures are in part permanent and in part temporary wherein the permanent parts form part of the probe array when the probe array is put to use and the temporary parts are removed prior to putting the probe array to use; (V) any of variations (N)-(U) wherein at least a portion of at least some of the primary alignment structures, at least a portions of some of the secondary alignment structures, or at least a portions of both the primary and secondary alignment structures are not formed on multi-material layers but instead are formed as part of one or more layers that do not include a sacrificial material; (W) at least some of the primary alignment structures are used in positioning one or more retention structures; (X) at least some secondary alignment structures are formed along with combination subarrays and are not affixed to any probes but are held in alignment with the probes of their respective combination subarrays by the temporary existence of the first sacrificial material; and (Y) at least some alignment structures are formed along with combination subarrays and are affixed to specific probes of their respective combination subarrays at least in part by the temporary existence of the first sacrificial material.

701. In an eighth aspect of the invention a method of forming a two-dimensional probe array, includes: (a) forming a plurality of assembly units, selected from the group consisting of: (1) individual probes, (2) augmented individual probes with attached primary alignment structures, (3) one or more linear probe arrays with each linear probe array including a plurality of probes formed on their sides, wherein the plurality of probes of a respective linear probe array are connected temporarily to one another by a first sacrificial material, (4) one or more augmented linear probe arrays with each augmented linear probe array including a plurality of probes formed on their sides, wherein the plurality of probes of a respective linear probe array are connected temporarily to one another by a first sacrificial material, and wherein the primary alignment structures exist in combination with the probes and the first sacrificial material, (5) combination subarrays with each combination subarray including a plurality of linear probe arrays positioned face-to-face, with each linear probe array including a plurality of probes formed on their sides, wherein the plurality of probes of a respective combination subarray are connected temporarily to one another by a first sacrificial material, (6) one or more augmented combination probe arrays with each combination subarray including a plurality of linear probe arrays positioned face-to-face, with each linear probe array including a plurality of probes formed on their sides, wherein the plurality of probes of a respective combination subarray are connected temporarily to one another by a first sacrificial material, and wherein primary alignment structures exist in combination with the probes and the first sacrificial material, and (7) one or more secondary alignment structures: (i) directly or indirectly on at least one build substrate forming one or more multi-material layers, with any successively formed multi-material layers adhered to a previously formed multi-material layer or a non-multi-material layer that in turn was adhered directly or indirect to a previously formed multi-material layer, and with each multi-material layer including at least two materials, at least one of which is at least one structural material and at least one other of which is at least one sacrificial material, wherein each multi-material layer defines a successive cross-section of the plurality of linear probe arrays, wherein the forming of each multi-material layer includes: a) depositing at least a first of the at least two materials; b) depositing at least a second of the at least two materials; c) planarizing at least two of the at least two deposited materials, including planarizing at least one structural material and at least one sacrificial material; and (ii) after the forming the one or more multi-material layers which are required to build up each assembly unit, removing at least one secondary sacrificial material from regions that connect the plurality of assembly units to each other while leaving at least a portion of any first sacrificial material in place; (b) stacking multiple assembly units side-to-side using alignment units selected from the group consisting of (1) the primary alignment structures, (2) the secondary alignment structures, and (3) a combination of primary and secondary structures; to at least partially set a positioning of selected assembly units that include probes with respect to one another to achieve a two-dimensional array configuration; (c) providing at least one array retention structure and engaging the stacked assembly units with the at least one retention structure to engage the probes of the two-dimensional array and thereafter, if present, removing any first sacrificial material from the engaged probes to release the probes from their respective assembly units.

Numerous variations to the eighth aspect of the invention are possible and include, for example: (A) the assembly units include a plurality of augmented combination probe arrays; (B) the assembly units include a plurality of combination probe arrays; (C) the assembly units include a plurality of augmented linear probe arrays; (D) wherein the assembly units include a plurality of linear probe arrays; (E) the assembly units include a plurality of augmented individual probes; (F) the assembly units include a plurality of individual probes; (G) the assembly units include a plurality of individual probes; (H) the assembly units include a plurality of secondary alignment structures; (I) the two-dimensional area is not a full X-Y array of probes; (J) variation (I) wherein the two-dimensional area includes one or more X-Y grids of probes with some probes missing from grid positions; (K) either of variations (I) or (J) wherein the probe array has a nominal X-Y grid pattern but some probes are located in non-grid positions; (L) any of variations (I)-(K) wherein the probe pattern includes a plurality of cells with a repeated probe pattern with each cell corresponding to at least one DUT that is to be tested using the area; (M) no augmented linear probe arrays and no augmented combination probe arrays are used in the forming of the two-dimensional array and thus no first sacrificial material from the augmented arrays is removed after achieving the two-dimensional array configuration, the providing of the retention structures, and the engaging; (N) use of a plurality of secondary alignment structures which are at least in part formed from a first sacrificial material which is removed after achieving the two-dimensional array configuration, the providing of the retention structures, and engagement; (O) the at least one retention structure includes a substrate to which the two-dimensional array configuration is bonded; (P) the at least one retention structure includes a substrate to which the two-dimensional array configuration is bonded and at least one guide plate; (Q) the substrate and at least one of the at least one guide plate are laterally shifted relative to one another to set lateral positions of one end of each probes relative to an opposite end of each probe; (R) the at least one retention structure includes at least two guide plates; and (S) variation of (R) wherein the substrate and the at least two of the at least two guide plates are laterally shifted relative to one another to set lateral positions of one end of each probe relative to an opposite end of each probe.

In a ninth aspect of the invention a probe array includes: (a) a plurality of probes, comprising: (i) a first end selected from the group consisting of a contact tip and a base, comprising at least one first end material; (ii) a second end selected from the group consisting of a contact tip and a base comprising at least one second end material, wherein at least one of the first and second ends comprises a contact tip; (iii) an elongated body portion formed of at least one body material, longitudinally connecting the first end and the second end, and comprising at least one compliant portion allowing for elastic deformation upon the first end and the second end being compressed toward one another along a longitudinal direction; (b) a plurality of spacers; (c) at least one retention structure for engaging the probes and holding the probes in an array configuration, wherein for at least a plural portion of the plurality of probes at least one of the plurality of spacers is adhered to a body portion wherein the at least one spacer provides a function selected from the group consisting of: (1) setting a minimum contact distance between a portion of the probe to which the at least one spacer is adhered and a portion of a neighboring probe, (2) maintaining a minimum contact distance between a portion of the probe to which the at least one spacer is adhered and a portion of a neighboring probe, (3) setting a minimum contact distance between a portion of the probe to which the at least one spacer is adhered and at least one spacer attached to the neighboring probe, (4) maintaining a minimum contact distance between a portion of the probe to which the at least one space is adhered and at least one spacer attached to the neighboring probe, (5) setting or maintaining at least one of a lateral alignment, a longitudinal alignment, a maximum lateral misalignment, or maximum longitudinal misalignment between a portion of the probe to which the at least one spacer is adhered and a portion of a neighboring probe along a line that is perpendicular to a line extending therebetween; and (6) setting or maintaining at least one of a lateral alignment, a longitudinal alignment, a maximum lateral misalignment, or maximum longitudinal misalignment between a portion of the probe to which the at least one space is adhered and at least one spacer attached to the neighboring probe along a line that is perpendicular to a line extending therebetween.

Numerous variations of the ninth aspect of the invention are possible and include, for example: (A) at least some of the spacers make substantially constant contact between the probes to which they adhere and the neighboring probes or one more spacers attached to the neighboring probes while there is relative longitudinal compression of the first probe end toward the second probe end; (B) at least some of the spacers make substantially constant contact between the probes to which they adhere and the neighboring probes or one more spacers attached to the neighboring probes when there is no relative longitudinal compression of the first probe end toward the second probe end; (C) at least some spacers do not make contact between the probes to which they adhere and the neighboring probes or one more spacers attached to the neighboring probes under normal operating conditions when there is relative longitudinal compression of the first probe end toward the second probe end; (D) at least a portion of the plurality of spacers include dielectric material that inhibits electric shorting between the probes to which they are attached and one or more neighboring probes; (E) at least a portion of the spacers provide lateral alignment, or a limit on lateral misalignment, when the probes are undergoing elastic deformation; (F) at least a portion of the spacers provide longitudinal alignment, or a limit on longitudinal misalignment, when the probes are undergoing elastic deformation; (G) at least a portion of the spacers provide lateral alignment, or a limit on lateral misalignment, when the probes are not under an end-to-end compressive force; (H) at least a portion of the spacers provide longitudinal alignment, or a limit on longitudinal misalignment, when the probes are not under an end-to-end compressive force; (I) at least a portion of the spacers include a conductive material that provide an electrically conductive path between selected probes; (J) at least a portion of the spacers adhered to some probes do not directly engage other probes but engage the other probes by contact with spacers adhered to the other probes; (K) at least some of the probes have non-linear configurations along planes that contain the longitudinal axes of the probes and an axes of layer stacking; and (L) at least some of the probes have non-linear configurations in planes that are perpendicular to a layer stacking direction (i.e. within the plane of the layer or layers of the probes).

Other aspects of the invention will be understood by those of skill in the art upon review of the teachings herein. Other aspects of the invention may involve combinations of the above noted aspects or variations of those aspects. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 2A-2F provide six views of a probe, or probe preform (hereafter simply referred to as a "probe" unless the context requires distinguishing between a preliminary probe structure, i.e. probe preform, that is used in array formation, and a finalized probe that forms part of an array as the array is to be put to use) according to a first embodiment of the invention wherein the probe is a straight pin (e.g. formed from two layers) with the probe body formed on one layer and a spacer located on another layer.

FIGS. 3A-3D illustrate four different relationship configurations for a plurality of probes of the type shown in FIGS. 2A-2F.

FIGS. 4A-4D each provide views of the array of FIG. 3D, along the Y-direction and the X-direction in different states of formation associated with attaching the linear arrays and the overall array to a substrate that is provided with an array bonding material (e.g., solder).

FIGS. 12A-12E provide another example probe array configuration along with isometric illustrations of various states involved in the process of forming the array wherein the process bonds rectangular, linear probe arrays at a non-perpendicular angle to a permanent substrate.

FIGS. 13A-13B provide isometric illustrations of two states in a process of assembling a probe array using non-probe attached spacers or alignment structures that may be formed from a structural material that may or may not be eventually removed or which may be formed from a sacrificial material that may be removed along with intervening sacrificial material located between probes within individual linear arrays.

FIGS. 16A-16D provide isometric illustrations of various states in process for creating a probe array assembly wherein the probes are formed on their sides but with a tilted configuration so that linear arrays themselves are angled and can be combined with other angled linear arrays to build up two-dimensional angled probe arrays.

FIGS. 23-33 each provide pairs of views of example probe configurations that may be used with the various spacer configurations of the present embodiments to aid in the formation, or assembly, of arrays and/or to improve the operation of arrays after formation, or assembly, wherein the left image in each figure provides a view of the probe looking down on the probe from above the layer planes while the right image provides a view of the same probe looking toward the edges of the layers to show the longitudinal extent of the probe.

DETAILED DESCRIPTION OF PREFERRED EMBODIMENTS

Electrochemical Fabrication in General

Figure 1A:
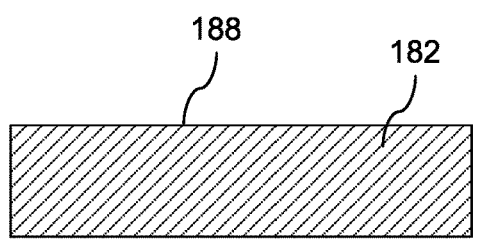
FIGS. 1A-1F schematically depict the formation of a first layer of a structure using adhered mask plating where the blanket deposition of a second material overlays both the openings between deposition locations of a first material and the first material itself.
Figure 1B:
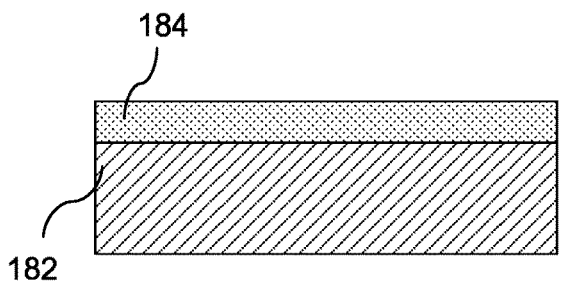
Figure 1C:
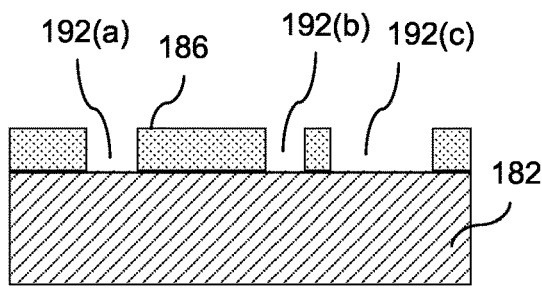
Figure 1D:
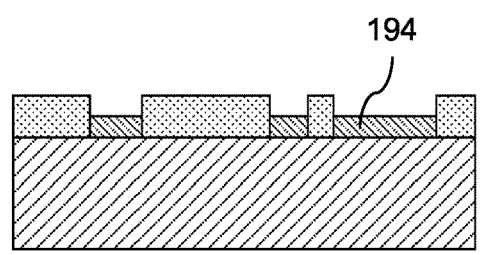
Figure 1E:
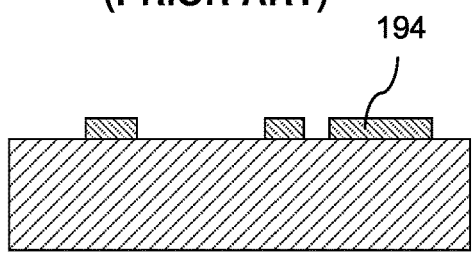
Figure 1F:
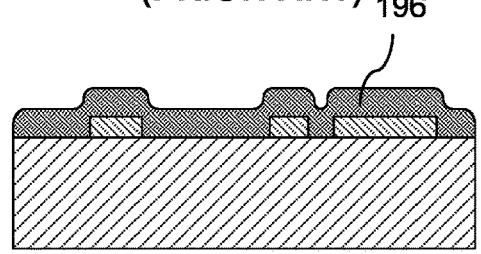
Figure 1G:
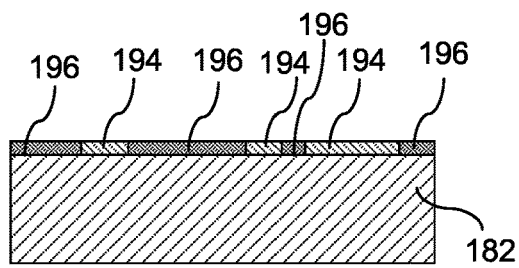
FIG. 1G depicts the completion of formation of the first layer resulting from planarizing the deposited materials to a desired level.
Figure 1H:
FIGS. 1H and 1I respectively depict the state of the process after formation of the multiple layers of the structure and after release of the structure from the sacrificial material.
Figure 1I:
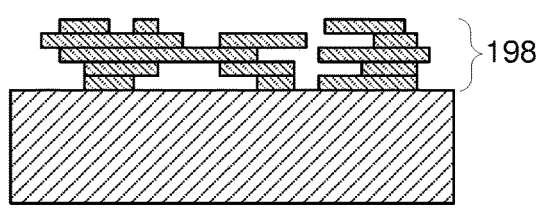

An example of a multi-layer, multi-material electrochemical fabrication process was provided above in conjunction with the illustrations of FIGS. 1A-1I. In some variations, the structure may be separated from the substrate. For example, release of the structure (or multiple structures if formed in a batch process) from the substrate may occur when releasing the structure from the sacrificial material particularly when a layer of sacrificial material is positioned between the first layer of the structure and the substrate. Alternative methods may involve, for example, the use of a dissolvable substrate that may be separated before, during or after removal of the sacrificial material, machining off the substrate before or after removal of the sacrificial material, or use of a different intermediate material that can be dissolved, melted or otherwise used to separate the structure(s) from the substrate before, during, or after removal of the sacrificial material that surround the structure(s).

Various embodiments of various aspects of the invention are directed to formation of three-dimensional structures from materials, some, or all, of which may be electrodeposited or electroless deposited (as illustrated in FIGS. 1A-1I and as discussed in various patents and patent applications incorporated herein by reference). Some of these structures may be formed from a single build level (e.g., a planarized layer) that is formed from one or more deposited materials while others are formed from a plurality of build levels, each generally including at least two materials (e.g. two or more layers, five or more layers, and even ten or more layers). In some embodiments, layer thicknesses may be as small as one micron or as large as one hundred to two hundred microns. In still other embodiments, layers may be up to five hundred microns, one millimeter, even multiple millimeters, or more. In other embodiments, thinner layers may be used. In still other embodiments, layer thickness may be varied during formation of different levels of the same structure. In some embodiments, microscale structures have lateral features positioned with 0.1-10 micron level precision and minimum feature sizes on the order of microns to tens of microns. In other embodiments, structures with less precise feature placement and/or larger minimum features may be formed. In still other embodiments, higher precision and smaller minimum feature sizes may be desirable. In the present application, meso-scale and millimeter-scale have the same meaning and refer to devices that may have one or more dimensions that may extend into the 0.1-50 millimeter range, or somewhat larger, and features positioned with a precision in the micron to 100 micron range and with minimum feature sizes on the order of several microns to hundreds of microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), adhered masks and masking operations (masks and operations that use masks that are adhered to a substrate onto which selective deposition or etching is to occur as opposed to only being contacted to it), and/or selective patterned deposition of materials (e.g. via extrusion, jetting, or controlled electrodeposition) as opposed to masked patterned deposition. Conformable contact masks, proximity masks, and non-conformable contact masks share the property that they are preformed and brought to, or in proximity to, a surface which is to be treated (i.e., the exposed portions of the surface are to be treated). These masks can generally be removed without damaging the mask or the surface that received treatment to which they were contacted or located in proximity to. Adhered masks are generally formed on the surface to be treated (i.e., the portion of that surface that is to be masked) and bonded to that surface such that they cannot be separated from that surface without being completely destroyed or damaged beyond any point of reuse. Adhered masks may be formed in a number of ways including (1) by application of a photoresist, selective exposure of the photoresist, and then development of the photoresist, (2) selective transfer of pre-patterned masking material, (3) direct formation of masks from computer-controlled depositions of material, and/or (4) laser ablation of a deposited material.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e., regions that lie within the top and bottom boundary levels that define a different layer's geometric configuration). Such use of selective etching and/or interlaced material deposition in association with multiple layers is described in U.S. patent application Ser. No. 10/434,519, by Smalley, filed May 7, 2003, which is now U.S. Pat. No. 7,252,861, and which is entitled "Methods of and Apparatus for Electrochemically Fabricating Structures Via Interlaced Layers or Via Selective Etching and Filling of Voids". This referenced application is incorporated herein by reference.

Temporary substrates on which structures may be formed may be of the sacrificial-type (i.e., destroyed or damaged during separation of deposited materials to the extent they cannot be reused), non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g., planarizing one or more selected surfaces or applying a release layer, and the like) though they may or may not be reused for a variety of reasons.

Definitions of various terms and concepts that may be used in understanding the embodiments of the invention (either for the devices themselves, certain methods for making the devices, or certain methods for using the devices) will be understood by those of skill in the art. Some such terms and concepts are discussed herein while other such terms are addressed in the various patent applications to which the present application claims priority and/or which are incorporated herein by reference.

Definitions

This section of the specification is intended to set forth definitions for a number of specific terms that may be useful in describing the subject matter of the various embodiments of the invention. It is believed that the meanings of most if not all these terms are clear from their general use in the specification, but they are set forth hereinafter to remove any ambiguity that may exist. It is intended that these definitions be used in understanding the scope and limits of any claims that use these specific terms. As far as interpretation of the claims of this patent disclosure are concerned, it is intended that these definitions take presence over any contradictory definitions or allusions found in any materials which are incorporated herein by reference. Additional definitions and information about electrochemical fabrication methods may be found in a number of the various applications incorporated herein by reference just as for example, U.S. patent application Ser. No. 16/584,818, filed Sep. 26, 2019 and entitled "Probes Having Improved Mechanical and/or Electrical Properties for Making Contact Between Electronic Circuit Elements and Methods for Making".

"Longitudinal" as used herein refers to a long dimension of a probe, an end-to-end dimension of the probe, or a tip-to-tip dimension. Longitudinal may refer to a generally straight line that extends from one end of the probe to another end of the probe or it may refer to curved or stair-stepped path that has a sloped or even changing direction along a height of the probe. When referring to probe arrays, the longitudinal dimension may refer to a particular direction of the probes in the array but it may also simply refer to the overall height of the array that starts at a plane containing a first end, tip, or base of a plurality of probes and extends perpendicular thereto to a plane containing a second end, tip, or top of the probes. The context of use typically makes clear what is meant especially to those of skill in the art. It is intended that the interpretation to be applied to the term herein be as narrow as warranted by the details of the description provided or the context in which the term is used. If, however, no such narrow interpretation is warranted, it is intended that the broadest reasonable scope of interpretation apply.

"Lateral" as used herein is related to the term longitudinal. In terms of the stacking of layers, lateral typically refers to a direction within each layer, or two perpendicular directions within each layer. When referring to probe arrays, lateral generally refers to a direction or pair of perpendicular directions that are parallel to or generally co-planar with the planes formed by one set of probe ends or both sets of probe ends and thus is, or are, perpendicular to a longitudinal axis of the probe array. When referring to probes themselves, the lateral dimensions may be those that are perpendicular to an overall longitudinal axis of the probe, a local longitudinal axis of the probe (that is local lateral dimensions), or simply the dimensions similar to those noted for arrays or layers. The context of use typically makes clear what is meant especially to those of skill in the art. It is intended that the interpretation to be applied to the term herein be as narrow as warranted by the details of the description provided or the context in which the term is used. If no such narrow interpretation is warranted, it is intended that the broadest reasonable scope of interpretation apply.

"Build" as used herein refers, as a verb, to the process of building a desired structure (or part) or plurality of structures (or parts) from a plurality of applied or deposited materials which are stacked and adhered upon application or deposition or, as a noun, to the physical structure (or part) or structures (or parts) formed from such a process. Depending on the context in which the term is used, such physical structures may include a desired structure embedded within a sacrificial material or may include only desired physical structures which may be separated from one another or may require dicing and/or slicing to cause separation.

"Build axis" or "build orientation" is the axis or orientation that is substantially perpendicular to substantially planar levels of deposited or applied materials that are used in building up a structure. The planar levels of deposited or applied materials may be or may not be completely planar but are substantially so in that the overall extent of their cross-sectional dimensions are significantly greater than the height of any individual deposit or application of material (e.g., 100, 500, 1000, 5000, or more times greater). The planar nature of the deposited or applied materials may come about from use of a process that leads to planar deposits or it may result from a planarization process (e.g., a process that includes mechanical abrasion, e.g. lapping, fly cutting, grinding, or the like) that is used to remove material regions of excess height. Unless explicitly noted otherwise, "vertical" as used herein, when referring to fabrication, refers to the build axis or nominal build axis (if the layers are not stacking with perfect registration) while "horizontal" refers to a direction within the plane of the layers (i.e., the plane that is substantially perpendicular to the build axis). As used with respect to probes, vertical generally refers to a probe configuration that is generally longitudinally extended and laterally much smaller in dimension (e.g., resulting in a ratio of 50 to one or more) or refers to probe arrays that have where an end-to-end orientation of the probes are set within about 45 degrees of the longitudinal axis of the probe array.

"Build layer" or "layer of structure" as used herein does not refer to a deposit of a specific material but instead refers to a region of a build located between a lower boundary level and an upper boundary level which generally defines a single cross-section of a structure being formed or structures which are being formed in parallel. Depending on the details of the actual process used to form the structure, build layers are generally formed on and adhered to previously formed build layers. In some processes the boundaries between build layers are defined by planarization operations which result in successive build layers being formed on substantially planar upper surfaces of previously formed build layers. In some embodiments, the substantially planar upper surface of the preceding build layer may be textured to improve adhesion between the layers. In other build processes, openings may exist in or be formed in the upper surface of a previous but only partially formed build layers such that the openings in the previous build layers are filled with materials deposited in association with current build layers which will cause interlacing of build layers and material deposits. Such interlacing is described in U.S. patent application Ser. No. 10/434,519 now U.S. Pat. No. 7,252,861. This referenced application is incorporated herein by reference as if set forth in full. In most embodiments, a build layer includes at least one primary structural material and at least one primary sacrificial material. However, in some embodiments, two or more primary structural materials may be used without a primary sacrificial material (e.g. when one primary structural material is a dielectric and the other is a conductive material) while in others a build layer may contain only one or more sacrificial materials especially when such layers are directly or indirectly adhered to previously formed multi-material layers that contain structural materials and receive, directly or indirectly one or more layers than contain structural materials. In some embodiments, build layers are distinguishable from each other by the source of the data that is used to yield patterns of the deposits, applications, and/or etchings of material that form the respective build layers. For example, data descriptive of a structure to be formed which is derived from data extracted from different vertical levels of a data representation of the structure define different build layers of the structure. The vertical separation of successive pairs of such descriptive data may define the thickness of build layers associated with the data. As used herein, at times, "build layer" may be loosely referred simply as "layer". In many embodiments, deposition thickness of primary structural or sacrificial materials (i.e., the thickness of any particular material after it is deposited) is generally greater than the layer thickness and a net deposit thickness is set via one or more planarization processes which may include, for example, mechanical abrasion (e.g. lapping, fly cutting, polishing, and the like) and/or chemical etching (e.g. using selective or non-selective etchants). The lower boundary and upper boundary for a build layer may be set and defined in different ways. From a design point of view, they may be set based on a desired vertical resolution of the structure (which may vary with height). From a data manipulation point of view, the vertical layer boundaries may be defined as the vertical levels at which data descriptive of the structure is processed or the layer thickness may be defined as the height separating successive levels of cross-sectional data that dictate how the structure will be formed. From a fabrication point of view, depending on the exact fabrication process used, the upper and lower-layer boundaries may be defined in a variety of different ways. For example, by planarization levels or effective planarization levels (e.g., lapping levels, fly cutting levels, chemical mechanical polishing levels, mechanical polishing levels, vertical positions of structural and/or sacrificial materials after relatively uniform etch back following a mechanical or chemical mechanical planarization process). For example, by levels at which process steps or operations are repeated. At levels at which, at least theoretically, lateral extends of structural material can be changed to define new cross-sectional features of a structure.

"Layer thickness" is the height along the build axis between a lower boundary of a build layer and an upper boundary of that build layer.

"Planarization" is a process that tends to remove materials, above a desired plane, in a substantially non-selective manner such that all deposited materials are brought to a substantially common height or desired level (e.g., within 20%, 10%, 5%, or even 1% of a desired layer boundary level). For example, lapping removes material in a substantially non-selective manner though some amount of recession of one material or another may occur (e.g., copper may recess relative to nickel). Planarization may occur primarily via mechanical means, e.g., lapping, grinding, fly cutting, milling, sanding, abrasive polishing, frictionally induced melting, other machining operations, or the like (i.e. mechanical planarization). Mechanical planarization may be followed or preceded by thermally induced planarization (e.g., melting) or chemically induced planarization (e.g. etching). Planarization may occur primarily via a chemical and/or electrical means (e.g., chemical etching, electrochemical etching, or the like). Planarization may occur via a simultaneous combination of mechanical and chemical etching (e.g., chemical mechanical polishing (CMP)).

"Structural material" as used herein refers to a material that remains part of the structure when put into use.

"Supplemental structural material" as used herein refers to a material that forms part of the structure when the structure is put to use but is not added as part of the build layers but instead is added to a plurality of layers simultaneously (e.g. via one or more coating operations that applies the material, selectively or in a blanket fashion, to one or more surfaces of a desired build structure that has been released from a sacrificial material.

"Primary structural material" as used herein is a structural material that forms part of a given build layer and which is typically deposited or applied during the formation of that build layer and which makes up more than 20% of the structural material volume of the given build layer. In some embodiments, the primary structural material may be the same on each of a plurality of build layers or it may be different on different build layers. In some embodiments, a given primary structural material may be formed from two or more materials by the alloying or diffusion of two or more materials to form a single material. The structural material on a given layer may be a single primary structural material or may be multiple primary structural materials and may further include one or more secondary structural materials.

"Secondary structural material" as used herein is a structural material that forms part of a given build layer and is typically deposited or applied during the formation of the given build layer but is not a primary structural material as it individually accounts for only a small volume of the structural material associated with the given layer. A secondary structural material will account for less than 20% of the volume of the structural material associated with the given layer. In some preferred embodiments, each secondary structural material may account for less than 10%, 5%, or even 2% of the volume of the structural material associated with the given layer. Examples of secondary structural materials may include seed layer materials, adhesion layer materials, barrier layer materials (e.g., diffusion barrier material), and the like. These secondary structural materials are typically applied to form coatings having thicknesses less than 2 microns, 1 micron, 0.5 microns, or even 0.2 microns. The coatings may be applied in a conformal or directional manner (e.g., via CVD, PVD, electroless deposition, or the like). Such coatings may be applied in a blanket manner or in a selective manner. Such coatings may be applied in a planar manner (e.g., over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Functional structural material" as used herein is a structural material that would have been removed as a sacrificial material but for its actual or effective encapsulation by other structural materials. Effective encapsulation refers, for example, to the inability of an etchant to attack the functional structural material due to inaccessibility that results from a very small area of exposure and/or due to an elongated or tortuous exposure path. For example, large (10,000 $\mu m^2$) but thin (e.g., less than 0.5 microns) regions of sacrificial copper sandwiched between deposits of nickel may define regions of functional structural material depending on ability of a release etchant to remove the sandwiched copper.

"Sacrificial material" is material that forms part of a build layer but is not a structural material. Sacrificial material on a given build layer is separated from structural material on that build layer after formation of that build layer is completed and more generally is removed from a plurality of layers after completion of the formation of the plurality of layers during a "release" process that removes the bulk of the sacrificial material or materials. In general, sacrificial material is located on a build layer during the formation of one, two, or more subsequent build layers and is thereafter removed in a manner that does not lead to a planarized surface. Materials that are applied primarily for masking purposes, i.e., to allow subsequent selective deposition or etching of a material, e.g. photoresist that is used in forming a build layer but does not form part of the build layer) or that exist as part of a build for less than one or two complete build layer formation cycles are not considered sacrificial materials as the term is used herein but instead shall be referred as masking materials or as temporary materials. These separation processes are sometimes referred to as a release process and may or may not involve the separation of structural material from a build substrate. In many embodiments, sacrificial material within a given build layer is not removed until all build layers making up the three-dimensional structure have been formed. Sacrificial material may be, and typically is, removed from above the upper level of a current build layer during planarization operations during the formation of the current build layer. Sacrificial material is typically removed via a chemical etching operation but in some embodiments may be removed via a melting operation or electrochemical etching operation. In typical structures, the removal of the sacrificial material (i.e., release of the structural material from the sacrificial material) does not result in planarized surfaces but instead results in surfaces that are dictated by the boundaries of structural materials located on each build layer. Sacrificial materials are typically distinct from structural materials by having different properties therefrom (e.g., chemical etchability, hardness, melting point, etc.) but in some cases, as noted previously, what would have been a sacrificial material may become a structural material by its actual or effective encapsulation by other structural materials. Similarly, structural materials may be used to form sacrificial structures that are separated from a desired structure during a release process via the sacrificial structures being only attached to sacrificial material or potentially by dissolution of the sacrificial structures themselves using a process that is insufficient to reach structural material that is intended to form part of a desired structure. It should be understood that in some embodiments, small amounts of structural material may be removed, after or during release of sacrificial material. Such small amounts of structural material may have been inadvertently formed due to imperfections in the fabrication process or may result from the proper application of the process but may result in features that are less than optimal (e.g., layers with stairs steps in regions where smooth sloped surfaces are desired. In such cases the volume of structural material removed is typically minuscule compared to the amount that is retained and thus such removal is ignored when labeling materials as sacrificial or structural. Sacrificial materials are typically removed by a dissolution process, or the like, that destroys the geometric configuration of the sacrificial material as it existed on the build layers. In many embodiments, the sacrificial material is a conductive material such as a metal. As will be discussed hereafter, masking materials though typically sacrificial in nature are not termed sacrificial materials herein unless they meet the required definition of sacrificial material.

"Supplemental sacrificial material" as used herein refers to a material that does not form part of the structure when the structure is put to use and is not added as part of the build layers but instead is added to a plurality of layers simultaneously (e.g. via one or more coating operations that applies the material, selectively or in a blanket fashion, to a one or more surfaces of a desired build structure that has been released from an initial sacrificial material. This supplemental sacrificial material will remain in place for a period of time and/or during the performance of certain post layer formation operations, e.g., to protect the structure that was released from a primary sacrificial material but will be removed prior to putting the structure to use.

"Primary sacrificial material" as used herein is a sacrificial material that is located on a given build layer and which is typically deposited or applied during the formation of that build layer and which makes up more than 20% of the sacrificial material volume of the given build layer. In some embodiments, the primary sacrificial material may be the same on each of a plurality of build layers or may be different on different build layers. In some embodiments, a given primary sacrificial material may be formed from two or more materials by the alloying or diffusion of two or more materials to form a single material. The sacrificial material on a given layer may be a single primary sacrificial material or may be multiple primary sacrificial materials and may further include one or more secondary sacrificial materials.

"Secondary sacrificial material" as used herein is a sacrificial material that is located on a given build layer and is typically deposited or applied during the formation of the build layer but is not a primary sacrificial material as it individually accounts for only a small volume of the sacrificial material associated with the given layer. A secondary sacrificial material will account for less than 20% of the volume of the sacrificial material associated with the given layer. In some preferred embodiments, each secondary sacrificial material may account for less than 10%, 5%, or even 2% of the volume of the sacrificial material associated with the given layer. Examples of secondary structural materials may include seed layer materials, adhesion layer materials, barrier layer materials (e.g., diffusion barrier material), and the like. These secondary sacrificial materials are typically applied to form coatings having thicknesses less than 2 microns, 1 micron, 0.5 microns, or even 0.2 microns). The coatings may be applied in a conformal or directional manner (e.g., via CVD, PVD, electroless deposition, or the like). Such coatings may be applied in a blanket manner or in a selective manner. Such coatings may be applied in a planar manner (e.g., over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Adhesion layer", "seed layer", "barrier layer", and the like refer to coatings of material that are thin in comparison to the layer thickness and thus generally form secondary structural material portions or sacrificial material portions of some layers. Such coatings may be applied uniformly over a previously formed build layer, they may be applied over a portion of a previously formed build layer and over patterned structural or sacrificial material existing on a current (i.e., partially formed) build layer so that a non-planar seed layer results, or they may be selectively applied to only certain locations on a previously formed build layer. In the event such coatings are non-selectively applied, selected portions may be removed (1) prior to depositing either a sacrificial material or structural material as part of a current layer or (2) prior to beginning formation of the next layer or they may remain in place through the layer build up process and then etched away after formation of a plurality of build layers.

"Masking material" is a material that may be used as a tool in the process of forming a build layer but generally does not form part of that build layer. Masking material is typically a photopolymer or photoresist material or other material that may be readily patterned. Masking material is typically a dielectric. Masking material, though typically sacrificial in nature, is not generally a sacrificial material as used herein unless if forms part of a completed layer and generally has one or more subsequent layer formed thereon. Masking material is typically applied to a surface during the formation of a build layer for the purpose of allowing selective deposition, etching, or other treatment and is removed either during the process of forming that build layer or immediately after the formation of that build layer.

"Multilayer structures" are structures formed from multiple build layers of deposited or applied materials.

"Multilayer three-dimensional (or 3D or 3-D) structures" are Multilayer Structures that meet at least one of two criteria: (1) the structural material portion of at least two layers of which one has structural material portions that do not overlap structural material portions of the other.

"Complex multilayer three-dimensional (or 3D or 3-D) structures" are multilayer three-dimensional structures formed from at least three layers where a line may be defined that hypothetically extends vertically through at least some portion of the build layers of the structure will extend from structural material through sacrificial material and back through structural material or will extend from sacrificial material through structural material and back through sacrificial material (these might be termed vertically complex multilayer three-dimensional structures). Alternatively, complex multilayer three-dimensional structures may be defined as multilayer three-dimensional structures formed from at least two layers where a line may be defined that hypothetically extends horizontally through at least some portion of a build layer of the structure that will extend from structural material through sacrificial material and back through structural material or will extend from sacrificial material through structural material and back through sacrificial material (these might be termed horizontally complex multilayer three-dimensional structures). Worded another way, in complex multilayer three-dimensional structures, a vertically or horizontally extending hypothetical line will extend from one or structural material or void (when the sacrificial material is removed) to the other of void or structural material and then back to structural material or void as the line is traversed along at least a portion of the line.

"Moderately complex multilayer three-dimensional (or 3D or 3-D) structures are complex multilayer 3D structures for which the alternating of void and structure or structure and void not only exists along one of a vertically or horizontally extending line but along lines extending both vertically and horizontally.

"Highly complex multilayer (or 3D or 3-D) structures are complex multilayer 3D structures for which the structure-to-void-to-structure or void-to-structure-to-void alternating occurs once along the line but occurs a plurality of times along a definable horizontally or vertically extending line.

"Up-facing feature" is an element dictated by the cross-sectional data for a given build layer "n" and a next build layer "n+1" that is to be formed from a given material that exists on the build layer "n" but does not exist on the immediately succeeding build layer "n+1". For convenience, the term "up-facing feature" will apply to such features regardless of the build orientation.

"Down-facing feature" is an element dictated by the cross-sectional data for a given build layer "n" and a preceding build layer "n−1" that is to be formed from a given material that exists on build layer "n" but does not exist on the immediately preceding build layer "n−1". As with up-facing features, the term "down-facing feature" shall apply to such features regardless of the actual build orientation.

"Continuing region" is the portion of a given build layer "n" that is dictated by the cross-sectional data for the given build layer "n", a next build layer "n+1" and a preceding build layer "n-1" that is neither up-facing nor down-facing for the build layer "n".

"Minimum feature size" or "MFS" refers to a necessary or desirable spacing between structural material elements on a given layer that are to remain distinct in the final device configuration. If the minimum feature size is not maintained for structural material elements on a given layer, the fabrication process may result in structural material inadvertently bridging what were intended to be two distinct elements (e.g., due to masking material failure or failure to appropriately fill voids with sacrificial material during formation of the given layer such that during formation of a subsequent layer structural material inadvertently fills the void). More care during fabrication can lead to a reduction in minimum feature size. Alternatively, a willingness to accept greater losses in productivity (i.e., lower yields) can result in a decrease in the minimum feature size. However, during fabrication for a given set of process parameters, inspection diligence, and yield (successful level of production) a minimum design feature size is set in one way or another. The above-described minimum feature size may more appropriately be termed minimum feature size of gaps or voids (e.g. the MFS for sacrificial material regions when sacrificial material is deposited first). Conversely a minimum feature size for structure material regions (minimum width or length of structural material elements) may be specified. Depending on the fabrication method and order of deposition of structural material and sacrificial material, the two types of minimum feature sizes may be the same or different. In practice, for example, using electrochemical fabrication methods as described herein, the minimum features size on a given layer may be roughly set to a value that approximates the layer thickness used to form the layer and it may be considered the same for both structural and sacrificial material widths. In some more rigorously implemented processes (e.g., with higher examination regiments and tolerance for rework), it may be set to an amount that is 80%, 50%, or even 30% of the layer thickness. Other values or methods of setting minimum feature sizes may be used. Worded another way, depending on the geometry of a structure, or plurality of structures, being formed, the structure, or structures, may include elements (e.g. solid regions) which have dimensions smaller than a first minimum feature size and/or have spacings, voids, openings, or gaps (e.g. hollow or empty regions) located between elements, where the spacings are smaller than a second minimum feature size where the first and second minimum feature sizes may be the same or different and where the minimum feature sizes represent lower limits at which formation of elements and/or spacing can be reliably formed. Reliable formation refers to the ability to accurately form or produce a given geometry of an element, or of the spacing between elements, using a given formation process, with a minimum acceptable yield. The minimum acceptable yield may depend on a number of factors including: (1) number of features present per layer, (2) numbers of layers, (3) the criticality of the successful formation of each feature, (4) the number and severity of other factors effecting overall yield, and (5) the desired or required overall yield for the structures or devices themselves. In some circumstances, the minimum size may be determined by a yield requirement per feature which is as low as 70%, 60%, or even 50%. While in other circumstances the yield requirement per feature may be as high as 90%, 95%, 99%, or even higher. In some circumstances (e.g., in producing a filter element) the failure to produce a certain number of desired features (e.g. 20-40% failure may be acceptable while in an electrostatic actuator the failure to produce a single small space between two moveable electrodes may result in failure of the entire device. The MFS, for example, may be defined as the minimum width of a narrow and processing element (e.g., photoresist element or sacrificial material element) or structural element (e.g. structural material element) that may be reliably formed (e.g. 90-99.9 times out of 100) which is either independent of any wider structures or has a substantial independent length (e.g. 200-1000 microns) before connecting to a wider region.

"Proud", is used herein to describe a first feature or surface in relationship to a second feature, or surface wherein the first feature or surface is protruding, raised, or projecting from, or relative to, the second surface or feature.

Probes, Probe Arrays, and Methods of Making:

Some embodiments of the invention are directed to probe arrays that include at least some probes and possibly other alignment structures that permanently include, or temporarily included, affixed contact spacers (affixed to a single probe, integrated into a temporary linear array or combination subarray or affixed to another alignment structure and directly or indirectly contactable with one or more other probes, temporary array units, or other alignment structures) that allow (or allowed for) precise contact positioning of probes or alignment structures during probe array formation or movement of probes relative to neighboring probes during probe array usage. In some embodiments, spacing between some probes (e.g. probes formed on their sides as a linear subarray with probe tips spaced by a desired array spacing or possibly as a number of linear subarrays temporarily combined to form two-dimensional subarrays with a desired face-to-face spacing from small number of layers (e.g. 2-15 layers) with individual linear subarrays separated from others by gaps in position or by one or more layers containing sacrificial material and possibly selected regions of one or more spacer materials. In such linear arrays or combined subarrays, probe spacing may be set by sacrificial material used in the formation process which is retained after formation for assembly (e.g., stacking) of separate linear arrays or combined subarrays. One or more outer surfaces of the subarrays or combined subarrays may include spacer material for directly or indirectly engaging probes or alignment structures associated with other subarrays or combined subarrays during assembly of the plurality of subarrays or combined subarrays into final arrays. In these embodiments, spacer material may serve one or more of a number of purposes:

(1) Temporary spacing between two adjacent probes, between other alignment structures, or between a probe and non-probe alignment structure that sets a distance between the adjacent probes or other alignment structures via direct or indirect contact (e.g. a dielectric spacer, a spacer formed from multiple dielectrics, a conductive spacer, a spacer formed from multiple conductive materials, or a combination of these may be used) where the spacer may be retained, partially removed, or fully removed prior to putting the array to use depending on the relationship between the geometries of the probes, the material the spacer is formed from, the location of the spacer, and the interference in movement that it may cause during array usage;

(2) Temporary alignment of two probes or other alignment structures in a lateral direction that is perpendicular to a line connecting the two probes or other alignment structures with or without also providing distance spacing;

(3) Temporary alignment of two probes along longitudinal axes of the probes (e.g., alignment of tip or base heights) with or without also providing lateral perpendicular alignment or distance spacing as set forth in (1) and (2);

(4) The function of any of (1)-(3) or one or more of (1)-(3) applied multiple times between one probe and another probe, one probe and one alignment structure, and/or one alignment structure and another alignment structure (e.g., applied longitudinally near both the top and bottom of a pair of probe structures);

(5) Multiple functions of (1)-(3) applied between one probe and another probe, one probe and one alignment structure, and/or one alignment structure and another alignment structure;

(6) One or more of the functions of (1)-(3) as applied between one probe or other alignment structure and one or more other probes or alignment structures;

(7) Different ones of the functions of (1)-(3) as applied between one probe and a plurality of other probes or alignment structures or as applied between one alignment structure and a plurality of probes and other alignment structures;

(8) A dielectric barrier function to inhibit electrical contact between two adjacent probes prior to and/or during elastic deflection (e.g., the barrier may take the form of a dielectric spacer, a spacer formed from multiple dielectrics, a spacer formed from one dielectric and a conductive material, or the dielectric residual portion of a multi-material spacer that also provided positioning during array assembly prior to removal of a sacrificial portion of the spacer);

(9) A permanent conductive contact located between two adjacent probes and providing electrical contact between the probes prior to and/or during elastic deflection (e.g., the contact may take the form of a conductive spacer or a conductive residual portion of a multi-material spacer that also provided positioning during array assembly prior to removal of a sacrificial portion of the spacer); and/or

(10) A combination of the functions of (1)-(9).

In some variations, the contact spacers may be used to provide for one or more of:

(1) precise spacing of one probe or alignment structure relative to an adjacent probe or alignment structure (e.g., within +/−5 microns of a target position, more preferably within +/−2 microns, and most preferably within +/−1 micron, or less) during array formation, (2) precise alignment of one probe or alignment structure relative to an adjacent probe or alignment structure in a direction with a perpendicular component to a line of contact between the first probe or alignment structure and the second probe or alignment structure (e.g., within +/−5 microns of a target position, more preferably within +/−2 microns, and most preferably within +/−1 micron, or less) during array formation, (3) precise height positioning of one probe tip relative to the height of an adjacent probe tip (e.g., within +/−5 microns of a target position, more preferably within +/−2 microns, and most preferably within +/−1 micron, or less) during array formation.

In some embodiments, relatively small errors in spacing can accumulate to unacceptable levels as the number of spacing engagements increase. Generally, lateral positioning of parts across a build substrate (e.g., of several inches or more), or the buildup of thickness in a layer stacking direction (e.g. tens to hundreds of microns or even a number of millimeters) results in little significant positioning or thickness errors. However, since builds typically have thickness that are 10-1000 times smaller than lateral dimensions, if spacers are used to provide positioning relative to the stacking direction of layers, due to potentially much larger number of spacer interfaces, accumulated errors can become significant and thus additional methods for maintaining reasonable error tolerances are needed particularly when stacking in the direction of layer build up. In different alternative embodiments, error tolerance may be managed in different ways, for example:

(1) By precisely knowing the thickness of individual layer groups prior to assembly, and/or measuring stacking height or thickness after assembly, an accumulated error can be determined, thus enabling selection of a next layer group to aid in minimizing or even reversing the accumulated error. A next group to add to the stack could be selected to compensate at least in part for the accumulated error based on its own thickness relative to its intended target thickness. In other words, stacking could occur with build groups that are slightly above or below nominal so that any net accumulated error remains near zero or at least within an acceptable tolerance (e.g., +/−2 microns or less, +/−5 microns, +/−10 microns, or perhaps as high as +/−20 microns or more);

(2) By ensuring that each layer group that is to be added to a stack is formed slightly undersized, such that the periodic insertion of one or more thin shims (e.g., 1-10 microns in thickness) may occur to ensure that probe locations are always within a reasonable tolerance of their target positions and to ensure that accumulated errors between successive layer groups remain within a required tolerance; and/or (3) By providing linear arrays or combined subarrays with probes having their longitudinal extents lying within the plane or planes of the layers (e.g. in the Z-direction) and with their tips providing array extension along one lateral axis of the plane or planes of build layers (e.g. the Y axis) and extended alignment structures with configurations intended to engage the ends or other portions of the linear arrays or combined subarrays when stacked face-to-face during assembly of full arrays such that local alignment and positioning is provided by contact between linear arrays or combined subarrays but with periodic adjustments due to engagement of groups of such linear arrays or combined arrays to high precision engagement features on extended alignment structures that are positioned at an angle (e.g. perpendicular) to orientation of the linear axes of the linear arrays as well as the longitudinal extends of the probes. Such extended alignment structures may be formed from a permanent structural material that remains in place or is removed from the arrays once formed or they may be formed from a sacrificial material that is removed after array assembly (e.g., after bonding to an array substrate and/or securing of probes by guide plates). In some embodiments, such alignment structures may be formed with their longitudinal dimensions within the plane of one or more formation layers as may be the probes themselves but where the orientation of the alignment structures and probes are relatively rotated (e.g. to perpendicular orientations when array assembly occurs thus allowing the fabrication spacing to control spacing of alignment structure features as well as to control probe-to-probe spacing when alignment using the alignment structure occurs. In some embodiments, alignment structures may be made from multiple slidable elements such that gaps or alignment structures are wide enough or narrow enough to allow easy probe loading into gaps or around protrusions with some tolerance but where after loading, multiple (e.g. at least two but possibly three or more elements) undergo relative movement (e.g. along planes of alignment structure formation) that provides for narrowing of gaps (e.g. narrowing of spacing between two or more protruding features on two or more alignment elements) or effective expansion of protruding features relatively narrow protruding features on two or more elements by relative sliding causing increased misalignment of originally aligned features) such that tighter position tolerance or even gripping or holding of probes or other alignment structures regions occurs thus providing, at least temporarily, one or more of enhanced probe positioning or enhanced retention of probes.

In some embodiments, the probes are formed, along with their affixed spacers (whether of the permanent type, sacrificial type, or a combined type) using, at least in part, multi-layer, multi-material electrochemical fabrication methods as described herein and/or as incorporated herein by reference. In some formation embodiments, the probes are formed on their sides with overall thickness of the layers formed in making probes being relatively small such that probe length (longitudinal dimension) to cross-sectional dimension (lateral dimension) has a ratio of 10, or less, to 200, or more. In some embodiments, a spacer or spacers may be formed as part of a same layer or layers that form the body of the probe while in other embodiments, the spacer or spacers may be formed as part of one or more layers that are different from the layer or layers used to form the body of the probe. In some embodiments, some layers may be limited to single material layers (e.g., sacrificial material) or two materials with neither being a permanent structural material (e.g. a first sacrificial material and a second sacrificial material).

In some embodiments, in addition to the use of spacers to provide permanent or temporary spacing of probe elements during array assembly or usage, a primary sacrificial material or other structures may be used in providing some spacing or connection between probes. In this regard, a primary sacrificial material may be a material that is used during the formation of structures using a multi-material, multi-layer electrochemical fabrication process to provide a fill material between regions of structural material on each layer being formed. The sacrificial material, in many circumstances, may also provide a conductive plating base on which a next layer may be formed, though in some cases, seed layers, barrier layers, or other relatively thin layers (e.g., 5-10, or even 100 times thinner) may be formed over dielectric material to form plating bases for subsequent electrodeposition.

In some embodiments, spacer contact may be made with other spacers, spacer contact may be made with a body of an adjacent probe, and in still other embodiments, a spacer may make contact with a spacer of another probe and the body of that other probe. In some embodiments, spacer contact involving two probes may provide for spacing of one or more probes that are in line with, adjacent to, or otherwise connected (e.g., via intact sacrificial material) to the probes directly involved in making spacer-based contact. In other embodiments, other alternative alignment structures (e.g., spacers not adhered to probes) may exist that make spacer-based contact in place of, or in addition to, probes making such contact.

Spacer material is generally different from the conductive structural materials of the probes and the sacrificial material as may be used during a probe fabrication process. However, in some embodiments, spacer material may include a sacrificial material that is a second type of sacrificial material used in forming probes particularly when selected groups of probes (e.g. linear arrays or combination subarrays) are to be held together by a second type of sacrificial material while individual groups are to be separated one from another by removal of a first sacrificial material. In such cases, removal of the second sacrificial material would remove that portion of the spacers formed from the second sacrificial material while removing it from other portions of the build. Similarly, spacers may include one of the conductive structural materials or materials of the probe when, for example, the spacer is intended to make electrical contact with neighboring probes or the conductive material is simply acting as a supplemental part of the spacer that will be separated upon removal of an intermediate sacrificial spacer material. Spacers will often only connect to one of the probes being formed and will remain in place after the removal of at least a first sacrificial material and may be retained or removed subsequent to the removal of the first sacrificial material and after performance of one or more spacing operations that make use of that spacer material. Often the spacer material is a dielectric material but, in some cases, may be, or may include, a conductive material especially when that conductive material does not extend between the adjacent probes or when the spacer is removed prior to putting a probe array to use. In some embodiments, the spacers will provide a dielectric barrier between two probes, during array usage. When used as a dielectric barrier, the spacer may normally not contact an adjacent probe except possibly during elastic deflection of the probes and particularly when the deflection risks shorting of two adjacent probes together. In other embodiments, where physical configuration of the probes still allows some amount of independent movement of the probe tips, contact between the spacer and the adjacent probe may regularly exist (e.g. when regions of the probes in contact via the spacer move up and down vertically such that the probes can slide relative to one another).

During formation of probes and/or assembly of probes, probe groups will generally have probe tips located in a plane for contacting pads or bumps on an electronic device or substrate; however, in some implementations, deviations from this general practice may occur (e.g. when probes are intended to contact different semiconductor devices that have their surfaces held in different contact planes). In some arrays, individual probes may extend perpendicular to a contact surface, a mounting surface, guide plate planes, or they may have curved, bent, or angled configurations running from a mounting surface to a guide plate or to a contact surface or running between two or more guide plates. In some embodiments, probes may take on different shapes for various reasons including, for example: (1) the shapes they are formed with, (2) an orientation set upon initial mounting to a substrate, (3) relative lateral movement of a substrate and one or more guide plates, (4) relative lateral movement between two or more guide plates that hold the probes, and (5) loading contact with a first electronic device or a first set of electronic devices and/or a second electronic device or set of electronic devices. In some testing setups, contact surfaces or sets of electronic devices may require probe arrays that include probes that have not only different but parallel planes of contact but also planes of different contact orientations which may be accommodated by different assembly methods and/or spacer/alignment structure configurations. It is intended that all such variations fall within the scope of the teachings set forth herein unless specifically excluded by specific teachings.

FIGS. 2A-2F provide six views of a probe, or probe preform 200 (hereafter simply referred to as a "probe" unless the context requires distinguishing between a preliminary probe structure, i.e. probe preform, that is used in array formation, and a finalized probe that forms part of an array as the array is to be put to use) according to a first embodiment of the invention wherein the probe is a straight pin (e.g. formed from two layers) with the probe body 201 formed on one layer and a spacer 231 located on another layer. FIG. 2A provides an isometric view of the probe. FIG. 2B provides a view looking down on the probe from above the layer planes. FIG. 2C provides a view of the probe looking up from the bottom. FIGS. 2D and 2E provide side views from opposite sides. FIG. 2F provides an end view of the probe. In other embodiments, a similar probe may be formed from a single layer with both the probe body material and the spacer material forming part of a single layer wherein images of such a probe would look like those shown in FIGS. 2A-2F but with the probe rotated about its longitudinal axis by 90 degrees relative to the position of the probe shown in FIGS. 2A-2F. In such alternative embodiments, the spacers would be formed in the plane of the probes which in turn would provide a different relationship between the spacer and adjacent probes that might be formed along with the single probe that is shown especially when the probes that are formed together might be part of a linear array which may be used in assembling a full two-dimensional array. Such alternatives might have the spacers that do not contact adjacent probes but instead use retained sacrificial material as a spacing element while the spacers could function as motion limiters in a finalized probe array.

In other alternative embodiments, the probe body may be formed from multiple layers and the spacer may also be formed from multiple layers, e.g. from the same layers or a subset of those layers, one or more of those layers in combination with one or more different layers, or just from one or more different layers, but at least in part from a different material. In some embodiments, (e.g. embodiments where the spacer will remain in place while the probe is in use) the spacer may be formed, in whole or in part, from a dielectric material that provides for electric isolation of adjacent probes when required while in other embodiments (e.g. embodiments where the spacer will be removed in whole or in part prior to probe usage), the spacer may be formed from any material or combination of materials including a conductive metal with the primary requirement being the separability of the spacer, or part of the spacer, from the probe.

In still other embodiments, the space and probe features may not sit flush against one another but the spacer material might include some portion of probe material embedded or even interlocked therein or the probe material may include some embedded or even interlocked spacer material to probe enhanced stability or durability of the connection between the features.

FIGS. 3A-3D illustrate four different relationship configurations for a plurality of probes of the type shown in FIGS. 2A-2F. FIG. 3A provides an example isometric view of three linear arrays 311 (exemplified with four probes 300 each) as formed together on a substrate 321 with a release layer 322 between the substrate and the probes, with a sacrificial material 323 between the probes, and with the spacers 331 formed above the probe bodies 301. FIG. 3B provides an isometric illustration of one of the linear arrays that has been released from the substrate and separated from surrounding sacrificial material but wherein at least a portion of the intervening sacrificial material between the probes is retained to hold them in registration with one another (along the Y-direction). FIG. 3C provides an isometric view of three such arrays aligned face-to-face but separated from one another (along the X-direction). FIG. 3D provides an isometric view of the three linear arrays after being brought into a desired array configuration (along the X-direction) by a distance set by spacer contact and by the spacing along the Y-direction set by retained sacrificial material located between the probes. Numerous other variations of this example are possible and include for example: (1) each linear array being formed with fewer or with more probes; (2) each linear array having probes that may or may not align with probes in adjacent arrays during assembly; (3) some probes from otherwise uniform linear arrays may be missing; (4) different probe configurations may be used within a single linear array or within an assembled two-dimensional array; (5) instead of a single group of linear arrays forming an entire two-dimensional array, groups of multiple linear arrays may be stacked on one another (along the X-direction or Y-direction) to form combined subarrays where such combined subarrays may be assembled with one another to form wider and/or longer two-dimensional arrays; (6) probes may be formed with tip structures on one or both ends; (7) probes may be formed with a bonding material (e.g. solder), a bonding promoter on or near one end, or even a masking material to inhibit the spread of a bonding material (e.g. solder) to avoid bridging of the bonding material between two adjacent probes when the probes are to be bonded to a permanent substrate (e.g. a space transformer or interposer substrate); (8) probes, linear arrays, or combination subarrays may be formed with additional or alternative spacer configurations, e.g., (a) a spacer or spacers near the middle of the probe, (b) spacers on multiple sides of a probe, linear array, or combination subarray, to provide not only X-direction spacing but Y-direction and/or even Z-direction spacing or alignment of the probes, stacked linear arrays, or stacked combination subarrays, (c) spacers or alignment structures engaging any other mixture of stacking arrangements of probes, linear arrays, combination subarrays of interest, or (d) spacers and/or other alignment structures with special configurations to lock with other spacers, alignment structures, or probes in multiple directions; and (9) spacers or alignment structures configured to provide for engagement of probes, linear arrays, or combination arrays with other than a fixed and uniform X & Y grid pattern but of a different pattern, e.g. a checkerboard array pattern with only half the cells having probes centered therein, a hexagonal array pattern with probes located at center points or at vertices, a triangular array pattern with probes located at center points or at vertices, or any other uniform or non-uniform pattern appropriate for probes to engage pads of a single DUT or of a plurality of DUTS when performing simultaneous multi-DUT tests or at least simultaneous landings on multiple DUTS.

FIGS. 4A-4D each provide views of the array 312 of FIG. 3D (relabeled as 412), along the Y-direction and the X-direction in different states of formation associated with attaching the linear arrays and the overall array 412 to an array substrate 426 that is provided with an array bonding material 427 (e.g., solder). FIG. 4A shows the 3×4 array along the Y-axis (left figure) and along the −X-axis (right figure) while aligned with, spaced from, and not yet bonded to an array substrate. FIG. 4B shows the 3×4 array along the Y-axis (left figure) and along the −X-axis (right figure) after bonding to the substrate wherein spacing is still set by the spacers and intervening sacrificial material 423. FIG. 4C shows the 3×4 array along the Y-axis (left figure) and along the −X-axis (right figure) after removal of the sacrificial material (previously viewable in the right-hand illustration of FIGS. 4A and 4B). FIG. 4D shows the optional state of the process along the Y-axis (left figure) and along the −X-axis (right figure) after the spacer material is removed which may or may not be required to allow the individual probes to elastically compress (e.g., via bending and/or buckling) independently of one another.

Figures 5A, 5B:
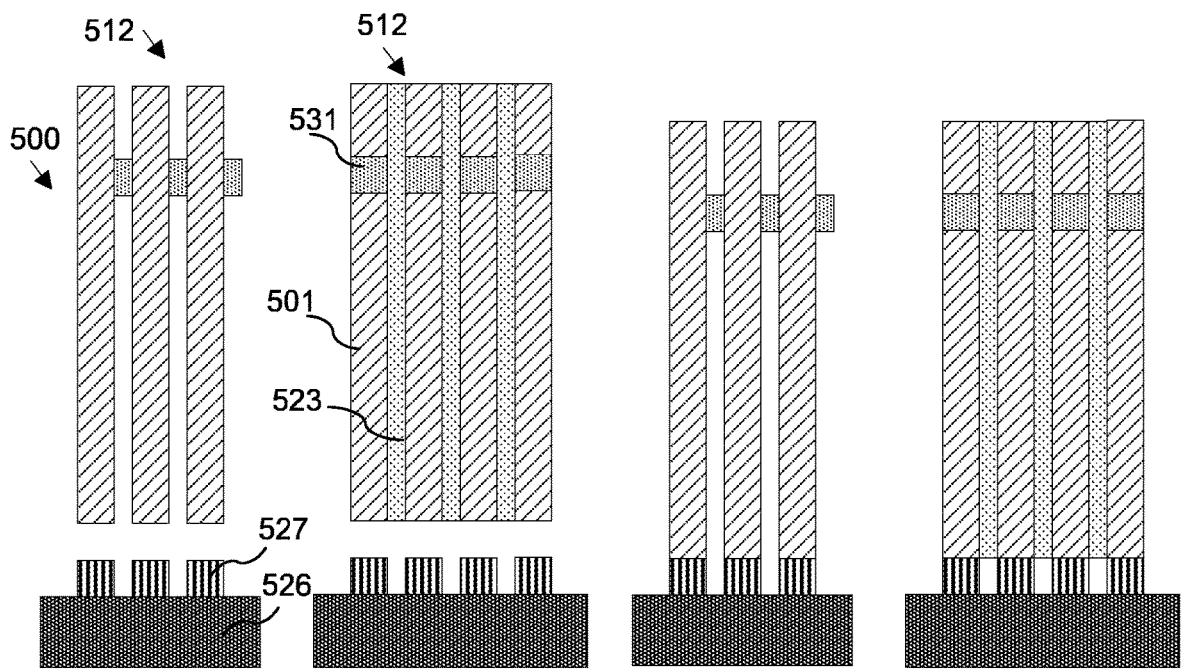
FIGS. 5A-5H, like FIGS. 4A-4D, provide additional views of the array of FIG. 3D with each figure providing a view along the Y-direction (to provide X-Z visible features) and the X-direction (to provide Y-Z visible features) associated with a different state in the assembly of a probe array including bonding to a substrate and installing a guide plate.
Figures 5C, 5D:
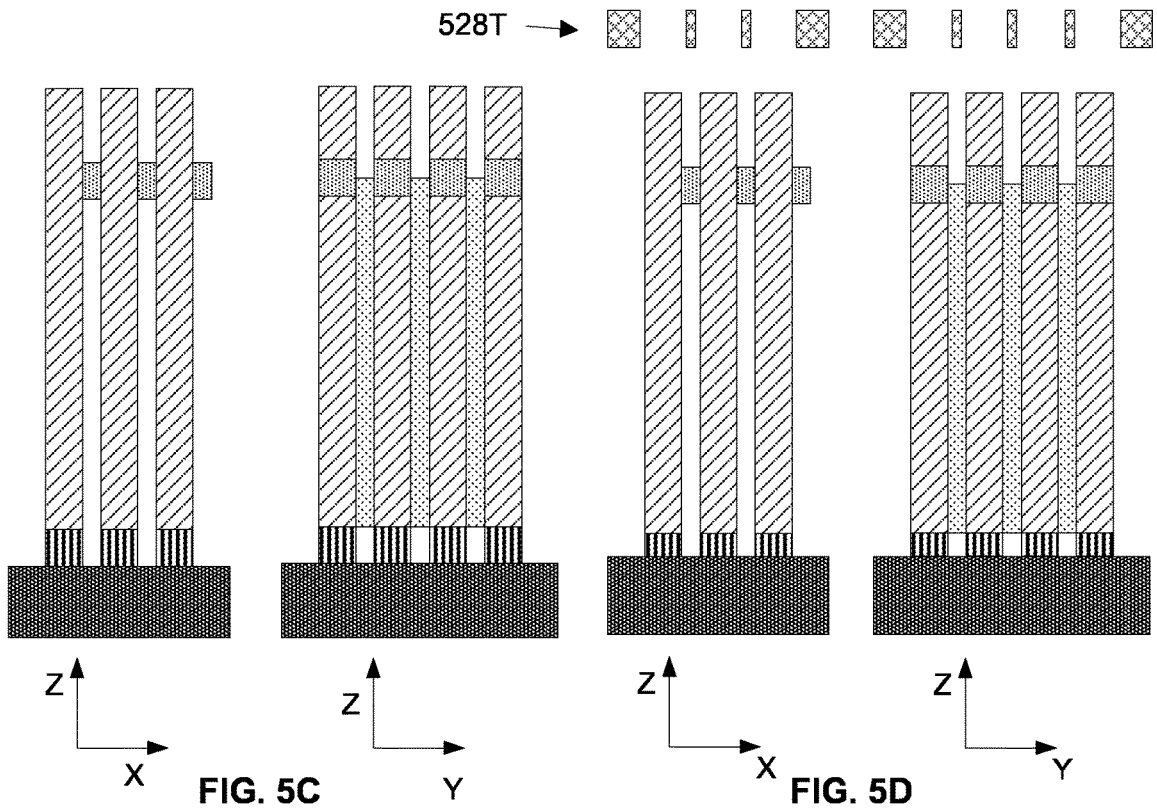
Figures 5E, 5F:
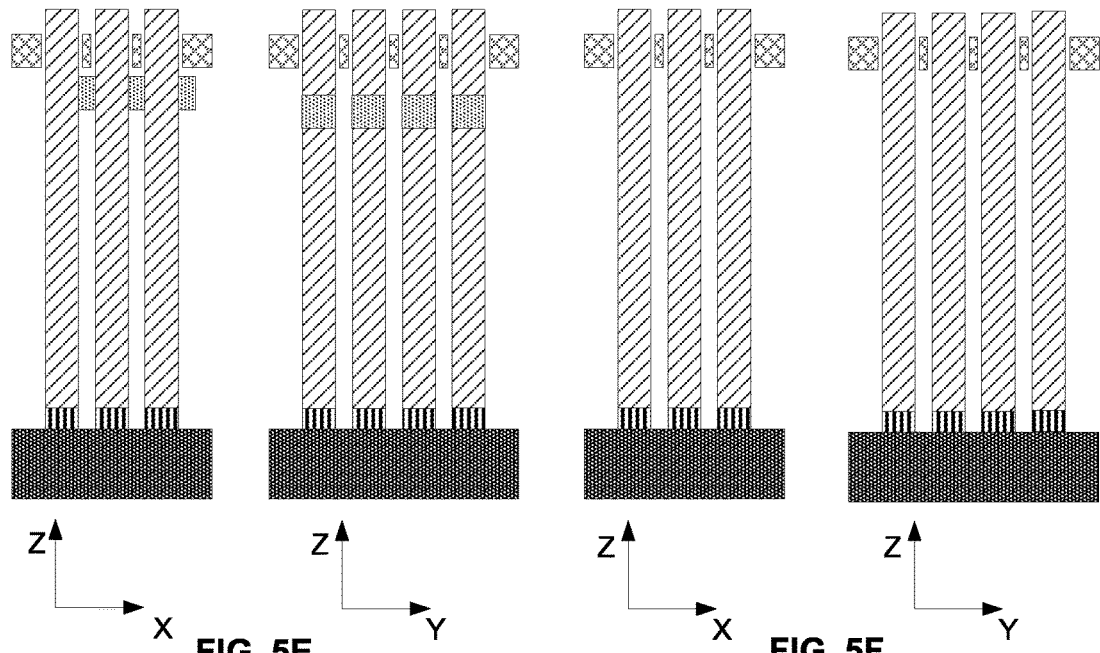
Figures 5G, 5H:
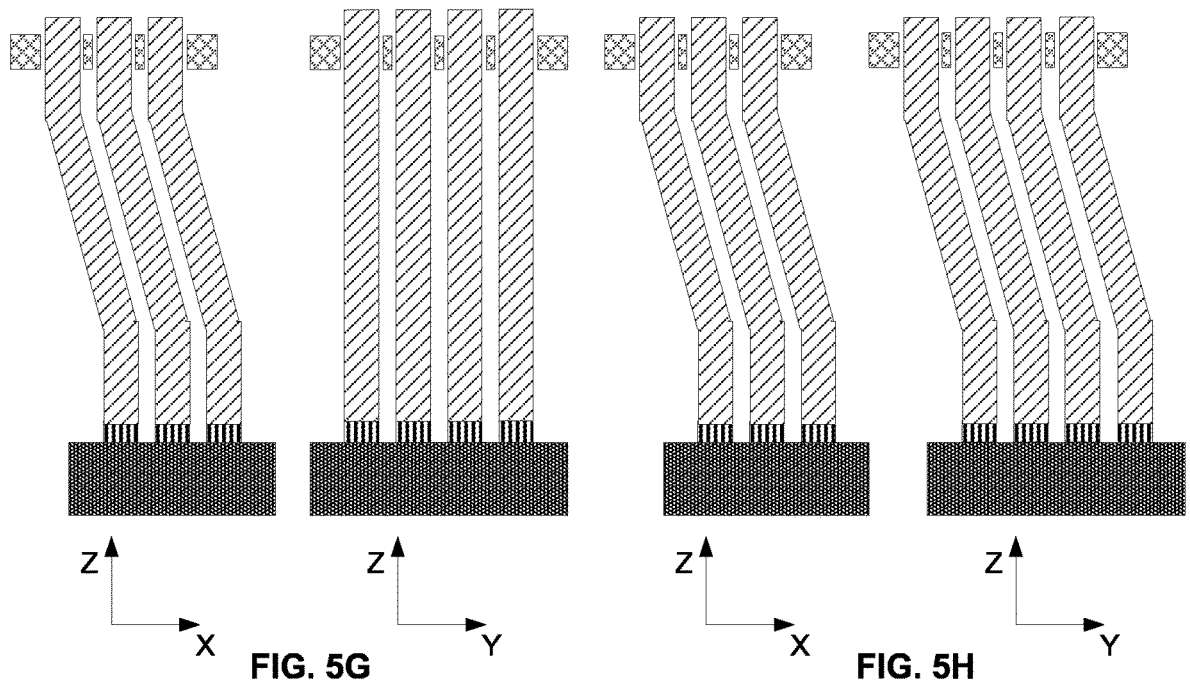

FIGS. 5A-5H, like FIGS. 4A-4D, provide additional views of the array 312 of FIG. 3D (relabeled as 512) with each figure providing a view along the Y-direction (to provide X-Z visible features) and the X-direction (to provide Y-Z visible features) associated with a different state in the assembly of a probe array including bonding to a substrate 526 via a bonding material 527 and installing a guide plate 528. FIGS. 5A and 5B essentially duplicate the process states shown in FIGS. 4A and 4B showing the set up for attachment and the attachment of the probes 500 to a substrate (e.g., a spacer transformer, interposer, or the like) while in an array configuration. FIG. 5C shows the state of the process after sacrificial material 523 is partially removed from the upper portion of the probes to provide gaps around the probe ends to allow engagement with a guide plate while still providing precise relative positioning of the upper probe ends. In the present example, removal of selected portions of the sacrificial material 523 may have been achieved at least in part by use of a masking material that blocked access of a chemical etchant or selective bombardment radiation (e.g., in the form of electromagnetic radiation or particle bombardment) to the sacrificial material in regions where the sacrificial material was to be retained. In some variations, the removed sacrificial material may have been a different type than the retained sacrificial material which could have allowed selective removal of one without the other. In still other variations, removal of the upper portion of the sacrificial material, without removal of the lower portion of the sacrificial material may have been achieved by a timed etching and/or by a series of timed etchings and inspections. FIG. 5D shows the state of the process after a guide plate 528T is laterally aligned (in X and Y) relative to the upper end of the probes without the guide plate holes yet engaging the probes. FIG. 5E shows the state of the process after the guide plate engages the upper ends of the probes. In some variations of this step, the spacers 531 attached to some or all of the probes, or perhaps other probe structural components may provide for longitudinal guide plate positioning. FIG. 5F shows the optional state of the process after removal of all spacers which leaves probes, and in particular the probe body portions 501 with positioning dictated by the substrate and the engaged guide plate. In some alternative embodiments, some spacers or portions of some or all spacers may remain. FIG. 5G shows another optional state of the process where the guide plate is laterally shifted in the X– direction relative to the substrate to provide a curvature to the probe body portions 501, e.g., to set a preferential bending or buckling direction. FIG. 5H shows another optional state of the process where the guide plate has been laterally shifted in the Y-direction so that, in effect, the combination of the steps of FIGS. 5G and 5H provide a net diagonal shift which could have been performed in a single step in some alternatives. In some variations of this embodiment, one or more additional steps may be performed that cause back filling of a compressible, or deformable, material around all, or a portion, of each probe, or of selected probes, to provide more structural support for the probes. In still other variations, additional guide plates may be engaged with the probes. In some such alternatives an additional set of plates (e.g. two or more) may be shifted longitudinally toward the bases of the probes and then the plates may be laterally shifted relative to one another near the substrate to provide for a gripping of the probe bases by the shifted plates for improved probe durability and/or retention in the array configuration.

Figure 6:
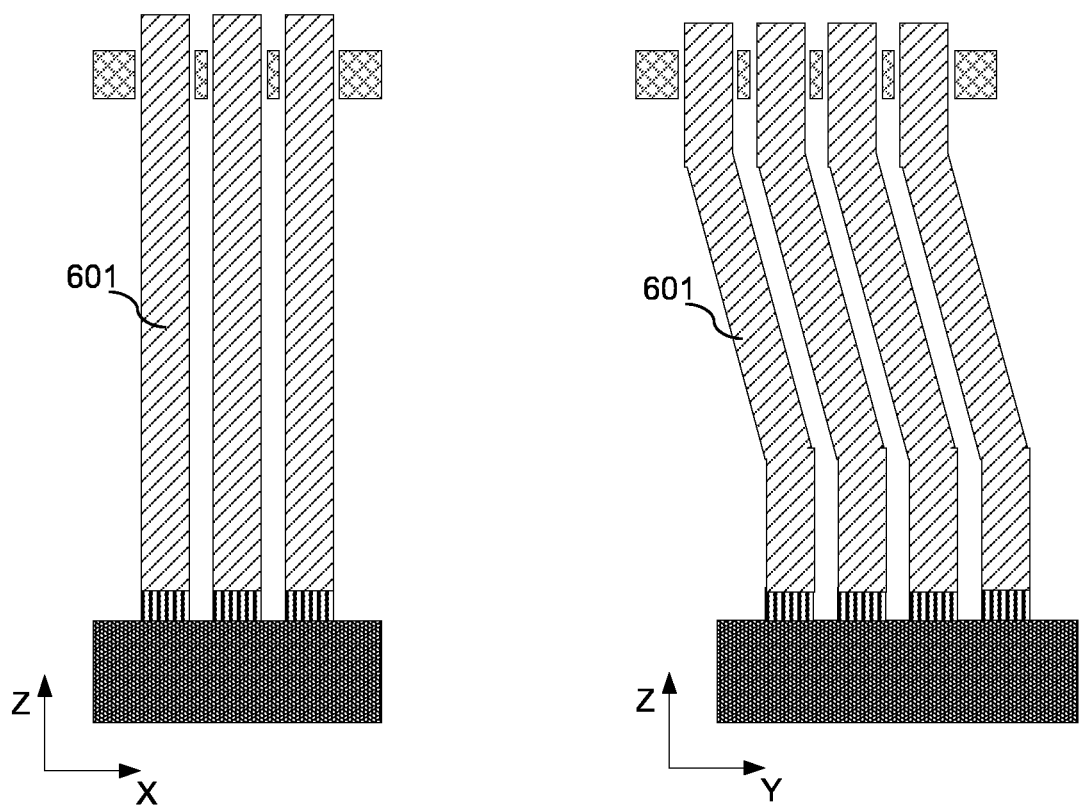
FIG. 6 provides an alternative to FIG. 5G wherein instead of the probes being provided with an X direction shift, they are instead provided with a Y-direction shift.

FIG. 6 provides an alternative to FIG. 5G wherein instead of the probes 601 being provided with an X direction shift, they are provided with a Y-direction shift. In this example, a preferential bending or buckling direction occurs about an axis that is perpendicular to the plane of the formation layers while FIG. 5G provided a bending or buckling direction of curvature about an axis that was parallel to a line existing in the planes of the layer or layers from which the probes were formed. It is noted, as used herein, the direction(s) of shearing force(s) is/are perpendicular to bending or buckling direction of curvature as the direction of bending is the axis around which bending occurs.

Figure 7:
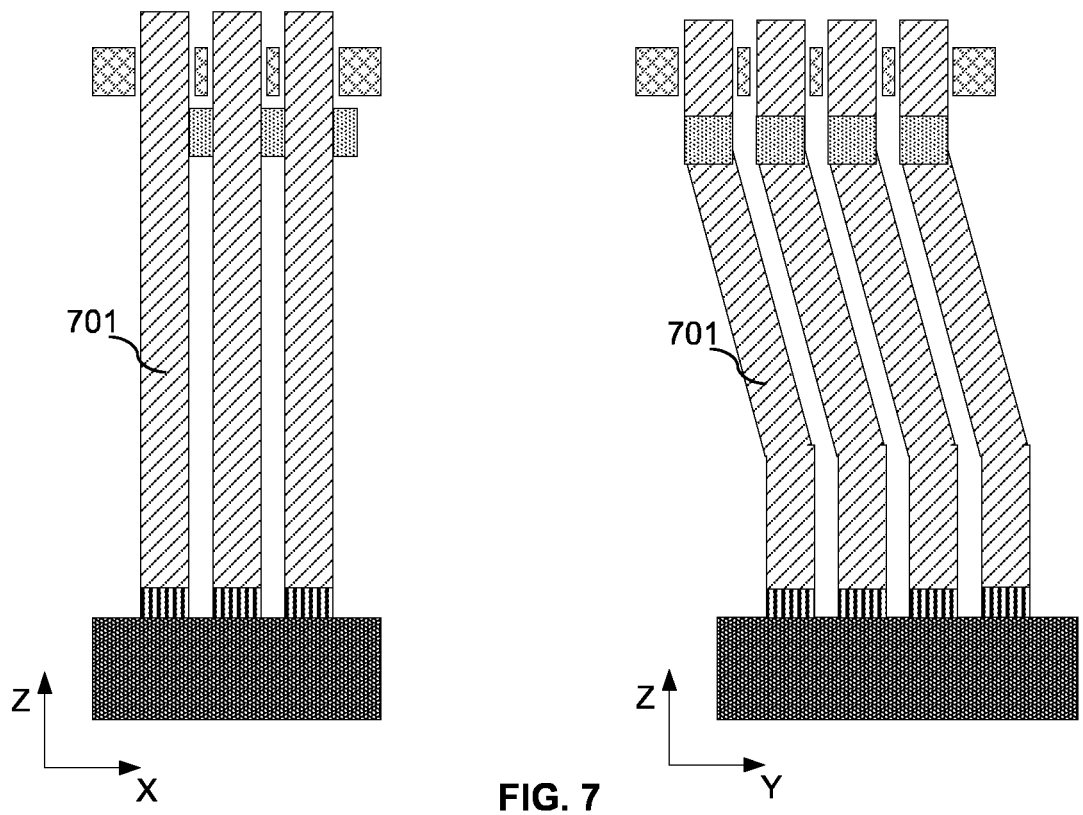
FIG. 7 provides another alternative to the examples of FIG. 5G and FIG. 6 wherein the probes are provided with a curvature induced by a shift in the Y-direction and wherein the spacers are retained without reduction in width.

FIG. 7 provides another alternative to the examples of FIG. 5G and FIG. 6 wherein the probes 701 are provided with a curvature induced by a shift in the Y-direction and wherein the spacers are retained without reduction in width (i.e., amount of protrusion from the probe body). In this example, it is assumed that since the probes are not provided with curvature in the Y-direction, i.e. the direction of spacing provided by the spacers, the probes while making contact with the spacer will still be able to independently and elastically compress and decompress as contact is made with a contact pad of an electronic circuit element and as separation from the pad occurs.

Figure 8A:
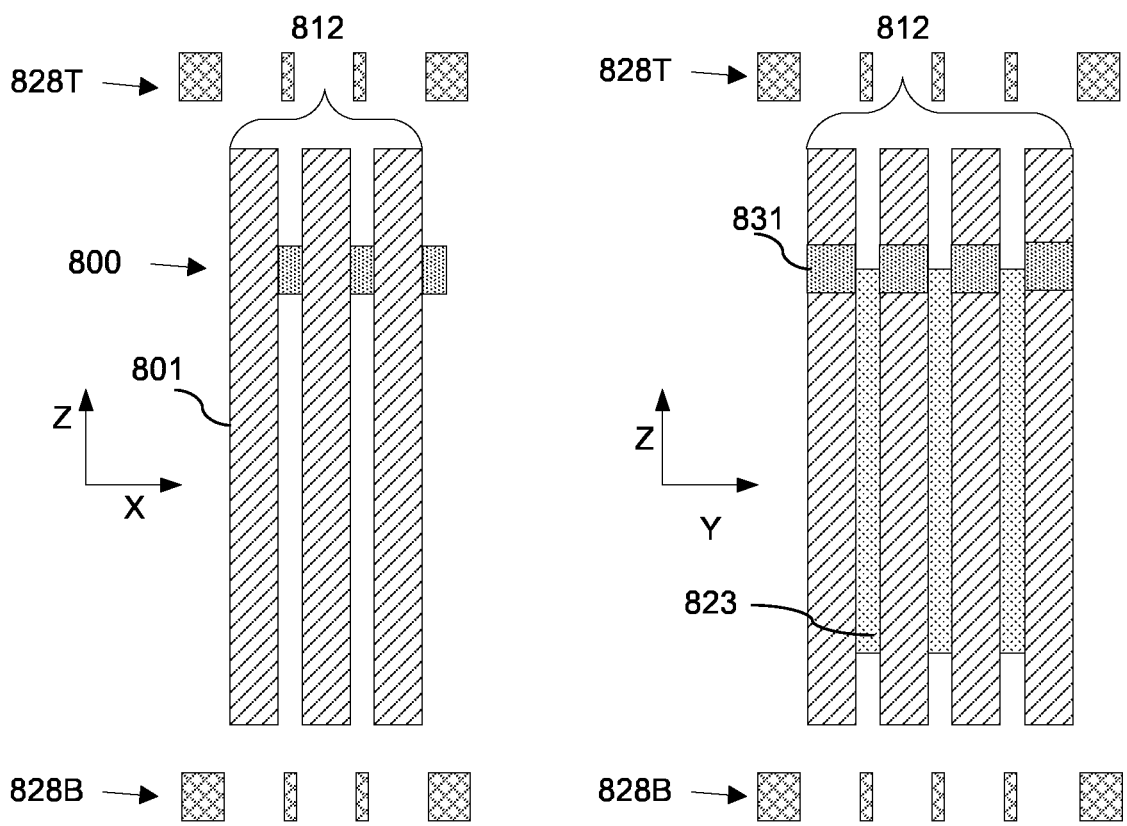
FIGS. 8A-8F provide illustrations of various states of an array creation process exemplified by a 4×3 probe array (like that of FIG. 3D) that is held in array configuration by a pair of guide plates.
Figure 8B:
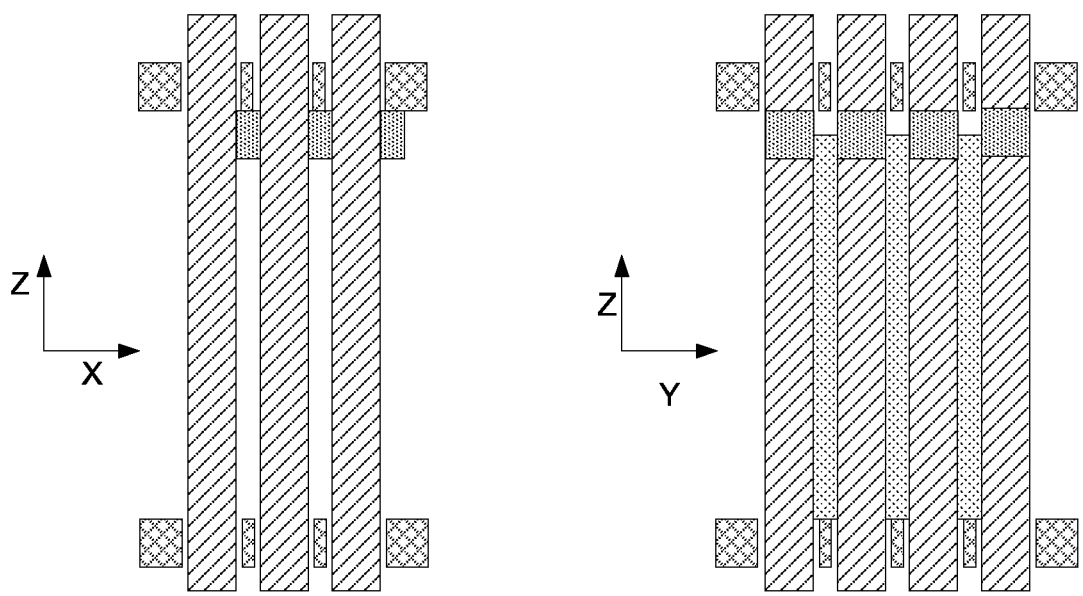
Figure 8C:
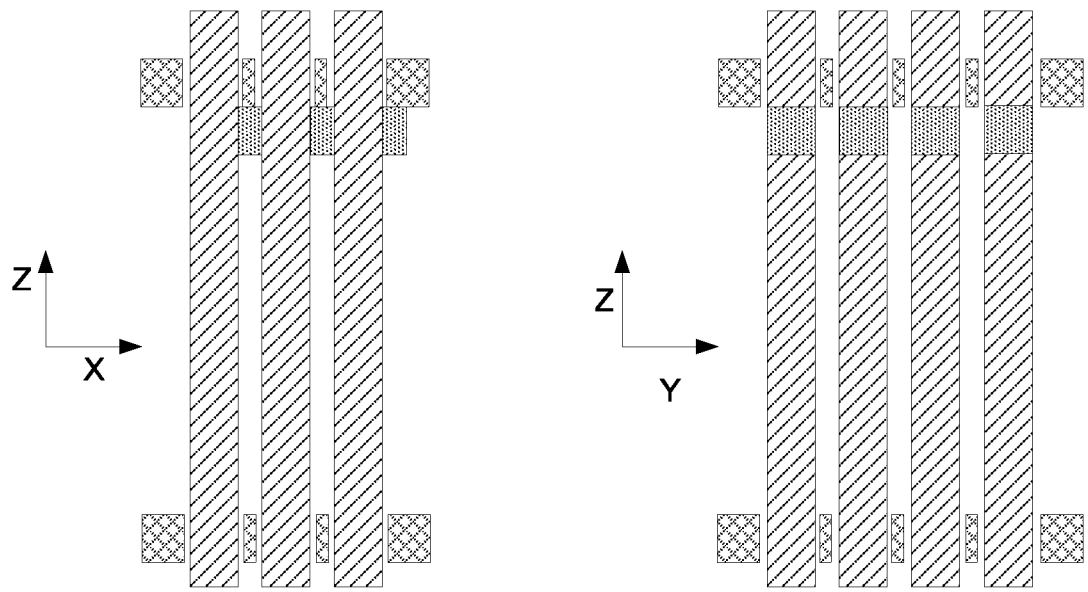
Figure 8D:
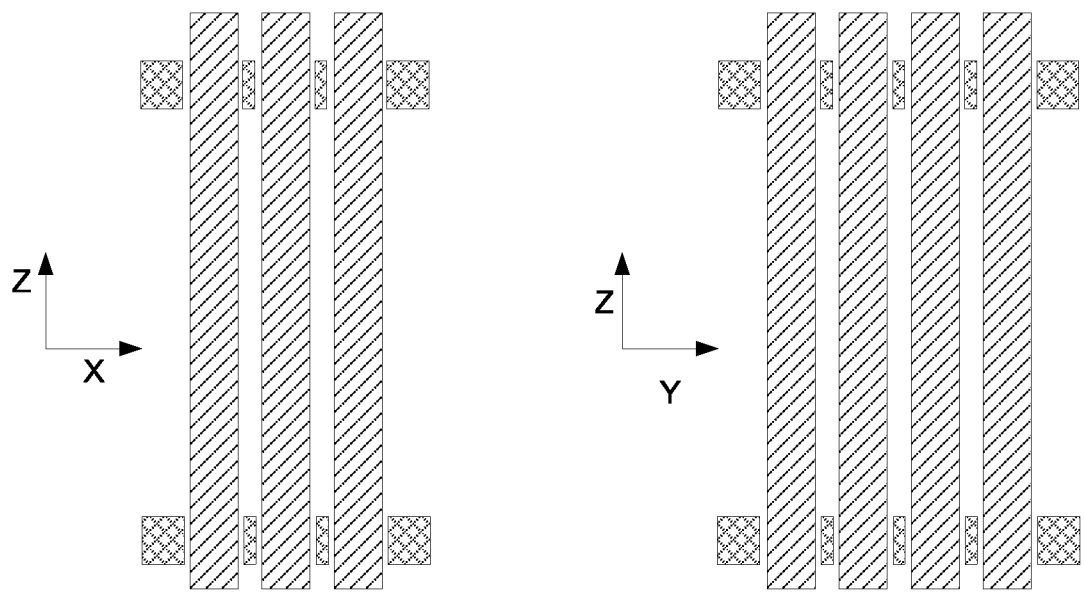
Figure 8E:
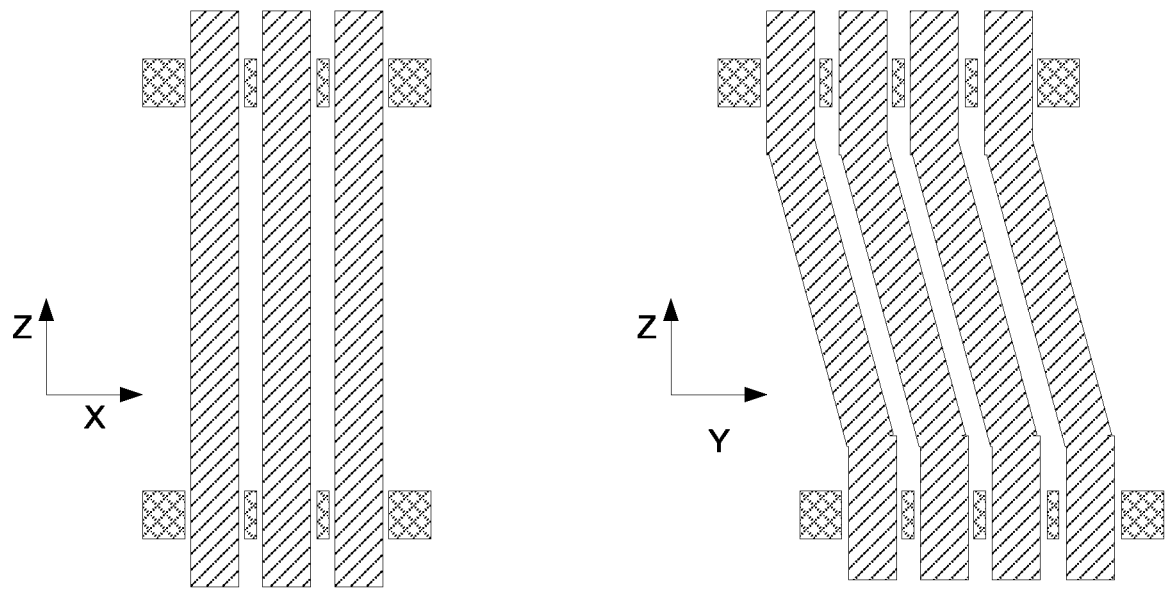
Figure 8F:
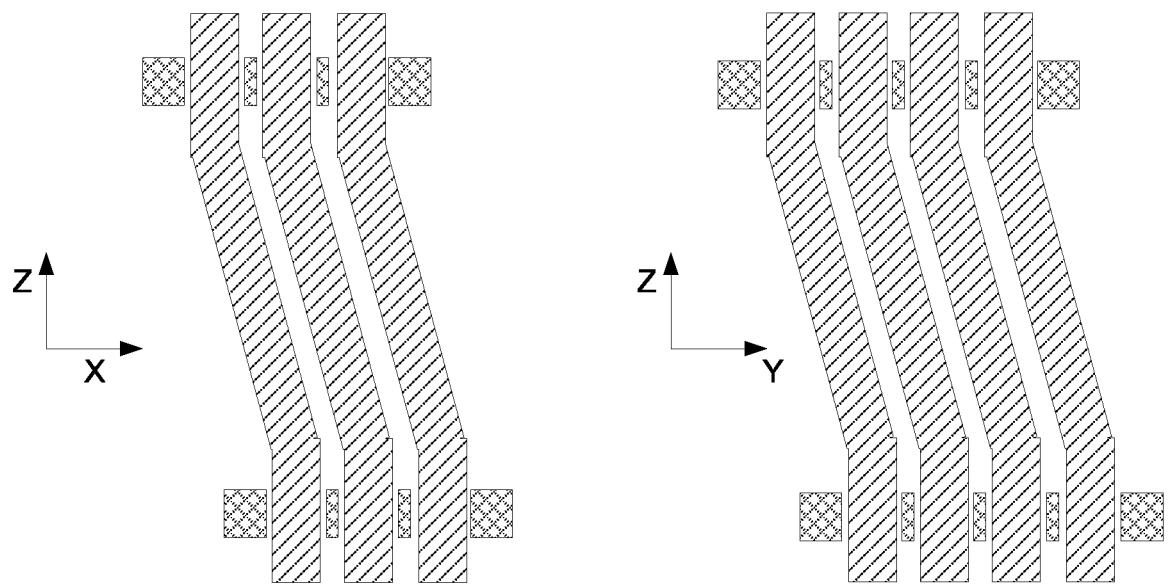

FIGS. 8A-8F provide illustrations of various states of an array creation process exemplified by a 4×3 probe array 812 (like that of FIG. 3D) of probes having body portions 801 and spacers 831 that are held in array configuration by a pair of guide plates 828T and 828B. FIG. 8A provides an illustration of the state of array formation along the Y-axis (left figure) and along the –X-axis (right figure) with sacrificial material 823 removed from the probe ends but still with sufficient retained sacrificial material in the intermediate regions of the probes to provide probe positioning integrity along with guide plates are laterally aligned and located above and below the array for eventual engagement. FIG. 8B provides an illustration of the state of array formation along the Y-axis (left figure) and along the –X-axis (right figure) after engagement of both upper and lower guide plates but still with retained sacrificial material 823 between the probes. FIG. 8C provides an illustration of the state of array formation along the Y-axis (left figure) and along the –X-axis (right figure) after removal of sacrificial material but with continued retention of the spacers. FIG. 8D provides an illustration of an optional state of array formation along the Y-axis (left figure) and along the –X-axis (right figure) wherein the spacers have been removed. FIG. 8E provides an illustration of another optional state of array formation wherein a lateral shifting of the two guide plates has occurred in the Y-direction to provide the probes with a desired curvature. FIG. 8F provides an illustration of another optional state of array formation wherein another lateral shift has occurred but this time in the X-direction.

In some alternative embodiments, a third guide plate or even two or more additional guide plates may be added to provide desired probe shaping and retention characteristics. In still other embodiments, probes may retain spacers, spacer portions, or contain other configurational elements, and/or non-probe guide plate connection elements may be provided that help establish guide plate placement and/or probe retention. In still other embodiments, instead of using a Y-direction shift followed by an X-direction shift, or vice-a-versa, a single diagonal shift of the guide plates relative to one another may occur or a plurality of smaller X, Y, and/or X-Y shifts may occur, and in still other embodiments, depending on exact probe positions, lateral rotational shifting may also occur with or without lateral translations.

Figure 9:
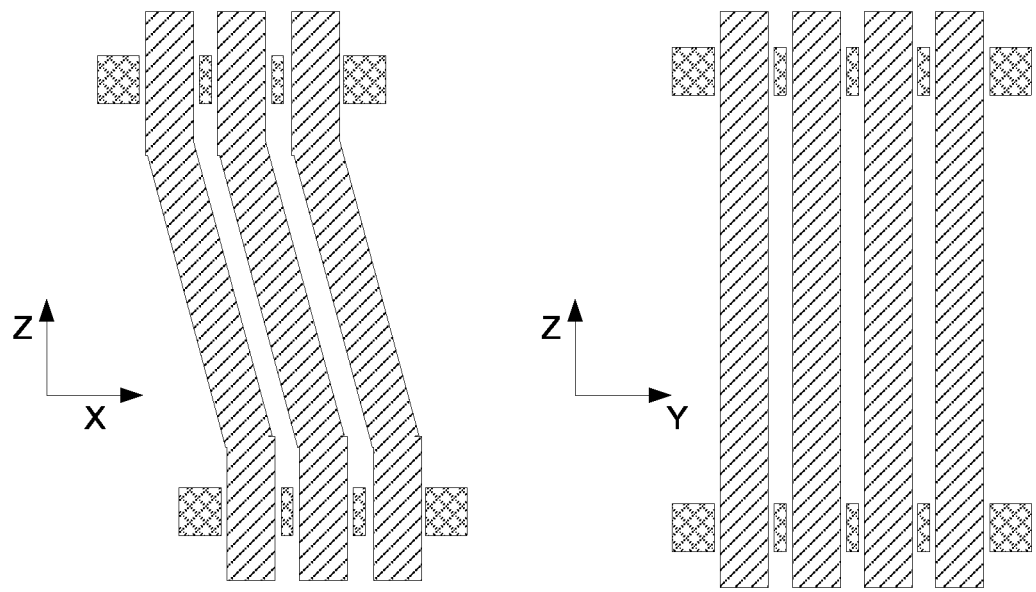
FIG. 9 provides an alternative to the state of the process shown in FIG. 8E wherein an X-direction shift occurred instead of a Y-direction shift.

FIG. 9 provides an alternative to the state of the process shown in FIG. 8E wherein an X-direction shift occurred instead of a Y-direction shift.

Figure 10:
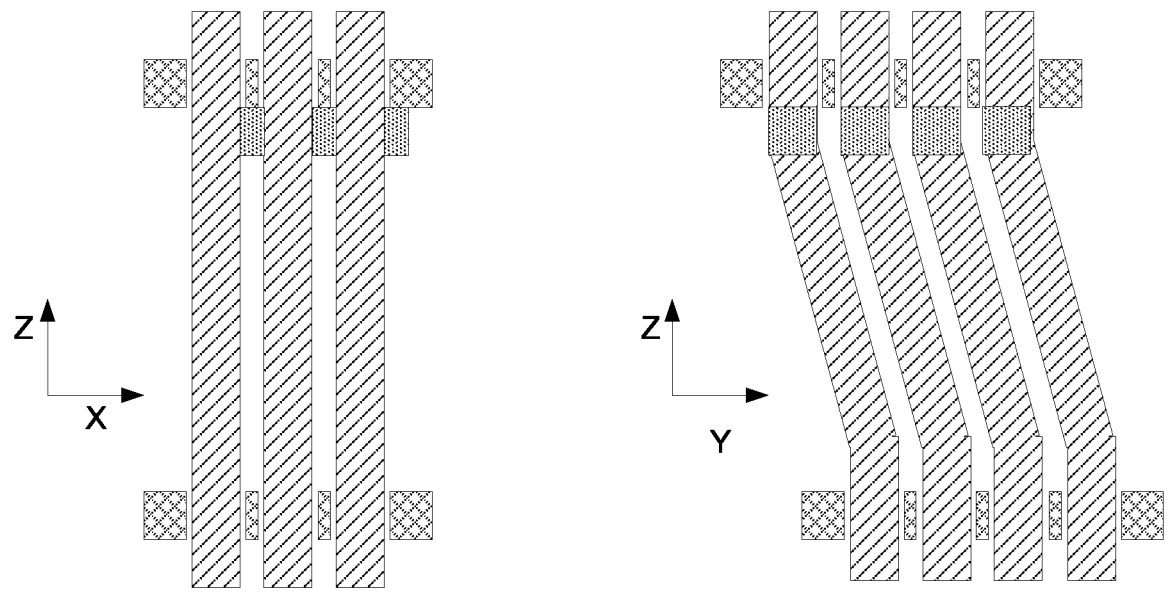
FIG. 10 provides another alternative in the processes of FIGS. 8A-8F and FIG. 9 wherein the probes are provided with a curvature induced by a shift along the Y-direction and wherein the spacers are retained without reduction in width.

FIG. 10 provides another alternative in the processes of FIGS. 8A-8F and FIG. 9 wherein the probes are provided with a curvature induced by a shift along the Y-direction and wherein the spacers are retained without reduction in width. In this variation, it is assumed that since the probes are not provided with curvature in the Y-direction, i.e., the direction of spacing provided by the spacers, the probes will be able to independently and elastically deform when the probe array is driven against contact pads of an electronic component (e.g., in preparation for testing) and is thereafter separated from those pads (e.g., after testing is completed).

Figure 11A:
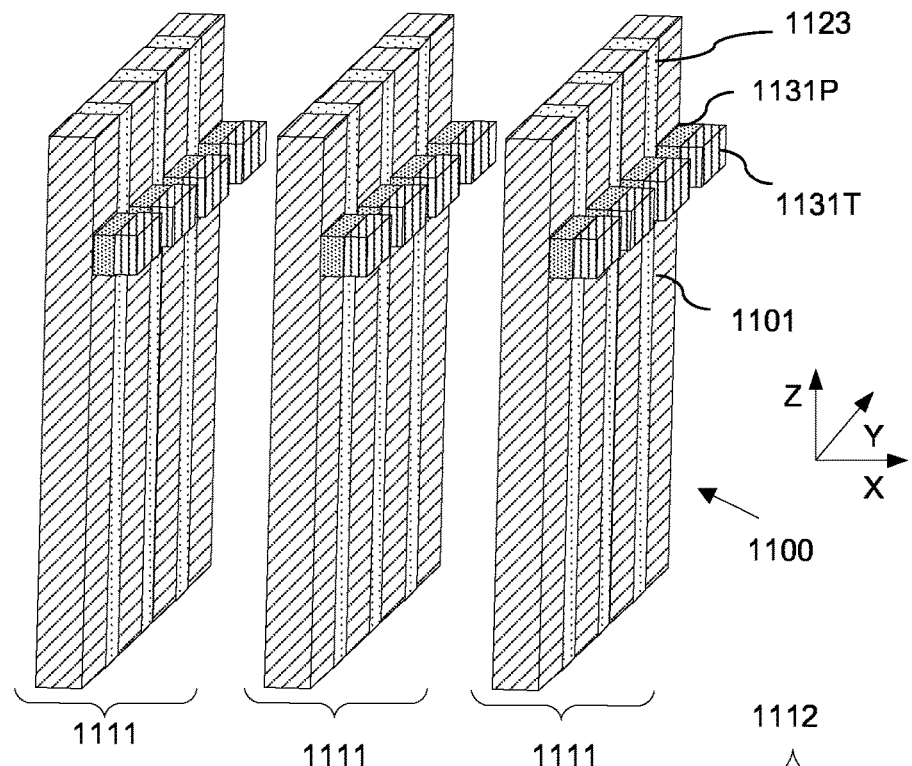
FIGS. 11A-11J illustrate various states of a process similar to those shown in FIGS. 8A-8F with the exception that the spacers are formed from two materials with a first material being attached to a respective probe and the other material being attached to the first material wherein the second material is a temporary material (e.g. a dielectric or conductive material) and the first material is a permanent material (e.g. a dielectric material) that will remain as part of the probes and probe array and wherein the first material may be used as a shorting barrier or guide material while the first and second material in combination are used as a spacing or alignment feature during array assembly.
Figure 11B:
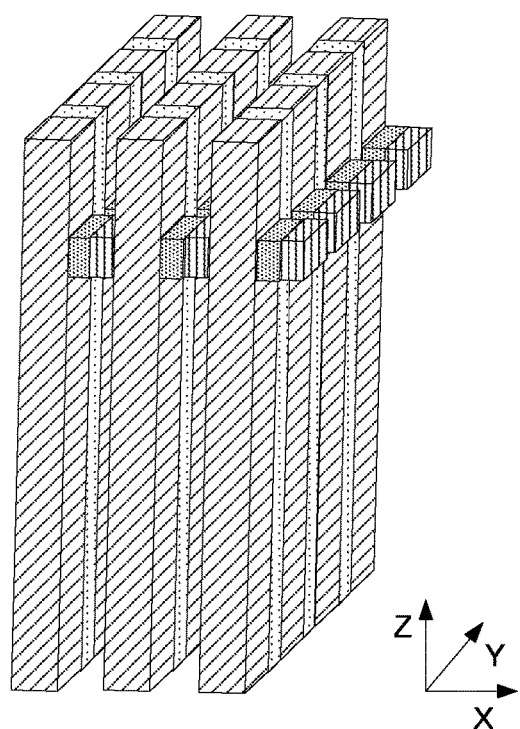
Figure 11C:
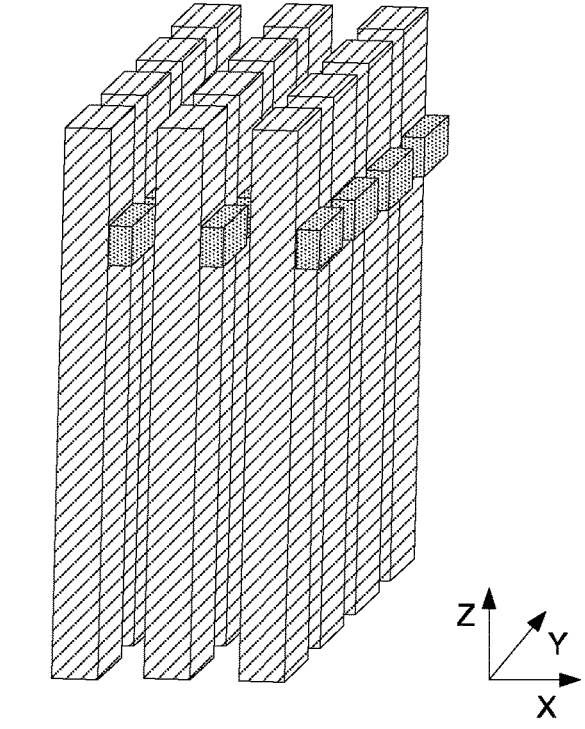
Figure 11D:
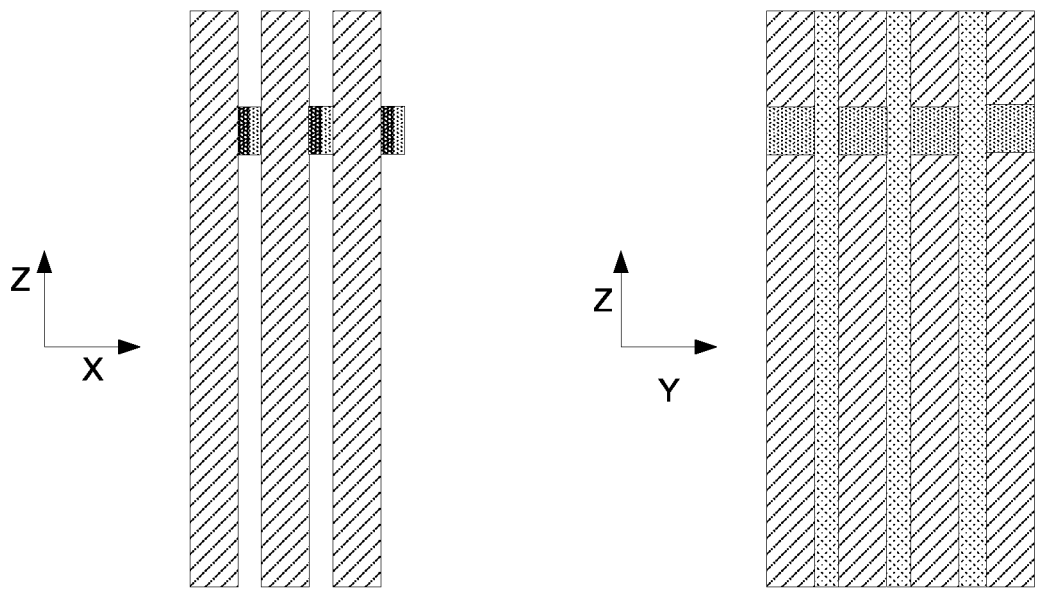
Figure 11E:
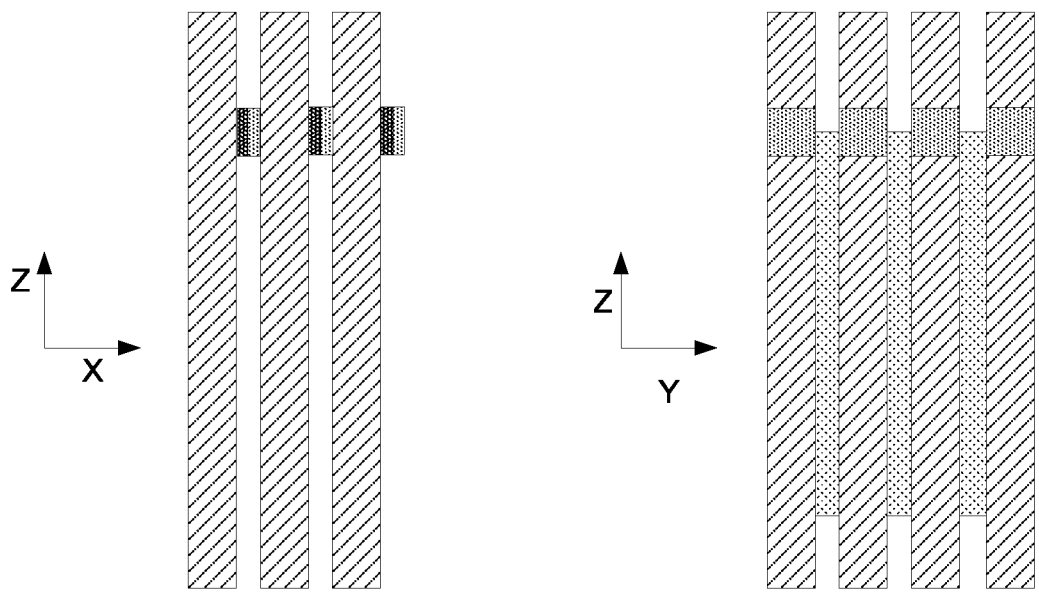
Figure 11F:
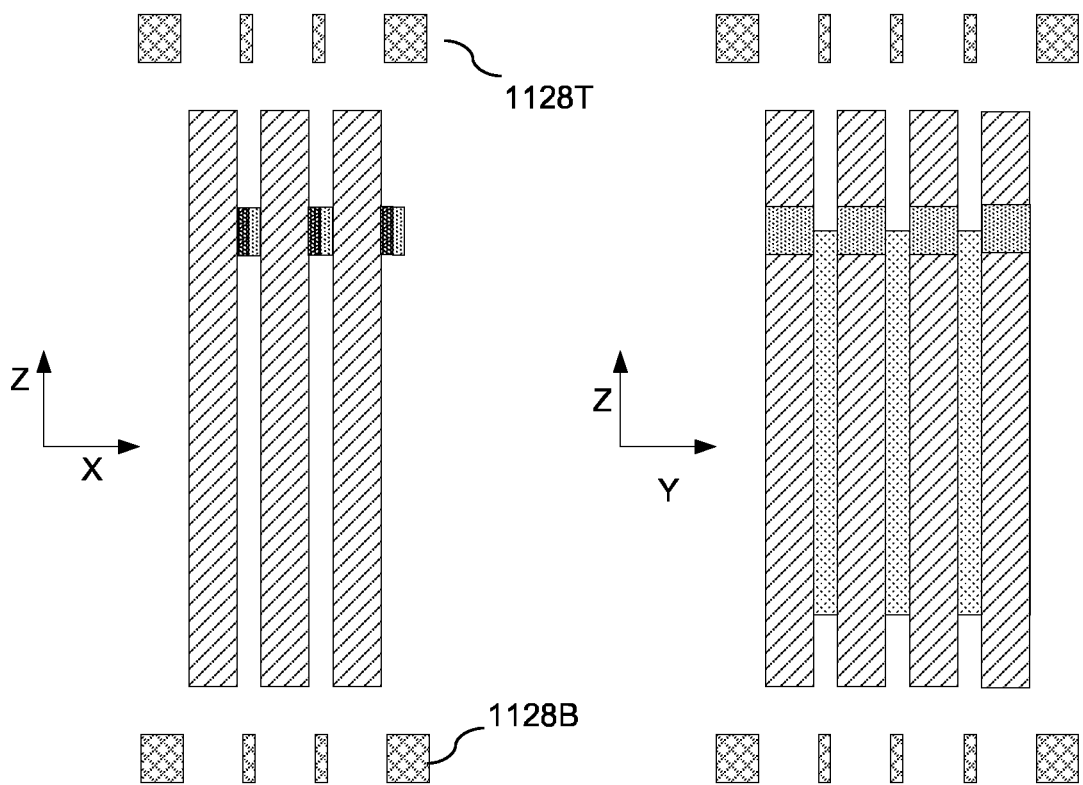
Figure 11G:
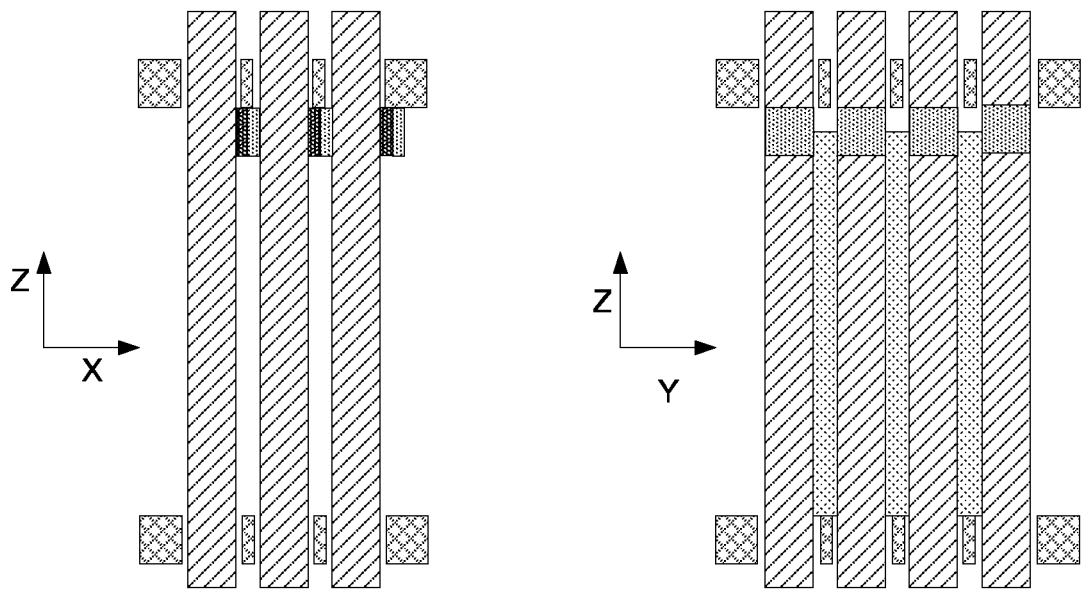
Figure 11H:
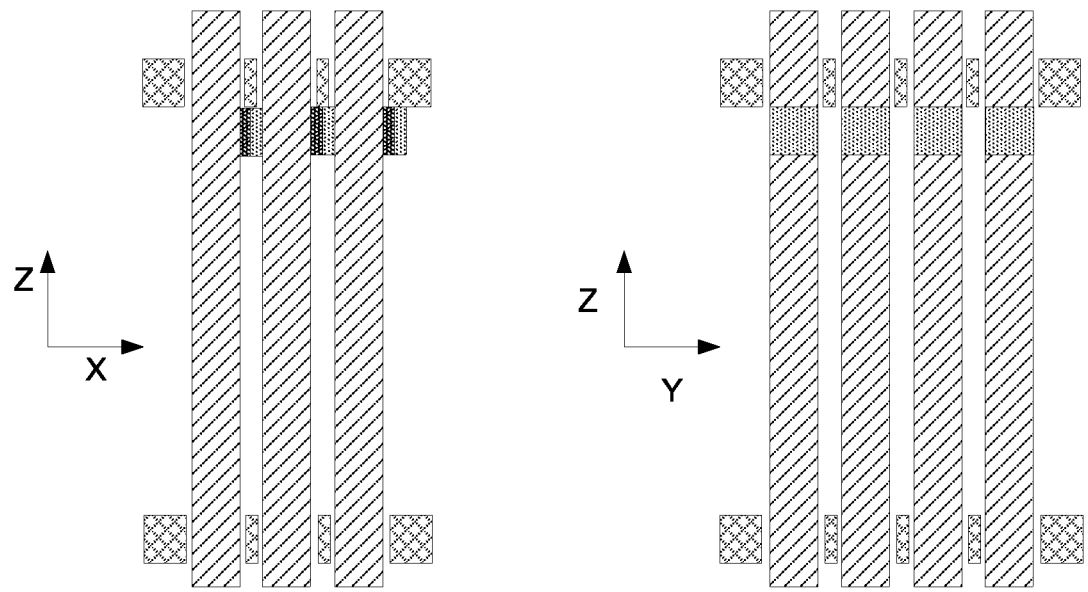
Figure 11I:
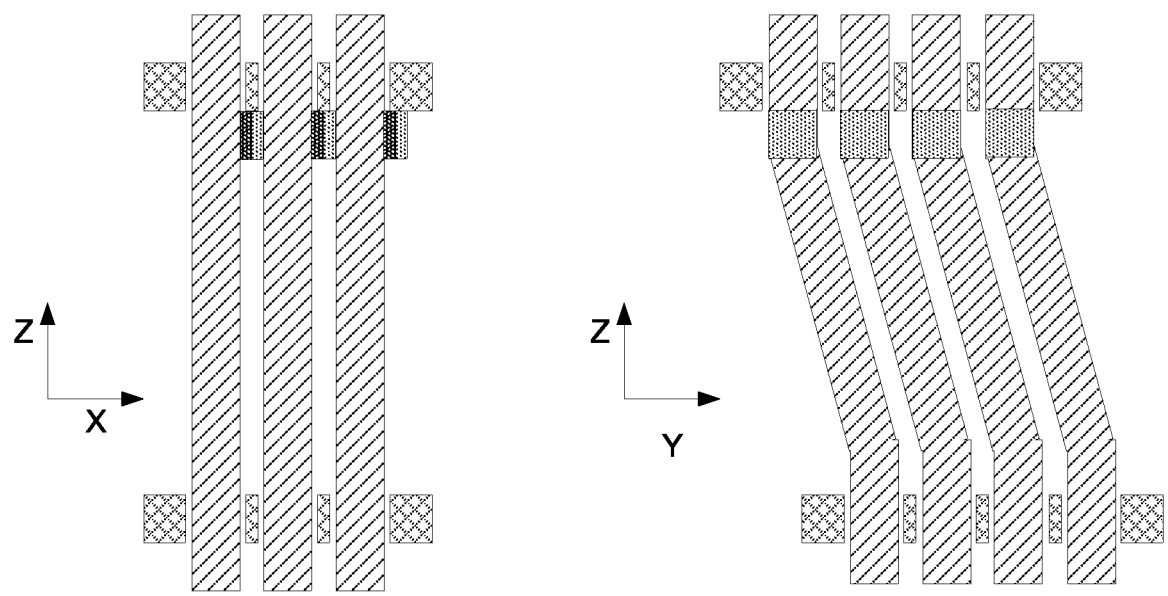
Figure 11J:
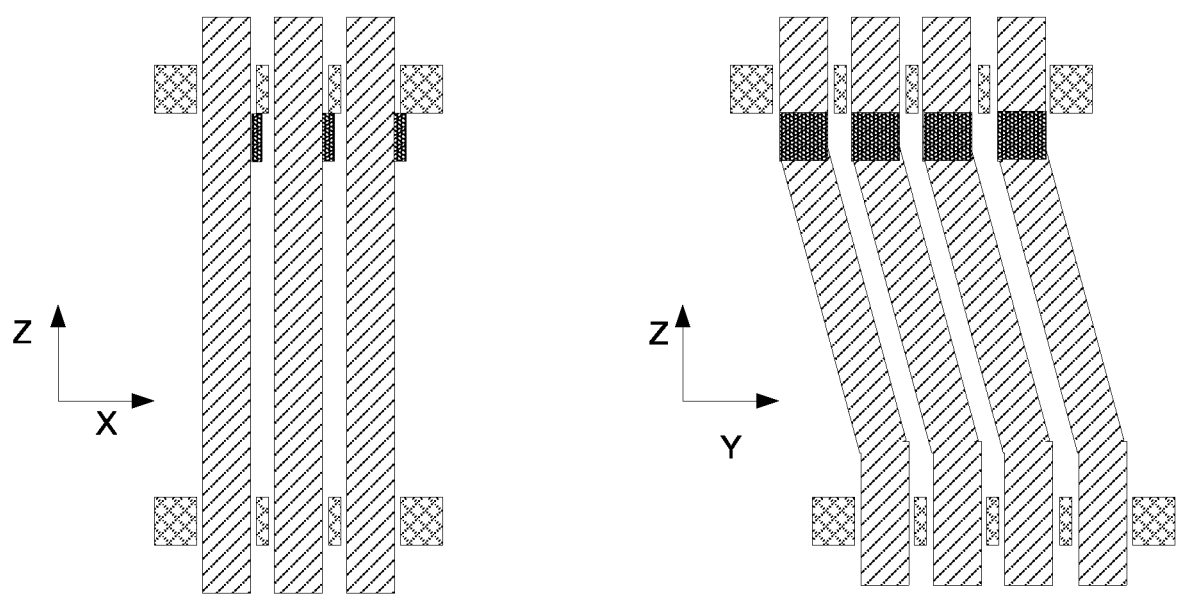

FIGS. 11A-11J illustrate various states of a process similar to those shown in FIGS. 8A-8F with the exception that the spacers are formed from two materials 1131P and 1131T with a first material 1131P being attached to a respective probe and the other material 1131T being attached to the first material wherein the second material is a temporary material (e.g. a dielectric or conductive material) and the first material is a permanent material (e.g. a dielectric material) that will remain as part of the probes and probe array and wherein the first material may be used as a shorting barrier or guide material while the first and second material in combination are used as a spacing or alignment feature during array assembly. FIG. 11A provides an isometric view of three spaced apart linear arrays 1111 exemplified with four probes 1100 each where each probe holds a spacer formed from a first and second material. FIG. 11B provides an isometric view of the state of array formation when the three linear arrays are positioned against one another with the spacers setting a desired array spacing in the X-direction and with retained sacrificial material 1123 between the probes of each linear array setting intra-linear array spacing in the Y-direction (other features not shown may be used to set linear-array-to-linear-array positioning (i.e. inter-linear-array spacing) in the Y-direction). FIG. 11C provides an isometric view of the 4×3 probe array 1112 with the second material of the spacers removed along with the intervening sacrificial material (array retention elements are not shown but are assumed to exist, e.g., in the form of guide plates, bonding to a substrate, and the like). FIG. 11D provides a side view of the 4×3 array along the Y- and X-directions (i.e., in the left and right figures respectively) where the spacers and sacrificial material can be seen. FIG. 11E provides views similar to that of FIG. 11D but with the state of the process advanced by the removal of sacrificial material from the tops and bottoms of the probes while leaving sufficient sacrificial material in place to ensure position integrity of the probes to one another. FIG. 11F shows the state of the process along the Y-axis (left figure) and along the −X-axis (right figure) with guide plates 1128B and 1128T ready for longitudinal engagement. FIG. 11G shows the state of the process along the Y-axis (left figure) and along the −X-axis (right figure) with guide plates longitudinally engaged with the probes. FIG. 11H shows the state of the process along the Y-axis (left figure) and along the −X-axis (right figure) after removal of the remaining sacrificial material. FIG. 11I shows the state of the process along the Y-axis (left figure) and along the −X-axis (right figure) after optional, opposite, lateral shifting of the guide plates in the Y-direction causes a curvature in the probes that gives them a desired pre-use configuration. FIG. 11J shows the state of the process along the Y-axis (left figure) and along the −X-axis (right figure) after removal of the second spacer material but with retention of the first spacer material wherein the gaps between the neighboring probes and spacers ensure free movement of the probes during electronic device contact while the retained spacer material provides a desired function, such as, for example, a dielectric barrier against probe-to-probe electric contact, guide plate or probe retention, alignment or guiding of probes upon deflection, and the like. Numerous alternatives are possible and will be apparent to those of skill in the art upon review of the teachings herein (e.g. the spacers may exist at different heights long the longitudinal length of the probes, or at multiple heights along the longitudinal length of the probes, or such multiple spacers may have different thicknesses). In another alternative, the first spacer material, at least associated with some probes, may be being a conductive material (e.g. a metal which may be the same or different from the material of the probe body) which may provide shorting or intentional electrical contact between some probes and other probes when some of the probes are deflected or underload. In still another example, the first spacer material may have included temporary or sacrificial material while the second spacer material did not such that upon removal of the first spacer material, the entire spacer is removed. Such a configuration might be useful in a situation where a certain non-removable material was desired as contact surface but where it was still desirable to remove the material after it served its purpose. Such a configuration may also be useful in ensuring that the spacers are retained until all other sacrificial material is removed where upon additional etching, the spacers will also be removed.

Figure 12A:
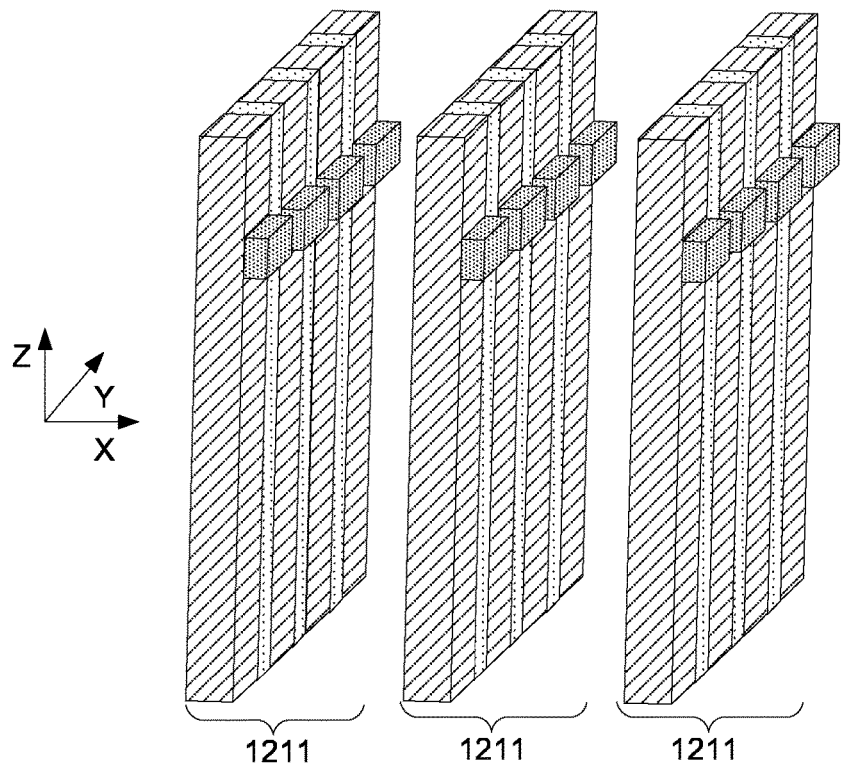
Figure 12B:
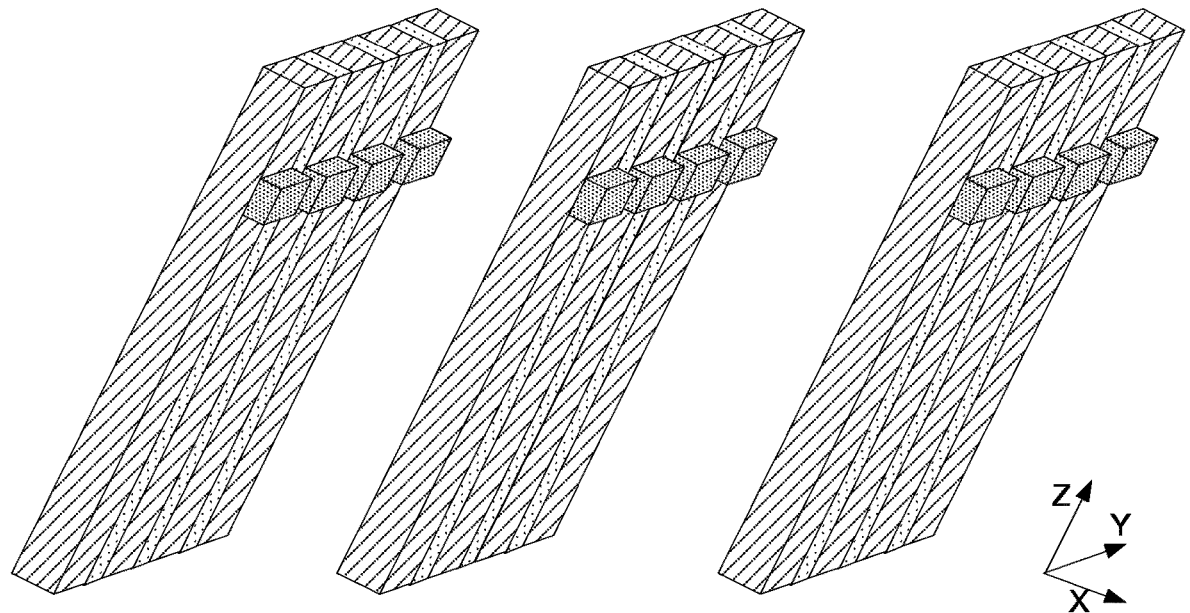

FIGS. 12A-12E provide another example probe array configuration along with isometric illustrations of various states involved in the process of forming the array wherein the process bonds rectangular, a number of linear probe arrays at a non-perpendicular angle to a permanent substrate. FIG. 12A provides an isometric illustration of three individual linear probe arrays 1211 in upright, spaced apart positions. FIG. 12B provides an isometric illustration of the state of the process after the linear arrays have been rotated to an assembly angle. FIG. 12C provides an isometric illustration of the state of the process after the linear arrays have been brought into contact with one another via the spacers. FIG. 12D provides an isometric illustration of the state of the process after the 4×3 array of probes 1212 is bonded to a substrate (e.g. via solder bonding). FIG. 12E provides an isometric illustration of the state of the process after removal of the dielectric and intervening sacrificial material. FIGS. 12A-12D also provide single coordinate axis diagrams showing the relative directions of the X, Y, and Z axes associated with the probes during their formation while FIG. 12E provides two such coordinate axis diagrams with the left most showing X, Y, and Z directions corresponding to the axes for probe formation while the right most shows X', Y', Z' axes associated with the probe array itself where the Z'-axis or longitudinal axis of the probe array extends perpendicular to the plane formed by the probe tips, the plane formed by the probe bases, as well as the plane of the permanent substrate. The X' and Y' axes, or lateral axes, of the probe array have also been rotated relative to their X and Y counterparts so that they remain perpendicular to the Z' axis. Numerous alternatives to the embodiment of FIGS. 12A-12E are possible and include, for example, providing spacers that can function as alignment guides in the lateral direction parallel to the face of the linear array or even as longitudinal guides. Examples of such alternative spacers/guides include the bar and slot guides of FIG. 18, the notch and bar guides of FIG. 19, and the bar and U-shaped guides of FIG. 20.

Figure 13B:
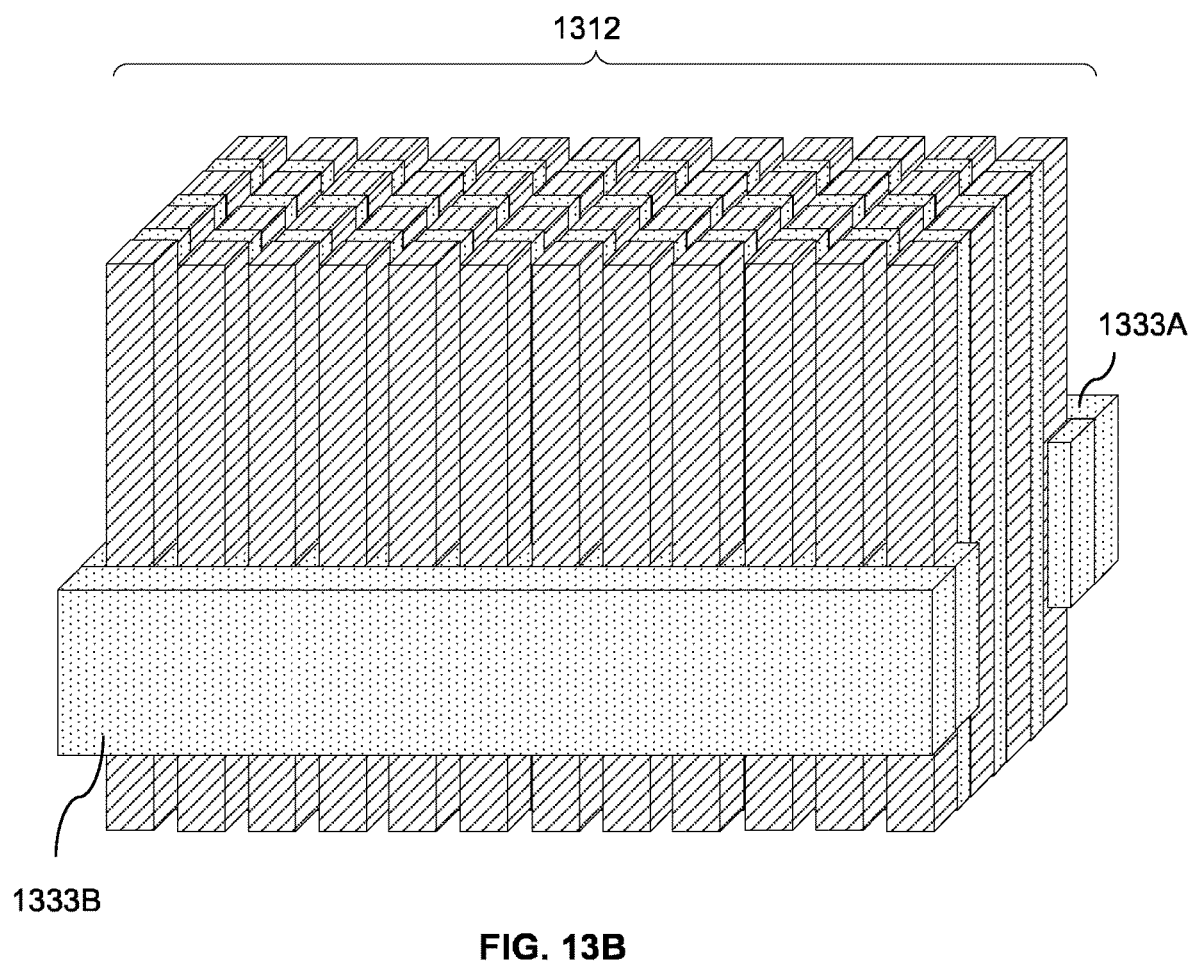

FIGS. 13A-13B provide isometric illustrations of two states in a process of assembling a probe array 1312 using non-probe attached spacers 1333A and 1333B that may be formed from a structural material that may or may not be eventually removed or which may be formed from a sacrificial material that may be removed along with intervening sacrificial material located between probes within individual linear arrays. FIG. 13A provides an illustration of twelve 4×1 linear arrays that are to be positioned with respect to one another (in the configuration shown) via engagement of two spacer plates, or alignment structures, having guide slots formed by guide bars that can engage the sides or edges of each linear array. FIG. 13A depicts a single axis diagram for the probes and a separate axis diagram for the guide plates that each show the build axes (X, Y, and Z) including the layer stacking axis X of each. No separate array (or assembly) axes are shown as they have the same orientation as the axes that are shown. As such in this example, the guide plates are formed on their backs while the probes or linear probe arrays are formed on their sides. FIG. 13B shows the array after engagement of the spacer plates. In later steps (not shown), after engagement of permanent array retention elements (e.g. a bonded substrate, tiled substrates and/or guide plates), the spacer plates may be removed along with intervening sacrificial material within the individual linear arrays. In some other alternative embodiments, the spacers may be retained or portions of the spacers may be retained (e.g. if the spacers are formed from multiple materials) while other portions are removed (e.g. if one of the materials is a structural and the other is a sacrificial material). In still other variations, the spacer plates may take on different configurations such as configurations with tapered edges to ease assembly, multiple elements that may slide relative to one another to provide large gaps for loading that can be transitioned to small gaps for alignment, additional features that provide other alignment or stop functions, and/or independent guide features of each linear probe array so that selective removal of selected features for each linear array could occur.

Figure 14A:
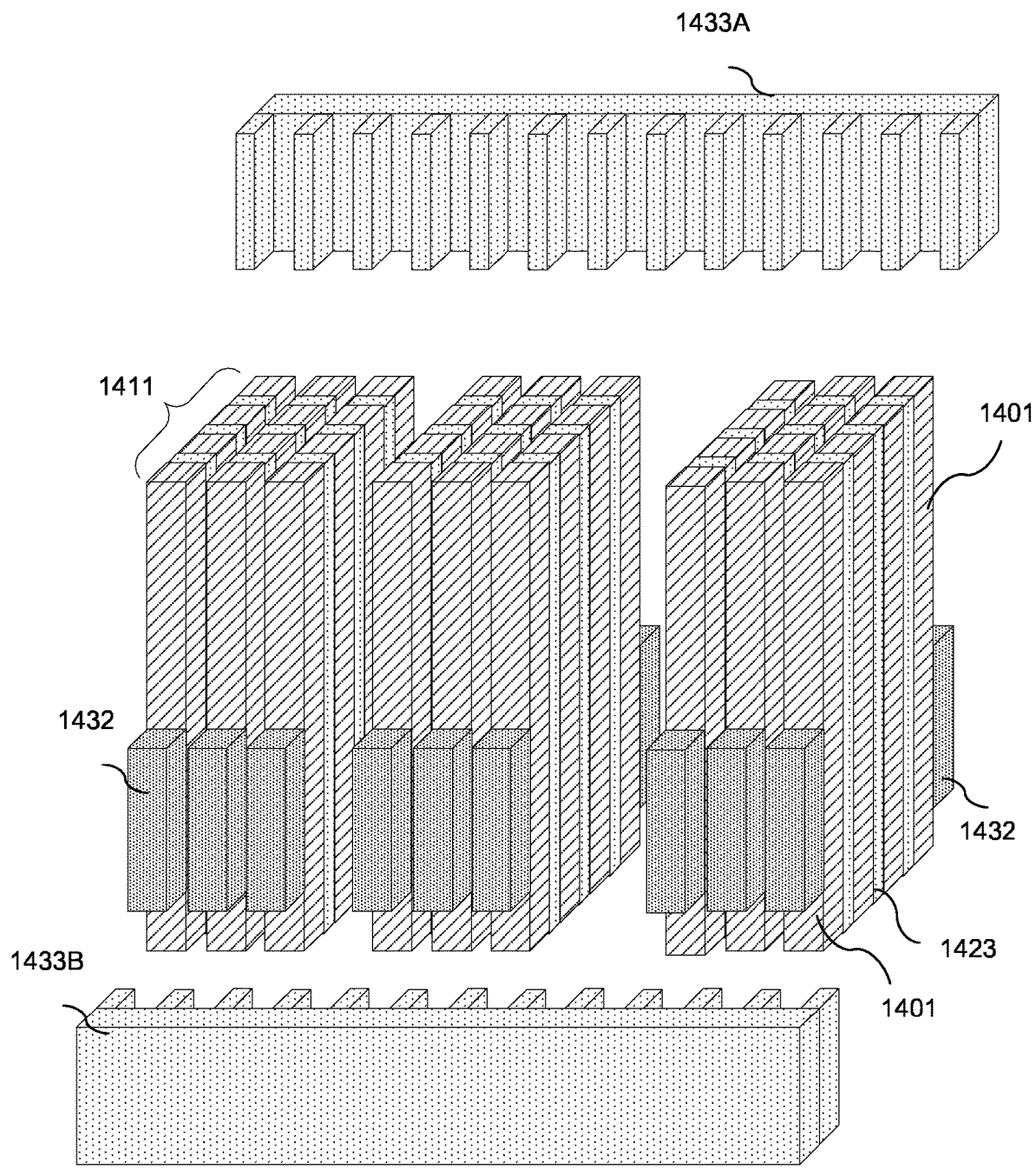
FIGS. 14A-14B provide another illustration involving the use of alternative spacer plates (i.e., spacer plates that are not adhered to probes) similar to those of FIGS. 13A-13B but where the plates engage spacer material extending from the sides of the two end probes of each linear array (as opposed to the probes themselves) and wherein, as shown, gaps or variations in probe spacing may be made to occur.
Figure 14B:
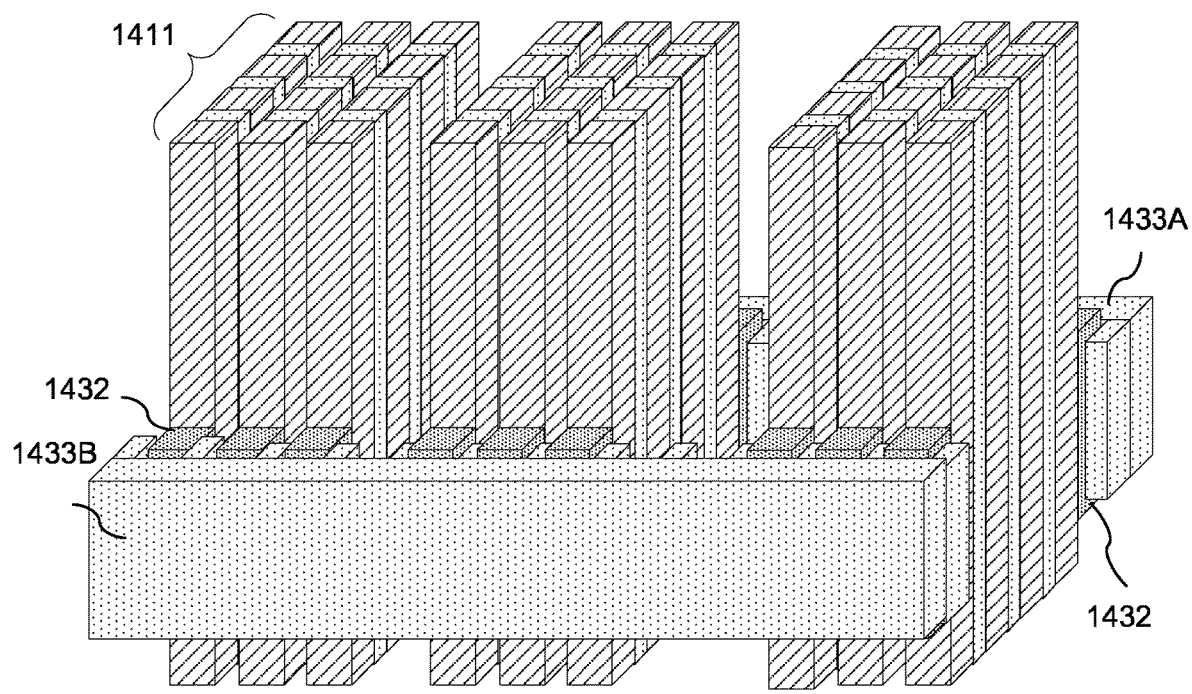

FIGS. 14A-14B provide another illustration involving the use of alternative spacer plates 1433A and 1433B (i.e. spacer plates or alignment structures that are not adhered to probes 1401) similar to those of FIGS. 13A-13B but where the plates engage spacer material 1432 extending from the sides of the two end probes 1401 of each linear array 1411 (as opposed to the probes themselves) and wherein, as shown, gaps or variations in probe spacing may be made to occur. In some variations of this embodiment, the probes may be formed from multiple layers and the spacers on the sides of the linear probe arrays may be formed along the edges of those linear arrays from multiple layers or from a single layer. Spacers or guides formed as part of alternative alignment structures (i.e. alignment structures not adhered to probes) may also be formed from single or multiple layers. Due to the possibility of layer-to-layer offsets occurring when forming stacked layers (e.g. relatively small offsets on the order of 0.5-3 microns or less, due for example to unintended layer-to-layer misalignment), it may be beneficial for one of the layers forming the body of the probes in the spacer regions to protrude beyond the other layers of the probe (i.e. extend or protrude beyond the other edge surfaces of the probe so as to be proud of the other surfaces). It may also be beneficial to ensure that regions of neighboring probes or alternative alignment structures that are to mate with the spacers and that are made from multiple layers also have features that protrude from, or are proud of, the other portions of the probes or alignment structures to ensure that the spacer only contact one layer of the neighboring probe, spacer, or alternative alignment structure and that such contact regions are associated with the same layer so that layer-to-layer positioning offsets do not cause positioning errors when using face-to-face spacer contact during array assembly (e.g. by causing unintended larger or smaller gaps to be formed between spaced probes). Alternatively, spacers may be formed from single layers in the contact regions of the probes and neighboring probes so that regardless of offsets associated with different layers of a body of the probe, the spacers themselves have sufficient extension to ensure single-layer-to-single-layer, face-to-face contact between neighboring probes such that proper probe-to-probe spacing or proper probe-tip-to-probe-tip pitch is provided. In still other alternatives, a combination of probe edge protrusions on a single layer of the probes may be combined with single layer or multiple layer formations of spacers such that a single flat spacer surface is provided that can contact a neighboring probe or alternative alignment structure along a proud, single layer region wherein a single layer of spacer material may be proud of recessed adjacent regions such that the proud surface provides face-to-face contact while the recessed adjacent regions provide enhanced mounting stability for the proud portion of the spacer while potentially also providing side-to-side alignment.

Figure 14C:
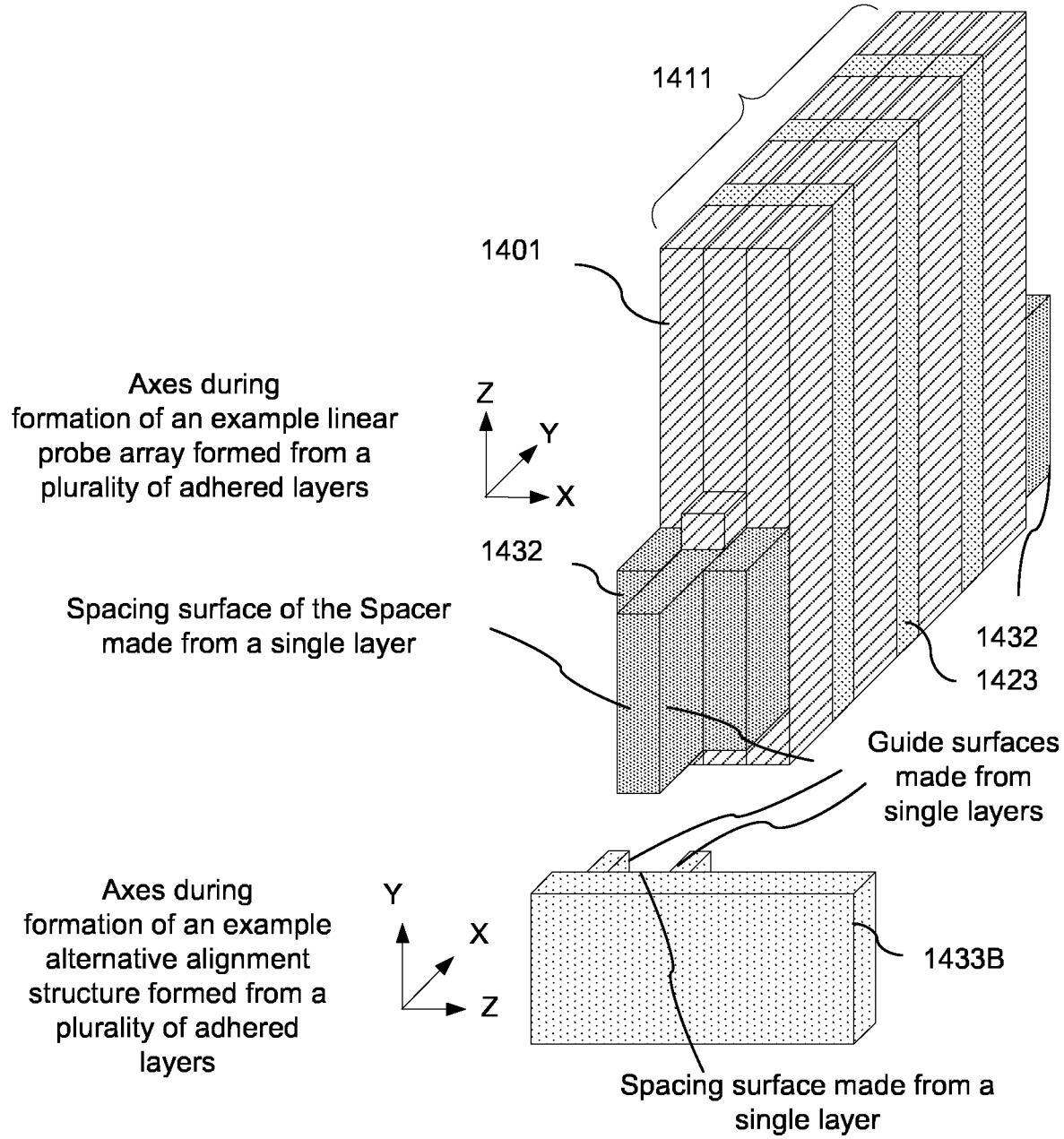
FIG. 14C depicts a linear probe array (exemplified by four three-layer probes) having a side facing spacer structure along with an alternative alignment structure for which mating is to occur wherein the spacer structure has a single protruding portion that originates on a protruding, single layer edge of the probe wherein the proud spacer portion is held in place not only by backside attachment to the proud edge of the probe body but also by additional recessed spacer material formed as part of the surrounding layers that capture both the spacer and the proud portion of the edge of the probe.

FIG. 14C depicts a linear probe array (exemplified by four three-layer probes) having a side facing spacer structure along with an alternative alignment structure for which mating is to occur wherein the spacer structure has a single protruding portion that originates on a protruding, single layer edge of the probe wherein the proud spacer portion is held in place not only by backside attachment to the proud edge of the probe body but also by additional recessed spacer material formed as part of the surrounding layers that capture both the spacer and the proud portion of the edge of the probe. As shown, the probe array is formed with an orientation that is different from that used to form the alternative alignment structure. Both the probe array and the alternative alignment structure are formed from layers with a layer stacking direction being along the X-axis. In the illustrated example, array X-direction positioning is set by guide surfaces of the alignment structure slots that are spaced apart along the Z-direction of the structure while Y-direction positioning of the linear array is set by the spacer contacting an X-direction surface of the alignment structure. Various alternatives to the depicted configuration are possible and will be apparent to those of the skill in the art. One such alternative, may provide the alignment structure with a stop at the lower ends of structure or alternatively the spacer with a cap at its upper end such that the vertical loading of the spacer into the alignment guide slot is limited to a set position which sets the Z-height of the linear array relative to the alignment structure. In another example variation, the lower and/or upper ends of the Y-direction edge of the spacer may be formed with tapers to ease engagement of the spacer with the alignment structure. In still another example variation, the upper or lower inward facing edges of the alignment slots may be defined by guide elements that may be formed with tapers to ease the engagement the spacer into the alignment guide slot. In some other example variations, the alignment structures may remain in the final array, may be removed after removal of internal sacrificial material 1423, or may be removed along with removal of internal sacrificial material. In still other variations, slots in the alignment structures may be replaced by other alignment features while the bar-like spacers at the end of linear arrays may be replaced by spacers with other configurations or perhaps even removed in their entirety in favor of having the alignment guide elements and slots engage the probes at the end of the arrays directly.

Figure 15A:
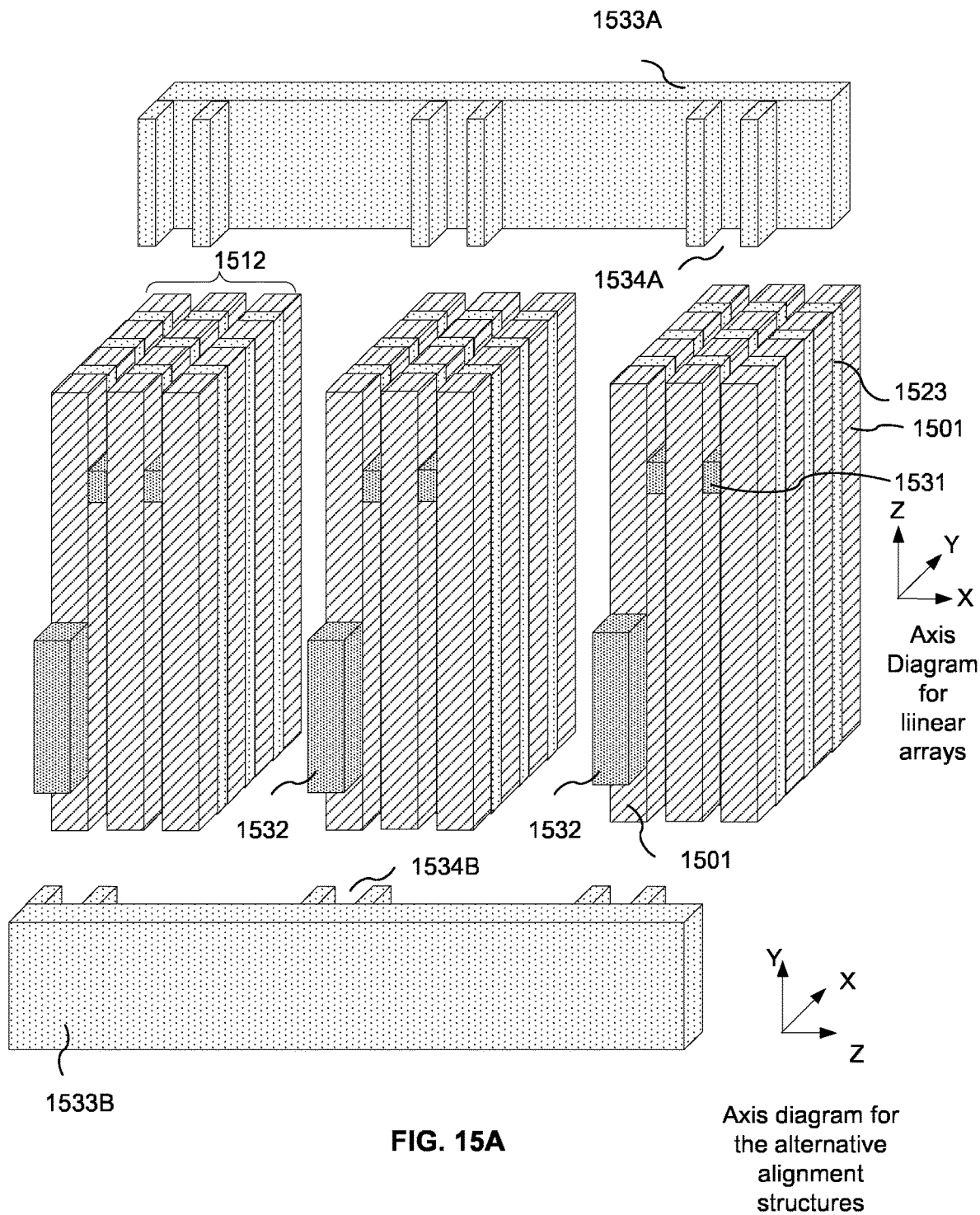
FIGS. 15A-15B show another alternative method of using alternative alignment structures (e.g., spacer plates not attached to probes) with non-linear subarrays (e.g. 4×3 combination arrays in this example) where spacers on the edges of the combination arrays may engage slots in the alignment structures.
Figure 15B:
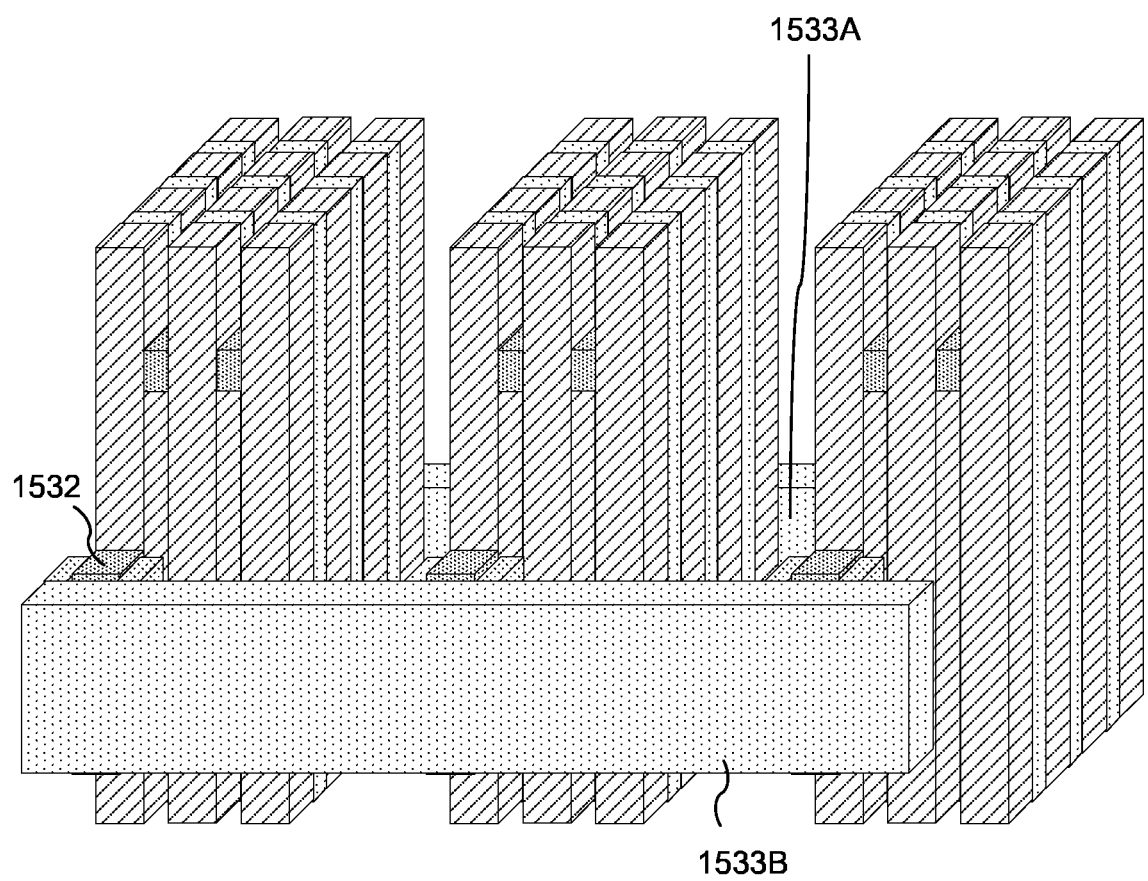

FIGS. 15A-15B show another alternative method of using alternative alignment structures 1533A and 1533B (e.g., spacer plates not attached to probes) with non-linear subarrays 1512 (e.g., 4×3 combination arrays in this example) where spacers 1532 on the edges of the combination arrays 1512 may engage slots 1534A and 1534B in the alignment structures. In this example, sacrificial material 1523, masking material, or spacers 1531 may be used for internal spacing between probes probe body portions 1501 within individual 4×3 arrays.

In the example of FIGS. 15A-15B, as with FIGS. 14A-14B, slots in the spacer plate guide elements are shown with vertical side walls which may make high tolerance engagement difficult. It is anticipated that slots, spacers, and potentially even probe bodies can be formed with angled or sloped regions that will close or expand to tighter tolerance regions while still allowing ease of loading. Slots in the alignment structures may be somewhat larger than the width of the spacers attached to the probes. Guides in the form of slots in the alignment structures may have tapered ends for easing registration of slots and spacers. Such sloped or angled regions can be most easily formed as lateral regions within individual layers though minimization of stair stepping when transitioning between successive layers may also provide for sloped loading interface regions. In still other variations, the length of spacers may be extended by not only inclusion of probe engagement features but also by inclusion of other features that will allow end-to-end joining or extension of alignment structures. In some variations, the alignment structures may include slidable element that allow large gaps to exist at the time of loading which can be transitioned to smaller gaps when setting alignment.

Numerous additional variations of the example of FIGS. 15A-15B are possible and include those noted with regard to FIGS. 14A-14C as well as the other variations for other probe arrays set forth herein, mutatis mutandis.

Figure 16A:
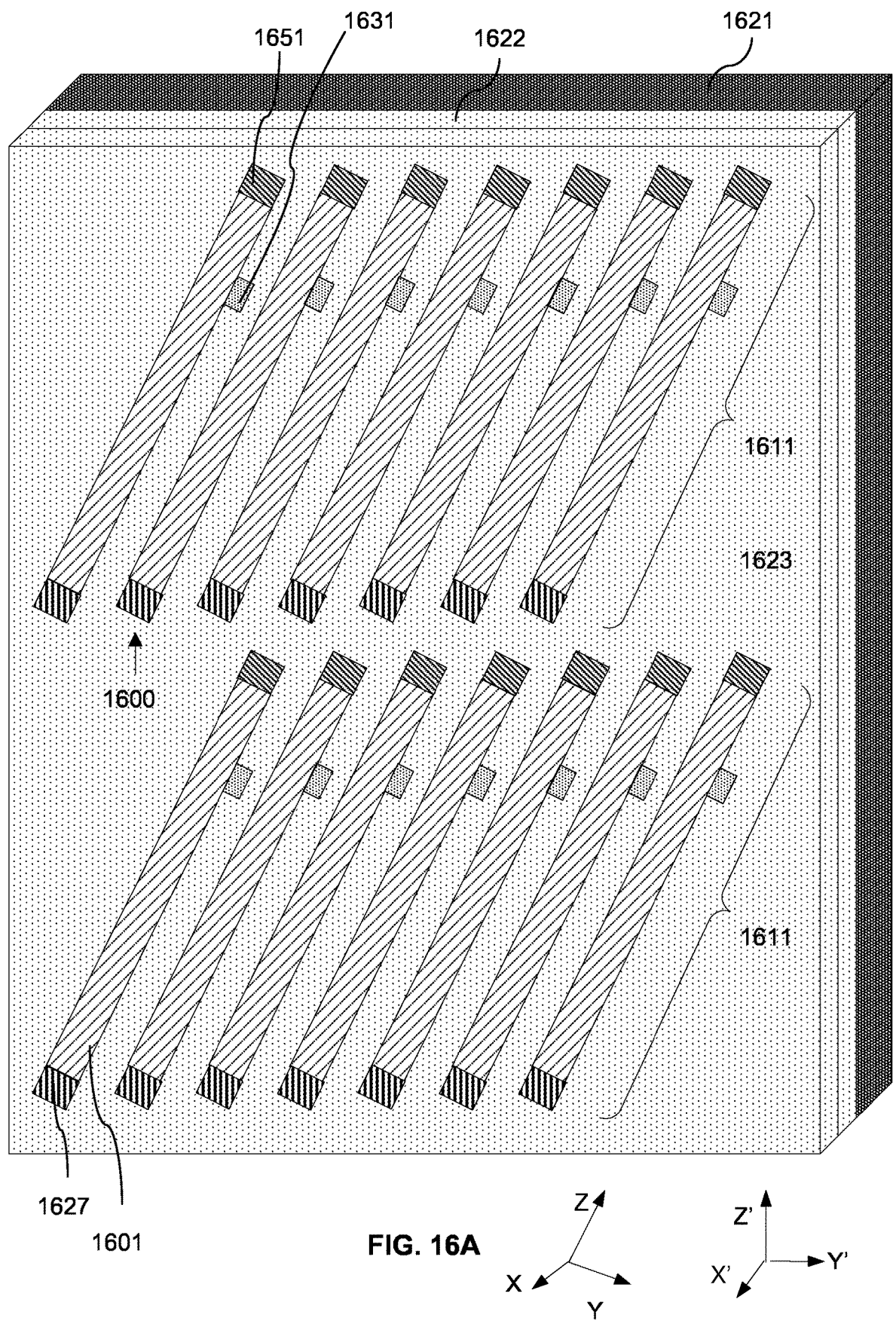
Figure 16C:
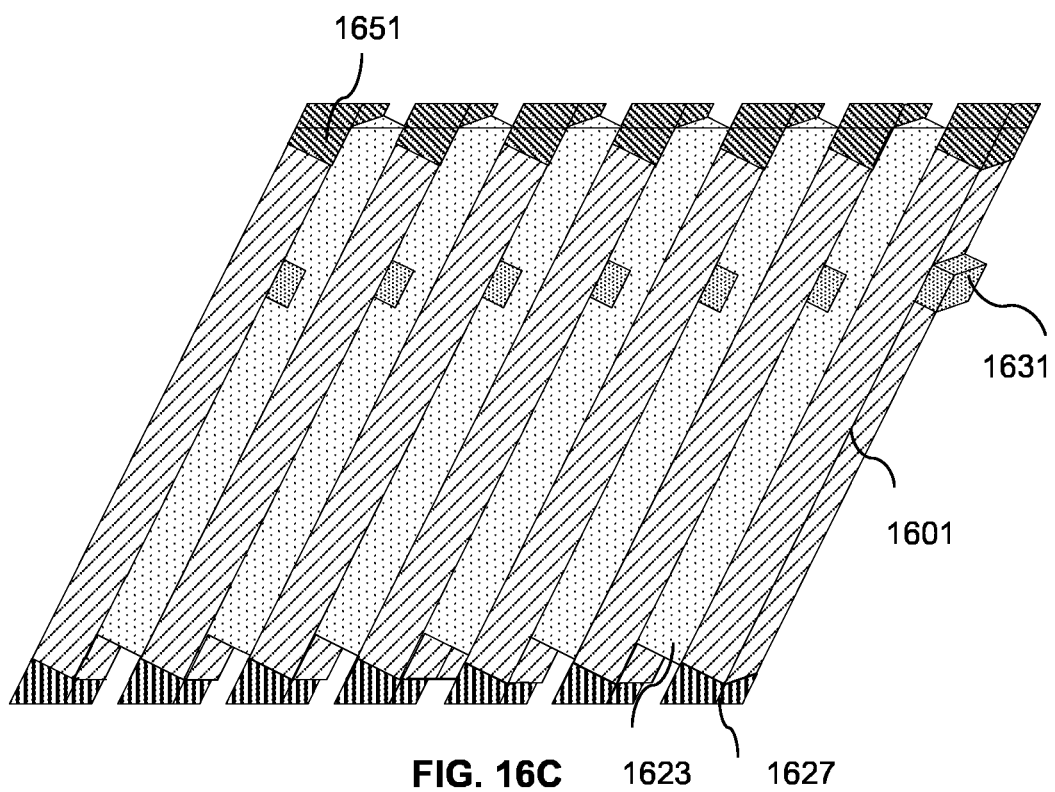
Figure 16D:
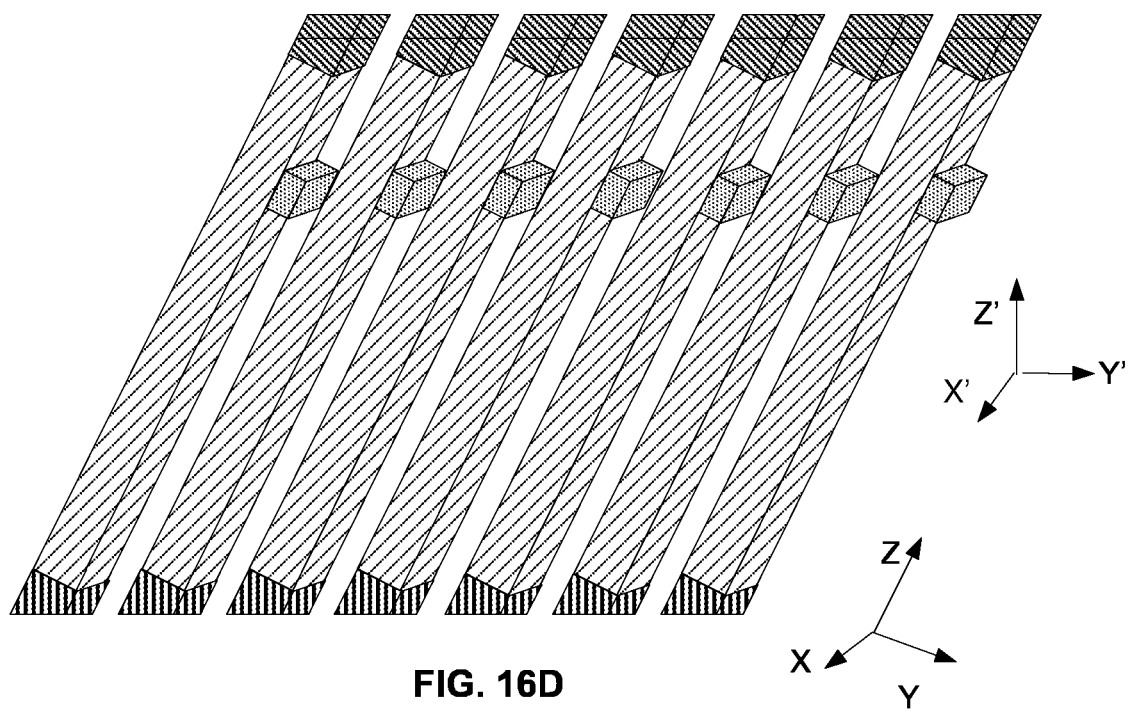

FIGS. 16A-16D provide isometric illustrations of various states in process for creating a probe array assembly wherein the probes 1600 are formed on their sides but with a tilted configuration so that linear arrays themselves are angled and can be combined with other angled linear arrays to build up two-dimensional angled probe arrays. FIG. 16A shows the state of the process after two linear arrays 1611 of probes are formed on a substrate 1621 with an intervening release layer 1622 (similar to that shown in FIG. 3A) where the probes are formed with longitudinal extends that are not perpendicular to the tip or base line for the array, where probes are formed with a tip material 1651 on their upper ends, that is different from a body material 1601, and where probes are formed with a bonding material 1627 at their lower ends and wherein a single spacer 1631 is formed along the side of each probe but does not extend to the adjacent probe, as sacrificial material 1623 will set the probe-to-probe spacing and the spacers themselves will not be used in the assembly process but will be used after array formation, for example, for probe-to-probe alignment during deflection or for inhibiting electrical contact between probes. FIG. 16A also set forth two different axis diagrams with the left diagram setting forth the longitudinal (Z-axis) and lateral (X and Y axes) of the individual probes while the right diagram (i.e., the X', Y', Z' axes) sets forth the axes associated with layer formation with layer stacking occurring along the X'-axis and with the planes of the layers defined by the Y'- and Z'-axes. The Z' axes also define the longitudinal axis of the linear probes arrays. FIG. 16B shows the state of the process after dicing is used to set the top and bottom planes of the linear probe arrays. FIG. 16C shows the state of the process after separation of a linear array from the substrate and from surrounding sacrificial material but while retaining sacrificial material located between most of the length of the probes. FIG. 16D shows the linear array after removal of the intervening sacrificial material which would generally not occur until after the linear arrays are assembled in a two-dimensional array configuration, and substrate mounting and/or guide plate engagement occurs. FIG. 16D also shows the axis diagrams of FIG. 16A indicating that the layer formation diagram provides axes for the probe array itself with the longitudinal axis of the probe array extending along Z' and the lateral directions corresponding to X' and Y'. Linear arrays like those of FIGS. 16A-16D may be assembled in much the same way the previously discussed arrays are assembled, for example using additional spacers attached to the front or back of the linear arrays for spacing purposes or use of non-probe spacers or alignment structures as discussed above.

Figures 17A, 17B, 17C, 17D:
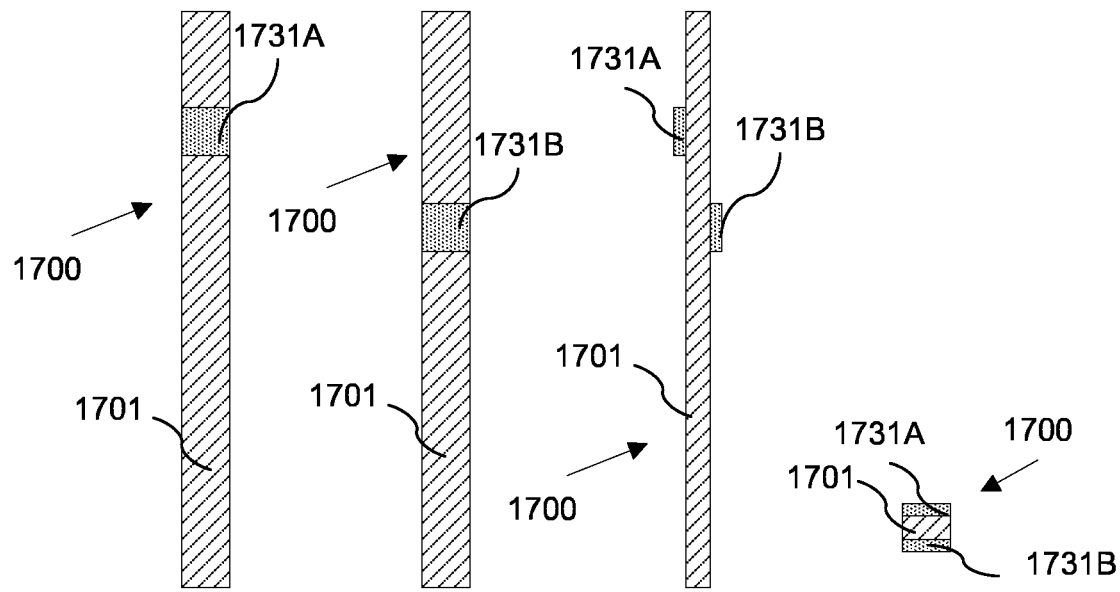
FIGS. 17A-17D provide four views of a probe configuration according to a second embodiment where the probe is a straight pin having two spacers located with one on each of two sides of the probe wherein, in this example, the sides are the top and bottom of the probe in the layer stacking direction of probe formation.

FIGS. 17A-17D provide four views of a probe 1700 configuration according to a second embodiment where the probe has a straight pin body portion 1701 and two spacers 1731A and 1731B located with one on each of two sides of the body portion 1701 of the probe wherein, in this example, the sides are the top and bottom of the probe in the layer stacking direction of probe formation. FIG. 17A provides a view looking down on the probe from above the layer planes. FIG. 17B provides a view of the probe looking up from the bottom. FIG. 17C provides a side view. FIG. 17D provides an end view of the probe. A linear array of probes of the type shown in FIGS. 17A-17D may be formed with probes side-by-side with a sacrificial material functioning to provide temporary side-by-side spacing with spacers extending from the front and the back of the linear array. During assembly of such two-dimensional arrays, the individual linear arrays may be aligned with their tips in a plane and their bodies extending substantially perpendicular to that plane. Alternatively, they may be aligned so that the bodies of the probe form a non-perpendicular angle to the plane of the tips wherein the front spacers on one array may engage the faces of the spacers on the back of the adjacent array or where both sets of spacers may engage the body of the probes and even set the angle of engagement based on the bottom of the higher spacer engaging or abutting the top of the lower spacer whereby the angle of engagement could be changed by changing the relative heights of the spacers while the separation of the probes could be set by the thickness of the spacers (in the layer stacking direction). In some alternative embodiments, the front spacer and/or the back spacer could be removed after array formation and position setting (e.g., by bonding to a substrate and/or engaged with one or more guide plates) and before usage to allow enhanced independent movement of the probes. In some variations, the frontside and backside spacers may have different thicknesses so that they both participate in lateral or longitudinal alignment while only one participates in face-to-face spacing. In such alternative embodiments, removal of the thicker of the two spacers may allow the thinner spacer to permanently remain to still provide a limitation against probe-body-to-probe-body contact without potentially inhibiting independent movement of the probes over an anticipated working range. In still other variations, such probes and linear arrays may have multiple spacers located on the front and back of the probe at different heights to provide more spacer contact points for more stable mating.

Figures 18, 19, 20:
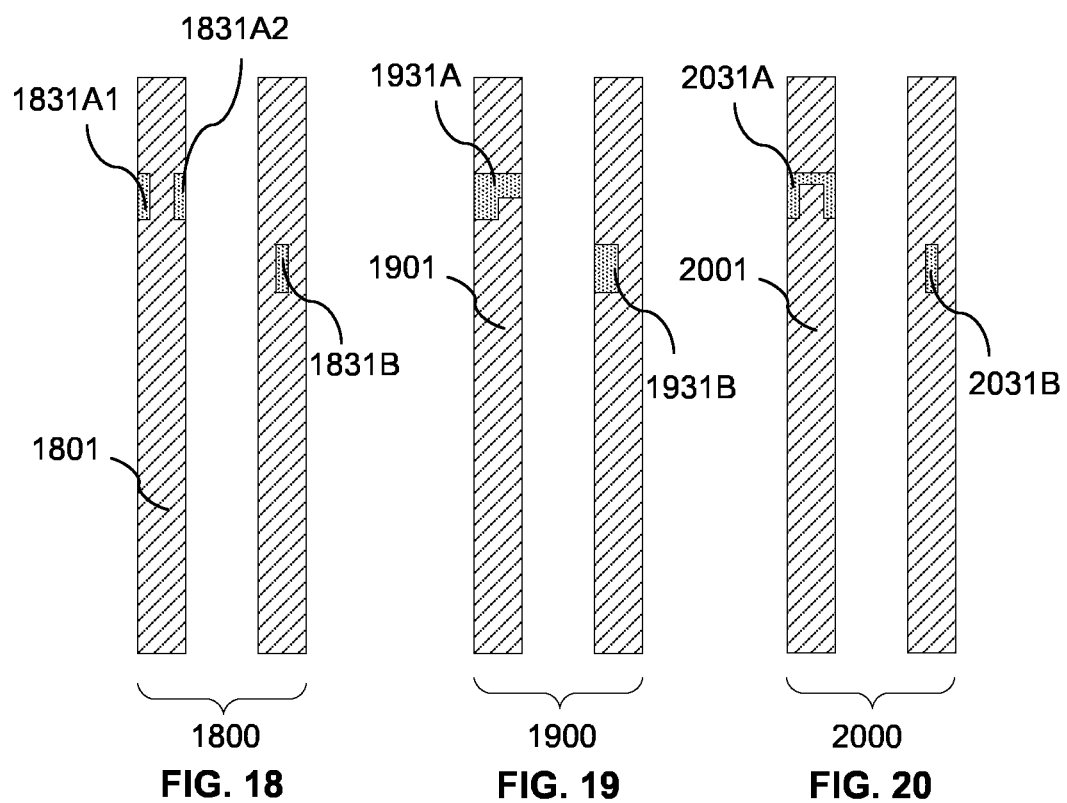
FIG. 18 provides two views of a probe configuration, one from the frontside or top (left side) and one from the backside or bottom (right side) according to a third embodiment where the probe is a straight pin having two spacers located on the frontside of the probe (in the layer stacking direction of probe formation) with an intermediate gap and one spacer located on the center line of the probe on the backside of the probe (in the layer stacking direction of probe formation) such that the backside spacer on one probe can slide between the left side and right elements of the frontside spacer of an adjacent probe to not only provide appropriate spacing but also to provide side-to-side alignment of stacked probes.
FIG. 19 provides two views of a probe configuration according to a fourth embodiment where the probe is a straight pin having a spacer located on the front and back of the probe (in a direction of layer stacking during probe formation or linear array formation) where the spacers have different shapes that can provide for one or more of (1) face-to-face spacing based on the thicker of the mated spacers, (2) engagement upon angled or tilted placement and spacing, and/or (3) some side-to-side alignment as tangential sliding of probe occurs or vertical alignment as longitudinal sliding of adjacent probes occur (e.g. during tilting or straightening) as a notch on the edge of one spacer engages an edge of a protruding complementary feature on an adjacent probe.
FIG. 20 provides two views of a probe configuration according to a fifth embodiment where the probe is a straight pin having a spacer located on each side of the probe where one of the spacers comprises a U-shaped structure while the other provides a bar-structure that can be slid into the opening in the U-shaped structure during array formation or to maintain side-to-side alignment during usage with the top or bottom of the U-slot providing a relative movement cap.

FIG. 18 provides two views of a probe 1800, one from the frontside or top (left side) and one from the backside or bottom (right side) according to a third embodiment where the probe has a straight pin body portion 1801 and two spacer portions 1831A1 and 1831A2 located on the frontside of the probe body portion (in the layer stacking direction of probe formation) with an intermediate gap and one spacer 1831B located on the center line of the probe body portion on the backside of the probe (in the layer stacking direction of probe formation) such that the backside spacer on one probe can slide between the left side and right elements of the frontside spacer of an adjacent probe to not only provide appropriate spacing but also to provide side-to-side alignment of stacked probes. In the example shown, it is assumed the probe will be engaged with other probes at an angle such that the frontside of the probe will have an angled downward facing orientation so that the backside spacer (with an upward facing orientation) on the neighboring probe will engage the frontside spacer with the proper longitudinal positioning when probes are rotated to an appropriate angle. In some variations, probes like those of FIG. 18 may be formed side-by-side in linear array configurations or even be stacked on one another in combined array configurations where sacrificial material might be used as a spacing material in one or both directions. In some variations, the spacers may exist at similar longitudinal positions on a probe so that engagement occurs when the probes are arrayed in side-by-side configurations with a plane of tips being substantially perpendicular to the longitudinal axes of the probes. Of course in other embodiments, probe bodies and spacers may take on other configurations, for example: (1) bodies may be formed from multiple materials, (2) a tip may be formed on one or both ends and have any desired configuration and/or be formed of a different material than the rest of the body, and (3) a base may be formed on one end and be formed with the same or different material as the body of the probe where the base or side walls of the body near the base may be formed with a bonding material, an improved material for bonding material adhesion, a barrier material, or other material that will provide a functional advantage. In some other variations of the probe of FIG. 18, the probe may be formed with its longitudinal axis laying within the plane or planes of the build layer or layers, but it may be rotated laterally by 90 degrees such that the spacers face left and right toward and potentially even touching other probes that are part of a linear array. In still other variations, the thickness of the front and back side spacers may be different such that only one of the spacers makes face-to-face contact with the other probe so as to ensure accurate spacing in a manner analogous to that discussed with regard to FIG. 14C. In some such variations, the thicker of the two spacers may be made of a removable material such that after assembly of the array, the removable spacers are removed while the other spacers remain so as to continue to provide for minimum spacing between probes upon excess deformation while providing a desired gap between the probes during normal operation so as not to inhibit independent movement of the probes.

FIG. 19 provides two views of a probe 1900 according to a fourth embodiment where the probe has a straight pin body portion 1901 having a spacer 1931A located on the front of the probe body and a spacer 1931B located on back of the probe body (in a direction of layer stacking during probe formation or linear array formation) where the spacers have different shapes that can provide for one or more of (1) face-to-face spacing based on the thicker of the mated spacers, (2) engagement upon angled or tilted placement and spacing, and/or (3) some side-to-side alignment as tangential sliding of probe occurs or vertical alignment as longitudinal sliding of adjacent probes occur (e.g. during tilting or straightening) as the notch on the edge of spacer 1931A engages an edge of a protruding complementary feature of spacer 1931B on an adjacent probe. The spacer may be used for initial spacing and/or alignment. In some variations, one or both the spacers may be removed prior to putting the array into use. In other embodiments, the spacers may be located in different regions than that shown in order to provide different angular engagements. In some embodiments, the different spacers may be formed of the same material (e.g. both sacrificial, both structural, both conductive, or both dielectric) or different materials (e.g. structural, sacrificial, dielectric, or conductive).

FIG. 20 provides two views of a probe 2000 according to a fifth embodiment where the probe has a straight pin body portion 2001 having a spacer 2031A and 2031B located on each side of the probe where one of the spacers (i.e., 2031A in this example) comprises a U-shaped structure while the other (i.e., 2031B in this example) provides a bar-structure that can be slid into the opening in the U-shaped structure during array formation or to maintain side-to-side alignment during usage with the top or bottom of the U-slot providing a relative movement cap. The engaged spacers may provide probe-to-probe spacing, side-to-side alignment perpendicular to a line joining the two probes, and/or even longitudinal alignment or tip position setting. In some embodiments, spacer locations may vary to allow partial or complete longitudinal engagement at different angular configurations. In some implementations, one or both spacers may be sacrificial and thus removable after array configuration and before array usage. In some implementations, the spacers may face front to back relative to the face of a linear array and thus provide an interface when assembling one linear array with another or they may face side-to-side and thus be embedded in sacrificial material that retains probes within their respective linear arrays. In such configurations, the end probes may have spacers extending therefrom that can engage (1) probe bodies of different arrays, (2) spacers attached to probes of different arrays, and/or (3) other alignment structures that might be located between different linear arrays during assembly. In some embodiments, the spacers may only provide guide structures to help guide probes during usage of probe arrays and not to provide direct probe-to-probe spacing which may in turn be provided by sacrificial material or other alignment structures that are to be engaged with probes, linear arrays, or combined subarrays during assembly operations.

Figures 21A, 21B, 21C, 21D:
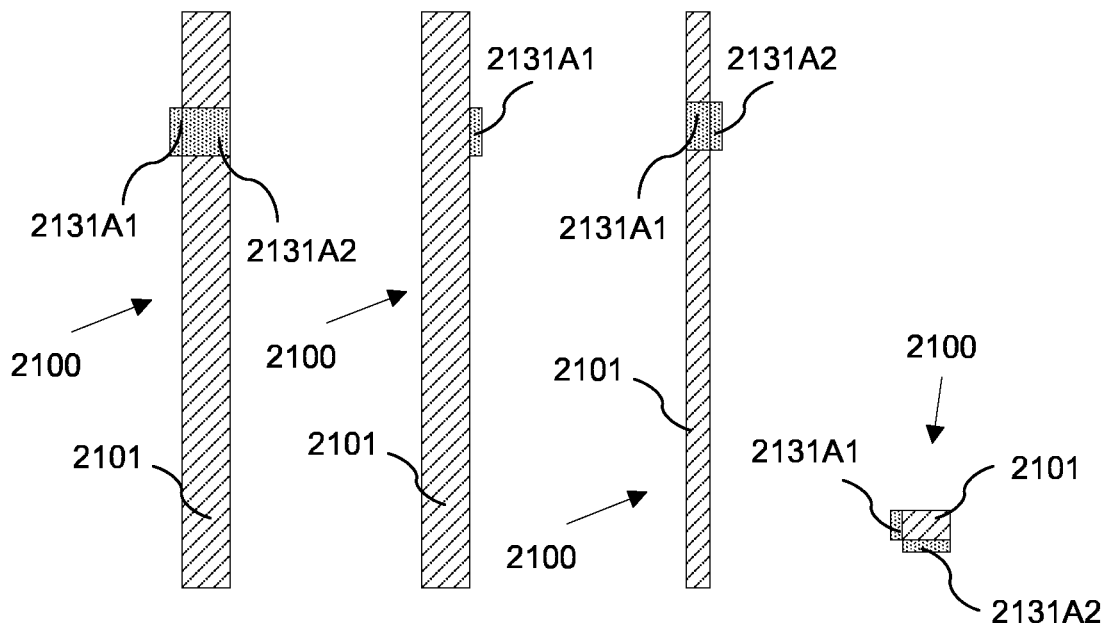
FIGS. 21A-21D provide four views of a probe configuration according to a sixth embodiment where the probe is a straight pin having a spacer located on a left side of the probe (when longitudinally aligned with and looking down on the probe) and on a front face of the probe (i.e. when looking down on the probe from above the layer planes) such that during array assembly relative probe positioning may be set from side-to-side as well as front-to-back by contact between probe bodies and the spacers on adjacent probes which may be used to set a probe-to-probe pitch in two directions (e.g. in two perpendicular directions).

FIGS. 21A-21D provide four views of a probe 2100 according to a sixth embodiment where the probe has a straight pin body portion 2101 having a spacer with a portion 2131A1 located on a left side of the probe (when longitudinally aligned with and looking down on the probe) and on a portion 2131A2 located on the front face of the probe (i.e. when looking down on the probe from above the layer planes) such that during array assembly relative probe positioning may be set from side-to-side as well as front-to-back by contact between probe bodies and the spacers on adjacent probes which may be used to set a probe-to-probe pitch in two directions (e.g. in two perpendicular directions). FIG. 21A provides a view looking down on the probe from above the layer planes. FIG. 21B provides a view of the probe after rotating the probe about its longitudinal axis 180° (relative to the view of FIG. 21A) so that the backside or bottom of the probe is visible. FIG. 21C provides a view of the probe after rotating the probe about its longitudinal axis 90° (relative to the view of FIG. 21A) so that the left side of the probe can be seen. FIG. 21D provides an end view of the probe looking along the longitudinal axis of the probe after rotating the probe 90° relative to the view of FIG. 21A about a lateral axis lying in the plane of the page. Numerous alternative embodiments are possible and include spacer patterns that extend completely around the lateral extends of the probes which could provide improved adhesion of the spacers to the probe body and spacers located at multiple longitudinal locations along the probe. In still other variations, as with the other embodiments set forth herein, features of this embodiment may be replaced with features from other embodiments or with features in variations of other embodiments, and/or some features from other embodiments and their variations may be added to supplement the features set forth specifically in the present embodiment.

Figures 22A, 22B, 22C, 22D:
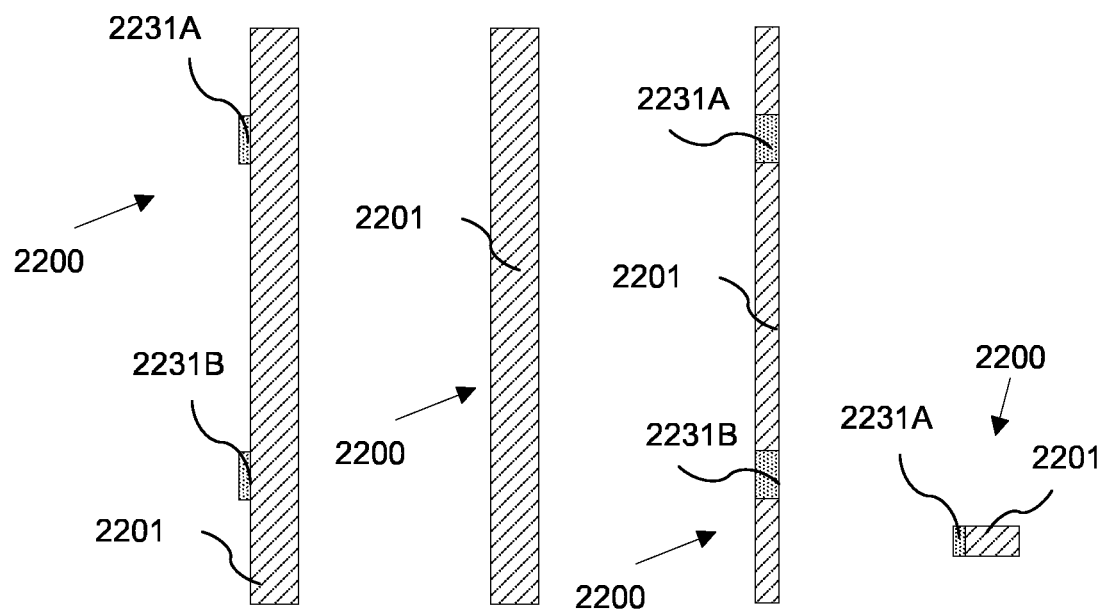
FIGS. 22A-22D provide four views of a probe configuration according to a seventh embodiment where the probe is a straight pin having two spacers located on a left side of the probe such that enhanced side-to-side alignment of the probes can occur when assembling or configuring an array of probes where such spacers may be used to not only precisely set spacing of adjacent probes via a spacer near the top of the probe but also via a spacer located near the bottom of the probe which may aid in improving overall probe spacing within an array or within a portion of an array.

FIGS. 22A-22D provide four views of a probe 2200 according to a seventh embodiment where the probe has a straight pin body portion 2201 and two spacers 2231A and 2231B located on a left side of the probe such that enhanced side-to-side alignment of the probes can occur when assembling or configuring an array of probes where such spacers may be used to not only precisely set spacing of adjacent probes via a spacer 2231A near the top of the probe but also via a spacer 2231B located near the bottom of the probe which may aid in improving overall probe spacing within an array or within a portion of an array. FIG. 22A provides a view looking down on the probe 2200 from above the layer planes. FIG. 22B provides a view of the probe looking up from the bottom. FIG. 22C provides a view from the left side of the probe. FIG. 22D provides an end view of the probe 2200. In some embodiment variations, the spacers may be placed on the front or back of the probes as opposed to being on a side of the probes. With spacers located on the sides, a need for retention of sacrificial material during probe array assembly from linear arrays may be lessened. In other embodiments where sacrificial material will be generally used to set side-to-side spacing of probes in a linear array, the spacers may be limited to locations on the ends of the linear array as contact spacers to be used when placing linear arrays beside one another. In some, or all, of the above noted embodiments, the spacers may be used only during assembly and then removed, used during both assembly and operation and thus be retained, or not used during assembly as spacers but instead used only during usage operations to provide some limited guidance of probe movement or to inhibit unintended electric contact between probes. In some variations, when spacers are formed on the sides of multi-layer probes, it may be desirable to limit the spacer, or at least the contact portion of the spacer, to a width corresponding to the thickness of a single layer and to ensure that the surface that the spacer contacts is also limited to a single layer to ensure that layer-to-layer alignment does not cause unintended contact with protruding portions of one or more adjacent layers which could cause local misalignment of probes but also a growing misalignment as the number of stackings increase. One method of ensuring proper alignment is by ensuring that spacers and contact surfaces for spacers are proud of the edges of adjacent layers as discussed above with respect to FIG. 14C. In still other variations, as with the other embodiments set forth herein, features of this embodiment may be replaced with features from other embodiments or with features in variations of other embodiments, and/or some features from other embodiments and their variations may be added in to supplement the features set forth specifically in the present embodiment.

FIGS. 23-33 each provide pairs of views of example probe configurations that may be used with the various spacer configurations (not shown) of the present embodiments to aid in the formation, or assembly, of arrays and/or to improve the operation of arrays after formation, or assembly, wherein the left image in each figure provides a view of the probe looking down on the probe from above the layer planes while the right image provides a view of the same probe looking toward the edges of the layers to show the longitudinal extent of the probe.

FIG. 23 provides views of a probe 2300 having a protruding or proud contact tip 2351, a base end 2353, and a connecting elastic body portion 2301 wherein the probe is formed from multiple layers (three layers as illustrated, each having the same layer thickness) to which front, back, left side, and/or right-side spacers may be connected or contacted and/or which may be usable with other alignment structures as taught herein. Such spacers or other alignment structures may be formed along with the probes, in similar but separate processes, or using different processes so as to provide desired inter-probe spacing, vertical alignment, probe-to-probe alignment along a first lateral direction that is perpendicular to a second lateral direction that extends between a pair of neighboring probes, and/or guided movement of probes during array usage, as electrical contact elements between selected probes, and/or as electrical contact inhibitors, and the like.

FIG. 24 provides an alternative probe structure to that shown in FIG. 23 to which the spacers may be connected or contacted, where the probe 2400 includes contact tips 2451 at opposite ends of the probe body portion 2401 wherein the contacts have protruding structures.

FIG. 25 provides an alternative structure to those shown in FIGS. 23 and 24, to which spacers may be connected or contacted, wherein the tip 2551 has a rounded configuration within the plane or planes of layer formation as opposed to a rectangular configuration and wherein the tip region is formed from a different material than the body portion 2501 of the probe 2500.

FIG. 26 provides an alternative structure to those shown in FIGS. 23-25, to which spacers may be connected or contacted, wherein the tip 2651 has a triangular, or pointed, configuration within the plane or planes of layer formation, wherein the tip is formed from a different material than that on the two outer layers of the body portion 2601 and where at least one different material is used in forming part of the central layer body portion 2601.

FIG. 27 also provides an alternative structure to those shown in FIGS. 23-26 wherein the body portion 2701 of the probe 2700 is formed of more layers than that used for in forming the probes of the previous examples (e.g., 5 layers as shown).

FIG. 28 also provides an alternative structure to those shown in FIGS. 23-27 wherein the body portion 2801 of the probe 2800 is formed from two different materials which alternate from layer-to-layer.

FIG. 29 also provides an alternative structure to those shown in FIGS. 23-28 wherein the body portion 2901 of the probe 2900 is formed from three different materials which provide for a symmetrical configuration and for which the central material may provide for an enhanced probe property such as improved conductivity (e.g., Cu as opposed to NiCo or Pd), also providing for a reduction in spring force as compared to what might be provided by different but less conductive material (e.g. NiCo or Pd vs. Cu).

FIG. 30 also provides an alternative structure to those shown in FIGS. 23-29 wherein the body portion 3001 of the probe 3000 is formed from still additional layers (seven as shown) and wherein the probe illustrates an example where the probe body need not be featureless but may have indents 3061 (as shown in the upper portion of the body) and protrusions 3063 (as shown in the lower portion of the body) where such features may, for example, provide features for enhanced mounting to, or positioning with respect to, bases or guide plates, aid in retention of spacers (not shown), aid in shifting stress or deflection locations, and/or provide for enhanced electrical contact or dielectric shielding.

Figure 31:
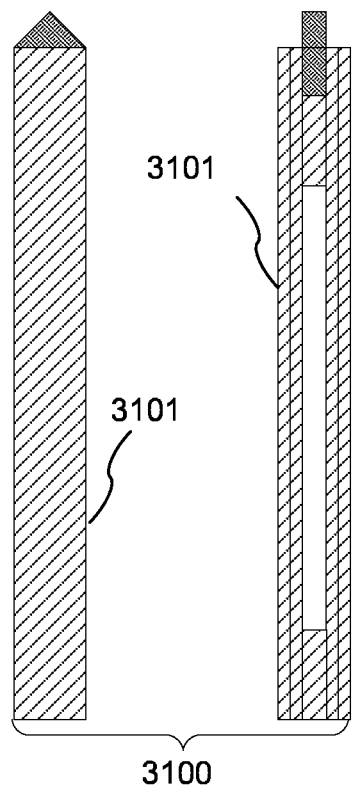

FIG. 31 also provides an alternative structure to those shown in FIGS. 23-30 wherein the body portion 3101 of the probe 3100 is formed with multiple beams (two parallel beams as shown) that are joined near their ends.

Figure 32:
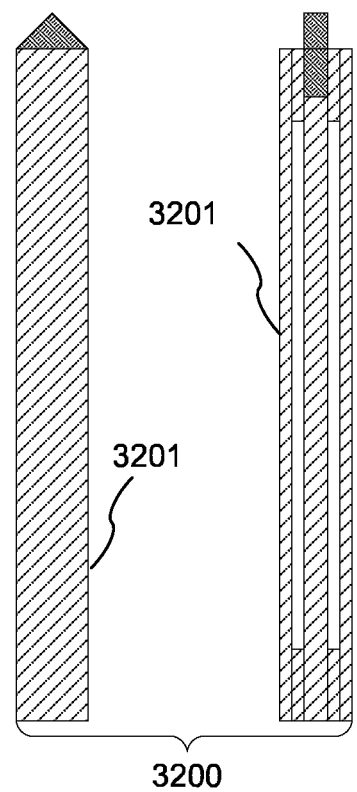

FIG. 32 also provides an alternative structure to those shown in FIGS. 23-31 wherein the body portion 3201 or the probe 3200 is formed with multiple beams (three parallel beams as shown).

Figure 33:
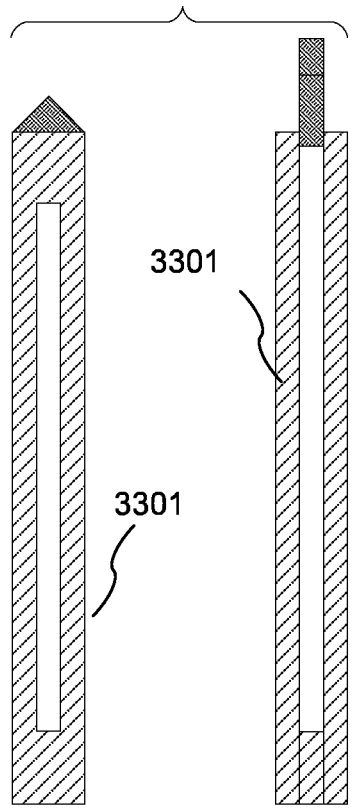

FIG. 33 also provides an alternative structure to those shown in FIGS. 23-32 wherein the body portion 3301 of the probe 3300 is formed with multiple beams (four parallel beams as shown where each of the top and bottom layers form two beams while an intermediate layer separates the pairs of beams from one another).

Figure 34A:
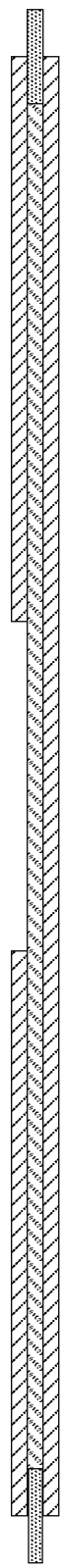
FIGS. 34A-34D provide four additional illustrations of four additional probe examples showing the longitudinal extents of the probes as seen looking at the edges of the layers from which the probes are formed wherein the probes are provided with non-linear configurations in the layer stacking direction due to variations in the cross-sectional configurations forming some layers.
Figure 34B:
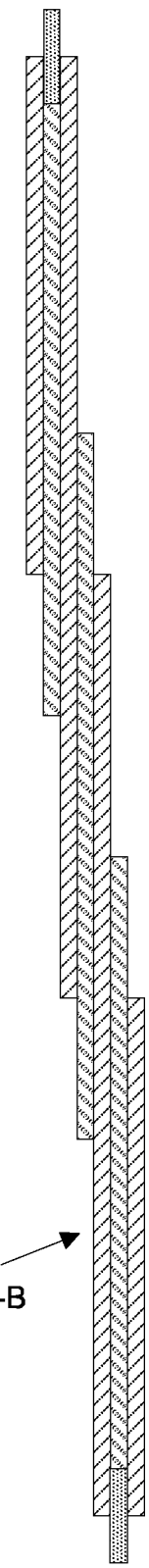
Figure 34C:
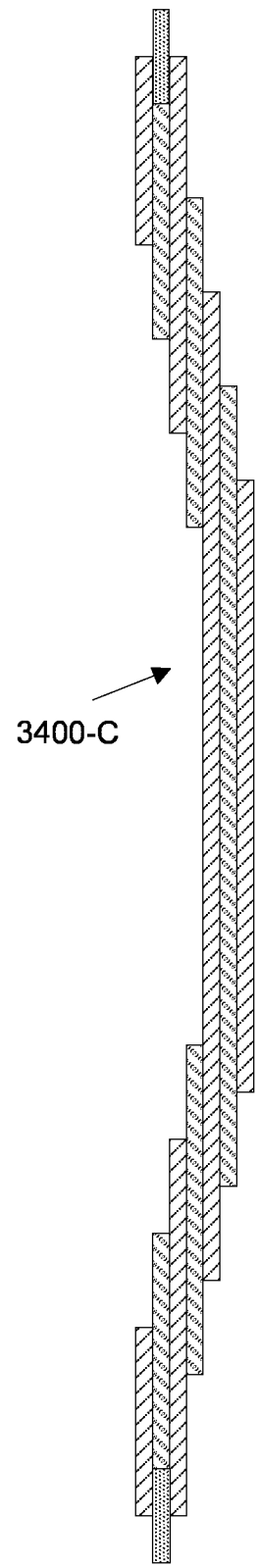
Figure 34D:

FIGS. 34A-34D provide four additional illustrations of four additional probe examples showing the longitudinal extents of the probes as seen looking at the edges of the layers from which the probes are formed wherein the probes are provided with non-linear configurations in the layer stacking direction due to variations in the cross-sectional configurations forming some layers. In the examples shown, the tips or contact extensions of the probes 3400-A, 3400-B, 3400-C, and 3400-D are formed with a different material (e.g., rhodium) relative to the bodies of the probes which may be formed from different materials (e.g., palladium, nickel, nickel cobalt, nickel phosphor, copper, gold, and/or silver). As shown in the figures, the body material, in each example, alternates from layer to layer where for example one of the materials may be provided primarily for its elastic properties while the other is provided primarily for its enhanced electrical properties (e.g., higher conductivity) though in other embodiments a single material may be used for the bodies and even for the bodies and the tips. In still other embodiments, different configurations of body material may be used, e.g., sealed structures may be used that provide one or more cores of a different material even a functional structural material. In some embodiments, contact extensions may be formed with more than one material. FIG. 34A illustrates an example probe with a notch in the compliant central region on the left side of the probe which may provide for a preferential bending axis and direction with the compliant portion bulging to the right. FIG. 34B illustrates an example probe with the lower end offset to the right relative to the upper end. FIG. 34C illustrates an example probe with a more distinct C-shaped compliant region with a shifting of the central portion of the probe to the right relative to the probe ends. FIG. 34D provides for an S-shaped probe. In some embodiments the probes may be coaxial in nature or coated with dielectrics in addition to have spacers of desired configuration and positioning.

Figure 35A:
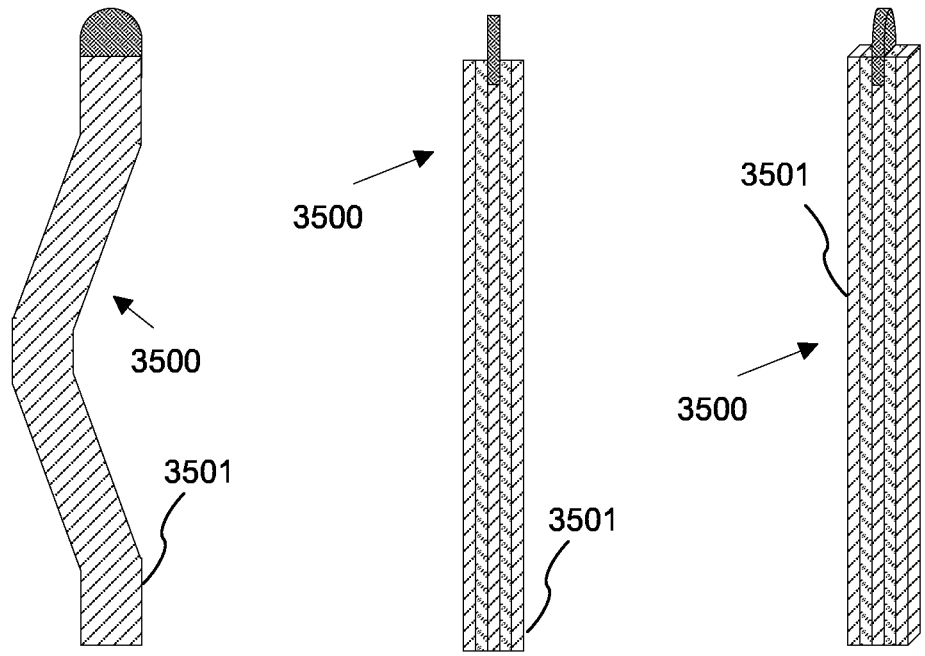
FIG. 35A provides a top (left most image), an edge (center image), and an isometric view of a probe as formed having an alternative configuration, wherein the probe is formed with different materials on alternating layers and wherein the body of the probe is formed with a non-linear shape within the planes of the layers such that it has a curved middle portion which may directly set a preferential elastic deflection direction for the probe when the base and tip are placed in compression.

FIG. 35A provides a top (left most image), an edge (center image), and an isometric view (right most image) of a probe as formed having an alternative configuration, wherein the probe is formed with different materials on alternating layers and wherein the body portion 3501 of the probe 3500 is formed with a non-linear shape within the planes of the layers such that it has a curved middle portion which may directly set a preferential elastic deflection direction for the probe when the base and tip are placed in compression. In some variations, the probe may have a different tip configuration, the tip may be offset to a different layer, or the tip may be formed from more than one layer. In still other variations, the entire probe may be formed from a single material or from more than the three materials shown.

Figures 35B, 35C, 35D:
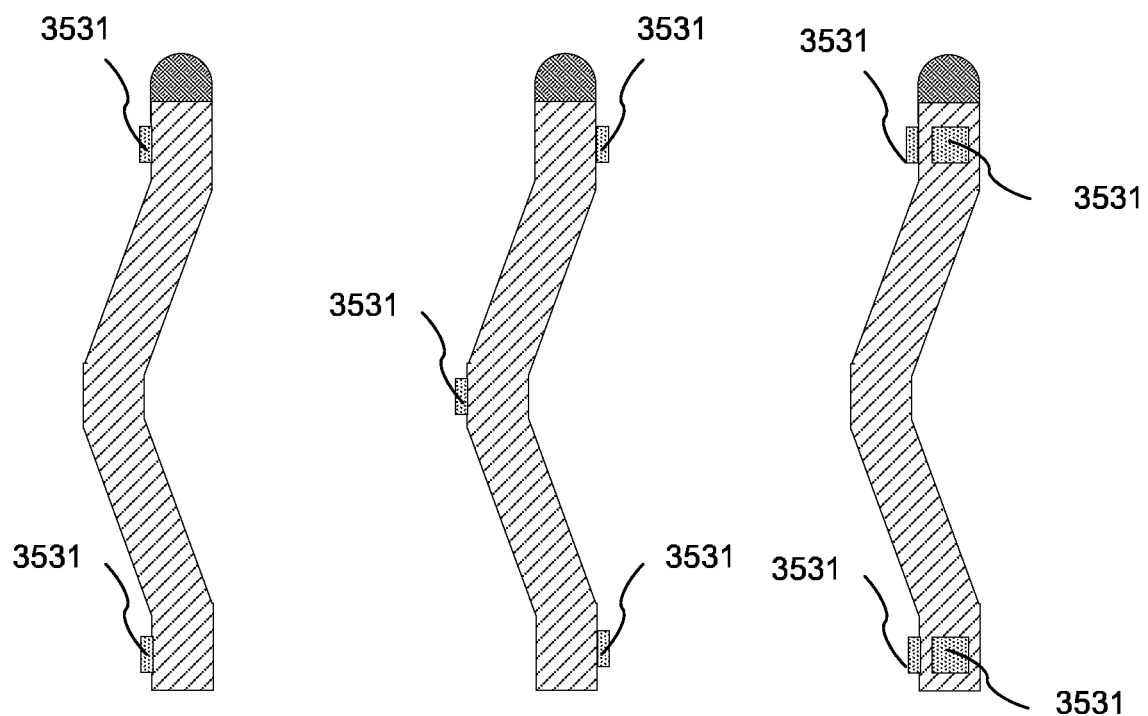
FIGS. 35B-35D provide several top views of the probe of FIG. 35A with the addition of spacers located in different example locations.

FIGS. 35B-35D provide several top views of the probe of FIG. 35A with the addition of spacers 3531 located in different example locations. FIG. 35B illustrates top and bottom spacers on a left side of the probe. FIG. 35C illustrates top and bottom spacers on the right side of the probe along with a middle region spacer on the left side of the probe. FIG. 35D illustrates top and bottom spacers on a left side of the probe along with top and bottom spacers on the front of the probe.

Figure 36A:
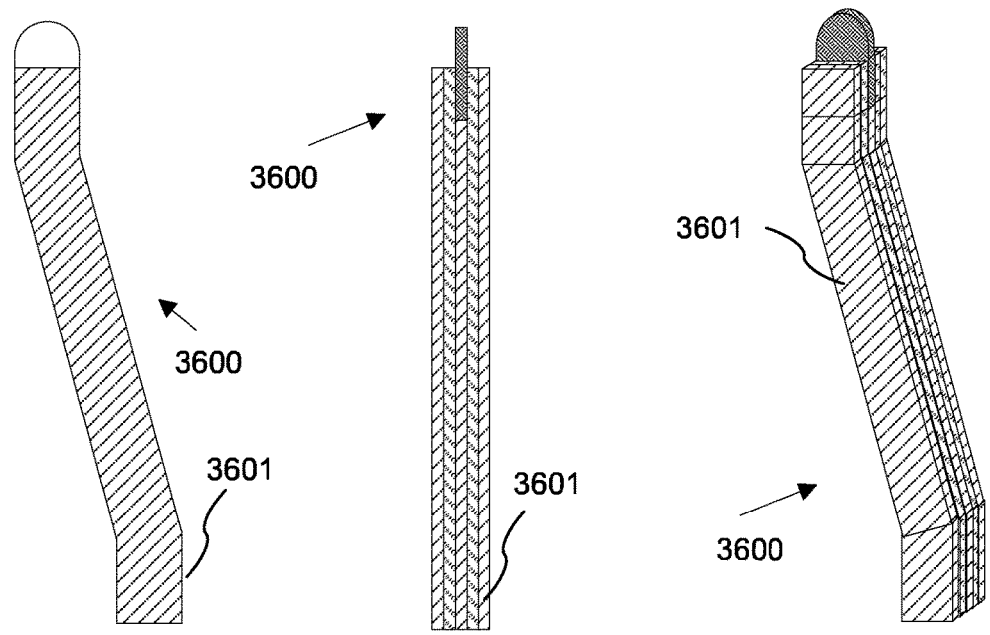
FIG. 36A provides a top (left most image), an edge (center image), and an isometric view of a probe as formed having an alternative configuration having two bends that provide for substantially vertical probe ends in combination with a sloping central region that locates the upper probe tip to the left of the base as well as providing alternating materials from layer-to-layer.

FIG. 36A provides a top (left most image), an edge (center image), and an isometric view (right most image) of a probe 3600 as formed having an alternative configuration having a body portion 3601 with two bends that provide for substantially vertical probe ends in combination with a sloping central region that locates the upper probe tip to the left of the base as well as providing alternating materials from layer-to-layer. Numerous other variations are possible and include those noted above in association with FIG. 35A.

Figures 36B, 36C, 36D, 36E:
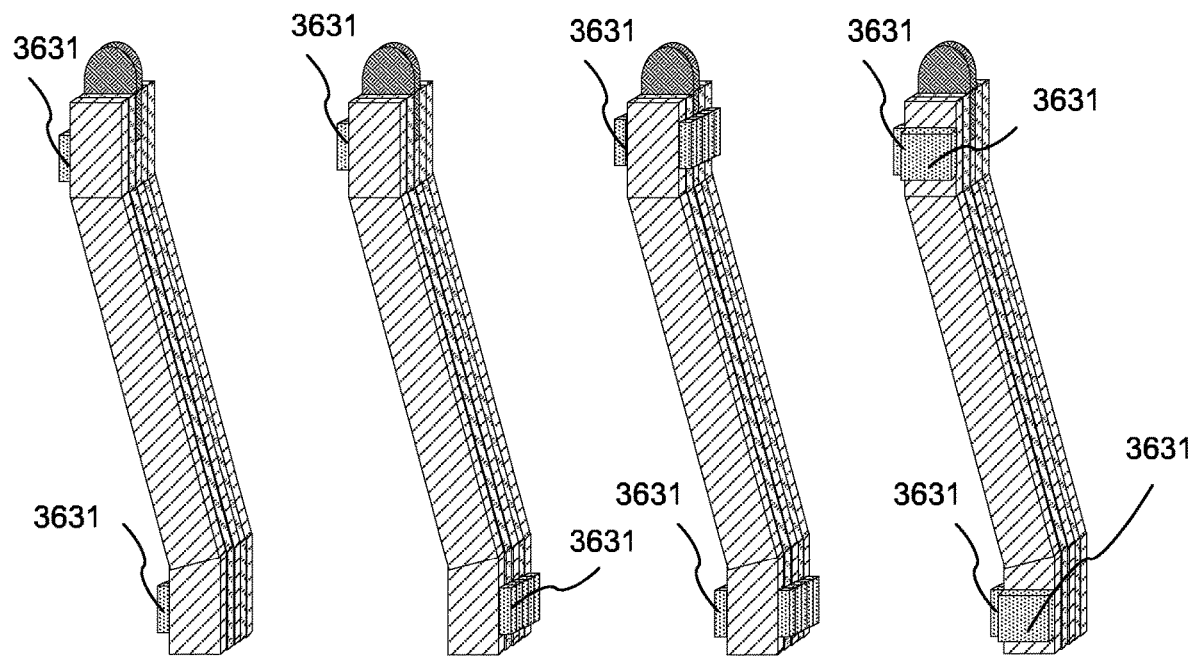
FIGS. 36B-36E provide four isometric views of probes like that of FIG. 36A with different example spacer configurations.

FIGS. 36B-36E provide four isometric views of probes like that of FIG. 36A with different example spacers 3631. FIG. 36B shows a probe with top and bottom spacers on its left side. FIG. 36C shows a probe with a top left spacer and a bottom right spacer. FIG. 36D shows a probe with four spacers including a left top, a left bottom, a right top, and a right bottom spacer while FIG. 36E shows a probe having a left top, a left bottom, a front top, and a front bottom spacer.

Other probe shape variations in the layer stacking direction, compared to those of FIGS. 34A-34D, are possible and will be apparent to those of skill in the art upon review of the teachings herein. Other probe shape variations within layers themselves, compared to those of FIGS. 23-33, 35A, and 36A, are possible and will be apparent to those of skill in the art upon review of the teachings. In still other embodiments, the spacers of many embodiments of the invention may be added to the probes of FIGS. 23-35A and 36A. Some such spacers may take forms and be provided at locations similar to those set forth in association with the various embodiments and generalized descriptions provided herein. In still other embodiments, a combination of shape variations in the layer stacking direction as exemplified in FIGS. 34A-34D may exist along with curved or stair-stepped variations within individual layers as exemplified in FIGS. 23-33, 35A, and 36E, or any of the numerous possible variations thereof. In still other variations, a single material (other than that used for the spacers or at least some portions of the spacers) may be used in forming various probes, two or more materials and different patterns of such materials may be used in forming different parts of probes depending on different probe properties that are of interest or can be tolerated (e.g. enhanced spring force, lower spring force, enhanced elastic range of motion, reduced elastic range, improved conductivity, lower conductivity, improved contact tip properties such as hardness and/or lowered contact resistivity, improved adhesion to a desired bonding material, improved wetting barrier properties, improved diffusion barrier properties, higher melting temperature, higher recrystallization temperature, improved shape memory properties, improved retention of selected properties during or after thermal cycling, improved wear resistance during sliding contact, and the like). The enhanced/weakened, improved/unimproved, higher/lower example properties set forth above are intended to be comparisons between one material and another that are used within a probe in different locations, or that result in the probe as a whole based on the inclusion of a given material at a given location in the probe as opposed to inclusion of a different material. In still other embodiments, some parts of the probes or spacers may be formed with dielectrics. In some embodiments, probes may have a contact tip on one end and be configured for bonding to a circuit element on the other end while other probes may be formed with two or more contact tips on each end. Some probes may include materials to aid in bonding while other probes may include materials in selected side-facing regions that allow for wear resistant sliding contact with one or more guide plates or the other array supporting structures.

Figure 37A:
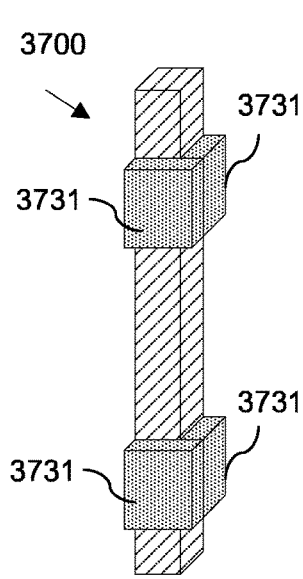
FIGS. 37A-37D provide a final example of an alternative array assembly process illustrating the assembly of an example 4×3 array of probes by assembling individual probes into 4×1 linear arrays, or by forming the probes in such arrays, and then assembling the linear arrays into the 4×3 array.
Figure 37C:
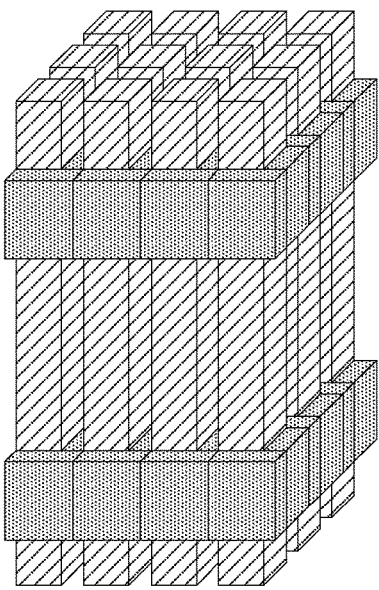
Figure 37D:
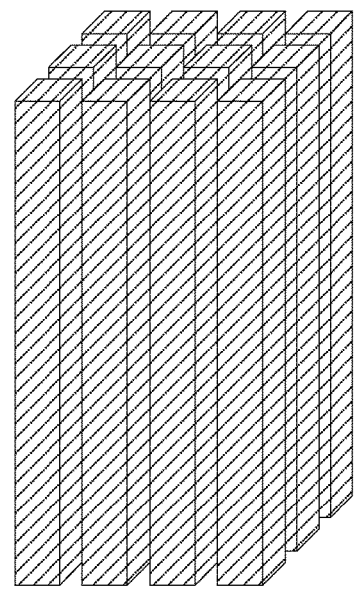
Figure 37B:
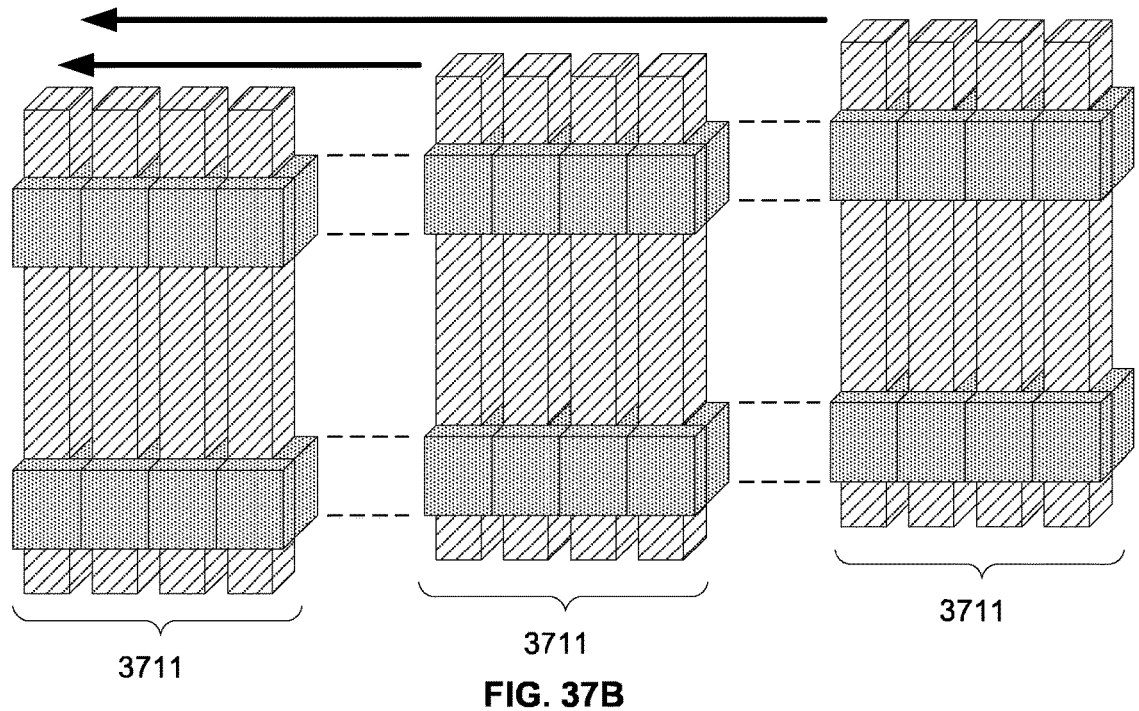

FIGS. 37A-37D provide a final example of an alternative array assembly process illustrating the assembly of an example 4×3 array 3712 of probes by assembling individual probes 3700 into 4×1 linear arrays 3711, or by forming the probes in such arrays, and then assembling the linear arrays into the 4×3 array 3712. In this process, subarrays (i.e., small groups of probes) or individual probes are formed with front and side and upper and lower spacers 3731 to provide two-dimensional spacing guides along one axis that provides for planar arrays and then along a perpendicular axis for stacking the planar arrays. FIG. 37A depicts an isometric view of a single probe 3700. FIG. 37B depicts an example of the subarrays 3711 being positioned relative to one another using the spacers. FIG. 37C provides a view of three example subarrays 3711 with probes 3700 spaced from one another by upper and lower spacers 3731 and with each linear array separated from the others. FIG. 37D depicts the array 3712 of probes 3700 after removal of the spacers (without showing supporting structure which holds the probes in position, e.g., a substrate to which the probes are bonded and/or one or more guide plates). Numerous alternatives are possible, and as an example, some such alternatives might provide individual spacers that provide both spacing in one direction as well as alignment in one or more perpendicular directions. As another alternative, spacers might exist on neighboring probes such that the spacers engage one another to provide for more than one direction of mating and alignment.

Figure 38:
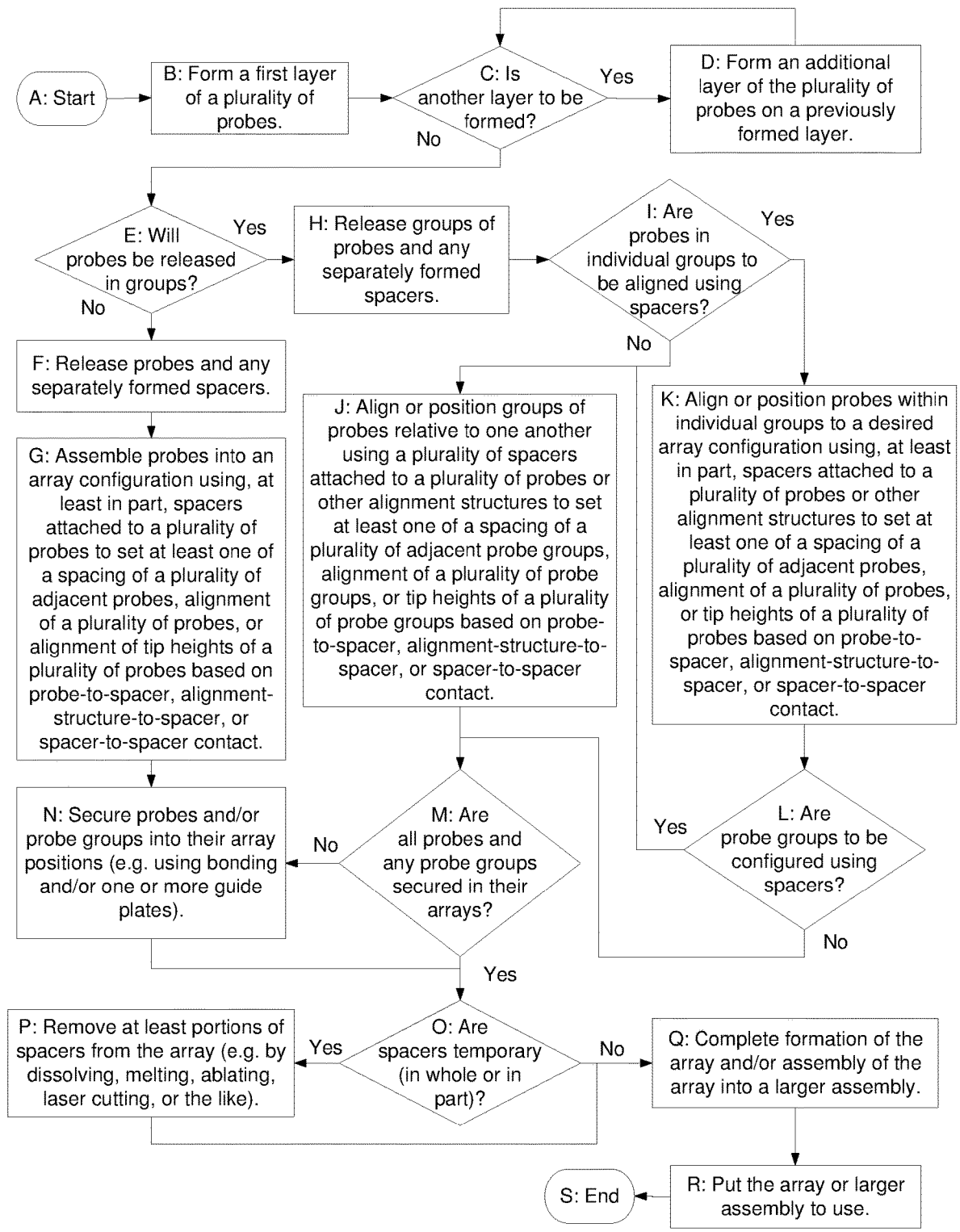
FIG. 38 provides a generalized flowchart outlining the formation of probes with connected spacers and formation of arrays using temporary or permanent spacers and/or using sacrificial material and/or incorporating spacers as guides, electrical contact elements, or electrical contact inhibitors while arrays are in use.

FIG. 38 provides a generalized flowchart outlining the formation of probes with connected spacers and formation of arrays using temporary or permanent spacers and/or using sacrificial material and/or incorporating spacers as guides, electrical contact elements, or electrical contact inhibitors while arrays are in use. Numerous variations of the embodiment set forth in this flowchart are possible and include, for example, (1) replacement of decision blocks with operations or steps based on preset parameters or premade decisions, (2) skipping of steps that are unnecessary based on the present parameters or premade decisions, and (3) adding in or removing optional operations or steps.

Figure 39:
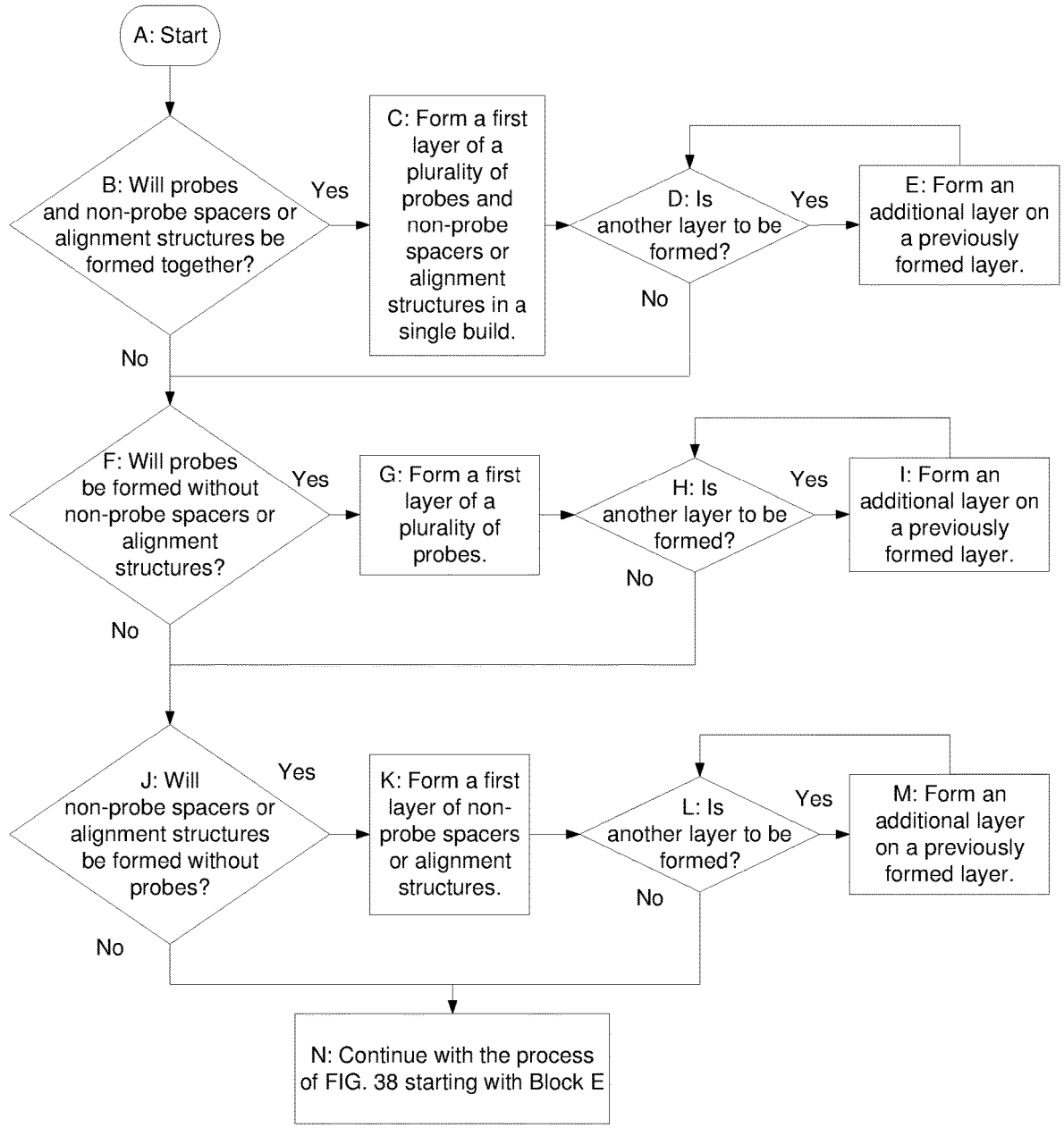
FIG. 39 provides a flowchart (extending across two sheets) similar to that of FIG. 38 but with the additional option of providing spacers or guide elements in the form of alternative alignment structures that are not connected to the probes as formed but are added and engaged during assembly, perhaps for the purpose of providing assemblies with enhanced probe positioning for tighter tolerance array formation.

FIG. 39 provide a flowchart that provides for the option of providing spacers or guide elements in the form of alternative alignment structures that are not connected to the probes as formed but are added and engaged during assembly, for example, for the purpose of providing assemblies with enhanced probe positioning for tighter tolerance array formation. From block J or L of FIG. 39 the flowchart moves to block N which calls on the block of the flowchart of FIG. 38 to complete formation of an array. Numerous variations of the embodiment set forth in this flowchart are possible and include, for example, (1) replacement of decision blocks with operations or steps based on preset parameters or premade decisions, (2) skipping of steps that are unnecessary based on the present parameters or premade decisions, and (3) adding in or removing optional operations or steps.

FURTHER COMMENTS AND CONCLUSIONS

Various other embodiments of the present invention exist. Some of these embodiments may be based on a combination of the teachings herein with various teachings incorporated herein by reference. For example, some fabrication embodiments may not use any blanket deposition process. Some embodiments may use selective deposition processes or blanket deposition processes on some layers that are not electrodeposition processes. Some embodiments may use nickel or nickel-cobalt as a structural material while other embodiments may use different materials. For example, preferred spring materials include nickel (Ni), copper (Cu), beryllium copper (BeCu), nickel phosphorous (Ni—P), tungsten (W), aluminum copper (Al—Cu), steel, P7 alloy, palladium, palladium-cobalt, silver, molybdenum, manganese, brass, chrome, chromium copper (Cr—Cu), and combinations of these while still other materials functional and useable. Some embodiments may use copper as the structural material with or without a sacrificial material. Some embodiments, for example, may use nickel, nickel-phosphorous, nickel-cobalt, palladium, palladium-cobalt, gold, copper, tin, silver, zinc, solder, rhodium, rhenium as structural materials while other embodiments may use different materials. Some embodiments, for example, may use copper, tin, zinc, solder, or other materials as sacrificial materials. Some embodiments may use different structural materials on different layers or on different portions of single layers. Some embodiments may remove a sacrificial material while other embodiments may not. Some embodiments may use photoresist, polyimide, glass, ceramics, other polymers, and the like as dielectric structural materials or as sacrificial materials.

Structural or sacrificial dielectric materials may be incorporated into embodiments of the present invention in a variety of different ways. Such materials may form a third material or higher deposited material on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003: (1) U.S. Patent Application No. 60/534,184 which is entitled "Electrochemical Fabrication Methods Incorporating Dielectric Materials and/or Using Dielectric Substrates"; (2) U.S. Patent Application No. 60/533,932, which is entitled "Electrochemical Fabrication Methods Using Dielectric Substrates"; (3) U.S. Patent Application No. 60/534,157, which is entitled "Electrochemical Fabrication Methods Incorporating Dielectric Materials"; (4) U.S. Patent Application No. 60/533,891, which is entitled "Methods for Electrochemically Fabricating Structures Incorporating Dielectric Sheets and/or Seed layers That Are Partially Removed Via Planarization"; and (5) U.S. Patent Application No. 60/533,895, which is entitled "Electrochemical Fabrication Method for Producing Multi-layer Three-Dimensional Structures on a Porous Dielectric". These patent filings are each hereby incorporated herein by reference as if set forth in full herein.

Additional patent filings that provide, intra alia, teachings concerning incorporation of dielectrics into electrochemical fabrication processes include (1) U.S. patent application Ser. No. 11/139,262, filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; (2) U.S. patent application Ser. No. 11/029,216, filed Jan. 3, 2005 by Cohen, et al., now abandoned, and which is entitled "Electrochemical Fabrication Methods Incorporating Dielectric Materials and/or Using Dielectric Substrates". (3) U.S. patent application Ser. No. 11/028,957, by Cohen, which was filed on Jan. 3, 2005, now abandoned, and which is entitled "Incorporating Dielectric Materials and/or Using Dielectric Substrates"; (4) U.S. patent application Ser. No. 10/841,300, by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (5) U.S. patent application Ser. No. 10/841,378, by Lembrikov et al., which was filed on May 7, 2004, now U.S. Pat. No. 7,527,721, and which is entitled "Electrochemical Fabrication Method for Producing Multi-layer Three-Dimensional Structures on a Porous Dielectric; (5) U.S. patent application Ser. No. 11/325,405, filed Jan. 3, 2006 by Dennis R. Smalley, now abandoned, and entitled "Method of Forming Electrically Isolated Structures Using Thin Dielectric Coatings"; (6) U.S. patent application Ser. No. 10/607,931, by Brown, et al., which was filed on Jun. 27, 2003, now U.S. Pat. No. 7,239,219, and which is entitled "Miniature RF and Microwave Components and Methods for Fabricating Such Components", (7) U.S. patent application Ser. No. 10/841,006, by Thompson, et al., which was filed on May 7, 2004, now abandoned, and which is entitled "Electrochemically Fabricated Structures Having Dielectric or Active Bases and Methods of and Apparatus for Producing Such Structures"; (8) U.S. patent application Ser. No. 10/434,295, by Cohen, which was filed on May 7, 2003, now abandoned, and which is entitled "Method of and Apparatus for Forming Three-Dimensional Structures Integral With Semiconductor Based Circuitry"; and (9) U.S. patent application Ser. No. 10/677,556, by Cohen, et al., filed Oct. 1, 2003, now abandoned, and which is entitled "Monolithic Structures Including Alignment and/or Retention Fixtures for Accepting Components".

These patent filings are each hereby incorporated herein by reference as if set forth in full herein.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full. This application is hereby incorporated herein by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, enhanced methods of using may be implemented, and the like.

| U.S. Pat App No., Filing Date U.S. App Pub No., Pub Date U.S. Pat. No., Pub Date | First Named Inventor, Title |
|---|---|
| 10/271,574 - Oct. 15, 2002 2003-0127336 - July 10, 2003 7,288,178 - Oct. 30, 2007 | Cohen, "Methods of and Apparatus for Making High Aspect Ratio Microelectromechanical Structures" |
| 10/387,958 - Mar. 13, 2003 2003-022168 - Dec. 4, 2003 — | Cohen, "Electrochemical Fabrication Method and Application for Producing Three-Dimensional Structures Having Improved Surface Finish" |
| 10/434,289 - May 7, 2003 20040065555 - Apr. 8, 2004 — | Zhang, "Conformable Contact Masking Methods and Apparatus Utilizing In Situ Cathodic Activation of a Substrate" |
| 10/434,294 - May 7, 2003 2004-0065550 - Apr. 8, 2004 — | Zhang, "Electrochemical Fabrication Methods With Enhanced Post Deposition Processing" |
| 10/434,315 - May 7, 2003 2003-0234179 - Dec. 25, 2003 7,229,542 - Jun. 12, 2007 | Bang, "Methods of and Apparatus for Molding Structures Using Sacrificial Metal Patterns" |
| 10/434,494 - May 7, 2003 2004-0000489 - Jan. 1, 2004 — | Zhang, "Methods and Apparatus for Monitoring Deposition Quality During Conformable Contact Mask Plating Operations" |
| 10/677,498 - Oct. 1, 2003 2004-0134788 - Jul. 15, 2004 7,235,166 - Jun. 26, 2007 | Cohen, "Multi-cell Masks and Methods and Apparatus for Using Such Masks To Form Three-Dimensional Structures" |
| 10/697,597 - Dec. 20, 2002 2004-0146650 - Jul. 29, 2004 | Lockard, "EFAB Methods and Apparatus Including Spray Metal or Powder Coating Processes" |
| 10/724,513 - Nov. 26, 2003 2004-0147124 - Jul. 29, 2004 7,368,044 - May 6, 2008 | Cohen, "Non-Conformable Masks and Methods and Apparatus for Forming Three-Dimensional Structures" |
| 10/724,515 - Nov. 26, 2003 2004-0182716 - Sep. 23, 2004 7,291,254 - Nov. 6, 2007 | Cohen, "Method for Electrochemically Forming Structures Including Non-Parallel Mating of Contact Masks and Substrates" |
| 10/830,262 - Apr. 21, 2004 2004-0251142 - Dec. 16, 2004 7,198,704 - Apr. 3, 2007 | Cohen, "Methods of Reducing Interlayer Discontinuities in Electrochemically Fabricated Three-Dimensional Structures" |
| 10/841,100 - May 7, 2004 2005-0032362 - Feb. 10, 2005 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/841,347 - May 7, 2004 2005-0072681 - Apr. 7, 2005 — | Cohen, "Multi-step Release Method for Electrochemically Fabricated Structures" |
| 10/949,744 - Sep. 24, 2004 2005-0126916 - Jun. 16, 2005 7,498,714 - Mar. 3, 2009 | Lockard, "Multi-Layer Three-Dimensional Structures Having Features Smaller Than a Minimum Feature Size Associated with the Formation of Individual Layers" |
| 12/345,624 - Dec. 29, 2008 — 8,070,931 - Dec. 6, 2011 | Cohen, "Electrochemical Fabrication Method Including Elastic Joining of Structures" |
| 14/194,564 - Feb. 28, 2014 2014-0238865 - Aug. 28, 2014 U.S. Pat. No. 9,540,233 - Jan. 10, 2017 | Kumar, "Methods of Forming Three-Dimensional Structures Having Reduced Stress and/or Curvature" |
| 14/720,719 - May 22, 2015 — 9,878,401 - Jan. 30, 2018 | Veeramani, "Methods of Forming Parts Using Laser Machining" |
| 14/872,033 - Sep. 30, 2015 — — | Le, "Multi-Layer, Multi-Material Microscale and Millimeter Scale Batch Part Fabrication Methods Including Disambiguation of Good Parts and Defective Parts" |

It will also be understood that the probe elements, spacers, and/or other alignment and/or guide structures may be formed with processes which are very different from the processes set forth herein and it is not intended that structural aspects of the invention need to be formed by only the processes taught herein or by processes made obvious by those taught herein.

Though various portions of this specification have been provided with headers, it is not intended that the headers be used to limit the application of teachings found in one portion of the specification from applying to other portions of the specification. For example, alternatives acknowledged in association with one embodiment, are intended to apply to all embodiments to the extent that the features of the different embodiments make such applications functional and do not otherwise contradict or remove all benefits of the adopted embodiment. Various other embodiments of the present invention exist. Some of these embodiments may be based on a combination of the teachings set forth herein with various teachings incorporated herein by reference.

It is intended that any aspects of the invention set forth herein represent independent invention descriptions which Applicant contemplates as full and complete invention descriptions that Applicant believes may be set forth as independent claims without need of importing additional limitations or elements from other embodiments or aspects set forth herein for interpretation or clarification other than when explicitly set forth in such independent claims once written. It is also understood that any variations of the aspects set forth herein represent individual and separate features that may form separate independent claims, be individually added to independent claims, or added as dependent claims to further define an invention being claimed by those respective independent or dependent claims should they be written.

In view of the teachings herein, many further embodiments, alternatives in design and uses of the embodiments of the instant invention will be apparent to those of skill in the art. As such, it is not intended that the invention be limited to the illustrative embodiments, alternatives, and uses described above but instead that it be solely limited by the claims presented hereafter.

We claim:

1. A probe array comprising:
   (a) a plurality of probes, comprising:
      (i) a first end selected from the group consisting of a contact tip and a base, comprising at least one first end material;
      (ii) a second end selected from the group consisting of a contact tip and a base comprising at least one second end material, wherein at least one of the first and second ends comprises a contact tip;
      (iii) an elongated body portion formed of at least one body material, longitudinally connecting the first end and the second end, and comprising at least one compliant portion allowing for elastic deformation upon the first end and the second end being compressed toward one another along a longitudinal direction;
   (b) a plurality of spacers;
   (c) at least one retention structure for engaging the probes and holding the probes in an array configuration,
   wherein for at least a plural portion of the plurality of probes at least one of the plurality of spacers is adhered to a body portion of a probe wherein the at least one spacer provides a function selected from the group consisting of: (1) setting a minimum contact distance between a portion of the probe to which the at least one spacer is adhered and a portion of a neighboring probe, (2) maintaining a minimum contact distance between a portion of the probe to which the at least one spacer is adhered and a portion of a neighboring probe, (3) setting a minimum contact distance between a portion of the probe to which the at least one spacer is adhered and at least one spacer attached to a neighboring probe, (4) maintaining a minimum contact distance between a portion of the probe to which the at least one spacer is adhered and at least one spacer attached to a neighboring probe, (5) setting or maintaining a relationship selected from the group consisting of at least one of a lateral alignment, a longitudinal alignment, a maximum lateral misalignment, and a maximum longitudinal misalignment between a portion of the probe to which the at least one spacer is adhered and a portion of a neighboring probe along a line that is perpendicular to a line extending therebetween, and (6) setting or maintaining a relationship selected from the group consisting of at least one of a lateral alignment, a longitudinal alignment, a maximum lateral misalignment, and a maximum longitudinal misalignment between a portion of the probe to which the at least one spacer is adhered and at least one spacer attached to the neighboring probe along a line that is perpendicular to a line extending therebetween, and
   wherein at least some of the spacers make constant contact between the probes to which they adhere and the neighboring probes when there is no relative longitudinal compression of the first probe end toward the second probe end.

2. The array of claim 1 wherein at least some spacers do not make contact between the probes to which they adhere and the neighboring probes or one or more spacers attached to such neighboring probes under normal operating conditions when there is relative longitudinal compression of the first probe end toward the second probe end.

3. The array of claim 1 wherein at least a portion of the plurality of spacers comprise dielectric material that inhibits electric shorting between the probes to which they are attached and one or more neighboring probes.

4. The array of claim 1 wherein at least a portion of the spacers provide a function selected from the group consisting of: (1) lateral alignment and (2) a limit on lateral misalignment when the probes are undergoing elastic deformation.

5. The array of claim 1 wherein at least a portion of the spacers provide a function selected from the group consisting of: (1) longitudinal alignment and (2) a limit on longitudinal misalignment when the probes are undergoing elastic deformation.

6. The array of claim 1 wherein at least a portion of the spacers provide a function selected from the group consisting of: (1) lateral alignment and (2) a limit on lateral misalignment when the probes are not under an end-to-end compressive force.

7. The array of claim 1 wherein at least a portion of the spacers provide a function selected from the group consisting of: (1) longitudinal alignment and (2) a limit on longitudinal misalignment when the probes are not under an end-to-end compressive force.

8. The array of claim 1 wherein at least a portion of the spacers comprise a conductive material that provide an electrically conductive path between selected probes.

9. The array of claim 1 wherein at least a portion of the spacers adhered to some probes do not directly engage other probes but engage the other probes by contact with spacers adhered to the other probes.

10. The array of claim 1 wherein at least some of the probes have non-linear configurations along planes that contain the longitudinal axes of the probes and an axis of layer stacking.

11. The array of claim 1 wherein at least some of the probes have non-linear configurations in planes that are perpendicular to a layer stacking direction (i.e. within the plane of the layer or layers of the probes).

12. The array of claim 1 wherein a contact between a spacer adhered to one probe makes contact with another probe via a surface feature that is selected from the group consisting of a planar feature and a feature of a single layer.

13. The array of claim 1 wherein a contact between a spacer adhered to one probe makes contact with a spacer of another probe via a surface feature that is selected from the group consisting of a planar feature and a feature of a single layer.

14. The array of claim 1 wherein a plurality of probe spacer to probe contact is made via a surface feature that is selected from the group consisting of: (1) a planar feature and (2) a feature of a single layer.

\* \* \* \* \*